US006778424B2

(12) United States Patent
Iwata et al.

(10) Patent No.: US 6,778,424 B2
(45) Date of Patent: Aug. 17, 2004

(54) SEMICONDUCTOR MEMORY DEVICE AND METHOD OF MANUFACTURING THE SAME

(75) Inventors: Yoshihisa Iwata, Yokohama (JP); Takashi Ohsawa, Yokohama (JP); Takashi Yamada, Ebina (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 34 days.

(21) Appl. No.: 09/986,777

(22) Filed: Nov. 9, 2001

(65) Prior Publication Data

US 2002/0114191 A1 Aug. 22, 2002

(30) Foreign Application Priority Data

Feb. 19, 2001 (JP) ........................................ 2001-041828
Jun. 25, 2001 (JP) ........................................ 2001-191781
Oct. 25, 2001 (JP) ........................................ 2001-328204

(51) Int. Cl.$^7$ ............................................. G11C 11/24
(52) U.S. Cl. ................... 365/149; 257/296; 365/185.23
(58) Field of Search ........................... 365/149, 185.23, 365/189.01; 257/296

(56) References Cited

U.S. PATENT DOCUMENTS

| 4,590,506 A | * | 5/1986 | Esser | ........................... 257/216 |
| 6,121,786 A | | 9/2000 | Yamagami et al. | |
| 6,538,916 B2 | * | 3/2003 | Ohsawa | ........................ 365/149 |
| 6,548,848 B2 | * | 4/2003 | Horiguchi et al. | .......... 257/296 |

FOREIGN PATENT DOCUMENTS

| JP | 03-171768 | 7/1991 |
| JP | 09-509284 | 6/1995 |
| JP | 08-064778 | 3/1996 |
| JP | 08-213624 | 8/1996 |
| JP | 08-316337 | 11/1996 |
| JP | 10-256556 | 9/1998 |
| WO | WO 95/15562 | 6/1995 |

OTHER PUBLICATIONS

Wann, et al. "A Capacitorless DRAM Cell on SOI Substrate" IEDM93, pp. 635–638.

Bruel, "Silicon on insulator material technology", Electronics Letters, Jul. 6, 1995, pp. 1201–1202, vol. 31, No. 14.

Tack, et al. "The Multistable Charge–Controlled Memory Effect in SOI MOS Transistors at Low Temperatures", IEEE Transactions on Electron Devices, May 1990, pp. 1373–1382, vol. 37, No. 5.

K. Suzuki et al., "Analytical Surface Potential Expression for Double–Gate SOI MOSFETs," International Workshop on VLSI Process and Device Modeling, May 14–15, 1993, pp. 150–151.

J. Yoo et al., "Pixel Design for TFT–LCD with Double Gate Poly–Si TFT and Double Layer Storage Capacitor," Fourth Asian Symposium on Information Display, Feb. 13–14, 1997, pp. 219–222.

H. Wong et al., Device Design Considerations for Double-–Gate, Ground–Plane, and Single–Gated Ultra–Thin SOI MOSFETs at the 25 nm Channel Length Generation, International Electron Device Meeting, Dec. 1998, pp. 15.2.1–15.2.4.

* cited by examiner

*Primary Examiner*—Richard Elms
*Assistant Examiner*—Nam Nguyen
(74) *Attorney, Agent, or Firm*—Banner & Witcoff, Ltd.

(57) ABSTRACT

A semiconductor memory device having MIS transistors to constitute memory cells (MC), each of the MIS transistors including a semiconductor layer (12), a source region (15) formed in the semiconductor layer, a drain region (14) formed apart from the source region in the semiconductor layer, the semiconductor layer between the source region and the drain region serving as a channel body in a floating state, a main gate (13) provided between the source region and the drain region to form a channel in the channel body; and an auxiliary gate (20) provided separately from the main gate to control a potential of the channel body by capacitive coupling, the auxiliary gate being driven in synchronization with the main gate. The MIS transistor has a first data state in which the channel body is set at a first potential and a second data state in which the channel body is set at a second potential.

26 Claims, 89 Drawing Sheets

SEMICONDUCTOR MEMORY DEVICE AND METHOD OF MANUFACTURING THE SAME

CROSS REFERENCE TO RELATED APPLICATION

This application claims the benefit of priority under 35 U.S.C. § 119 to Japanese Patent Application Nos. 2001-41828, 2001-191781 and 2001-328204 filed on Feb. 19, 2001, Jun. 25, 2001 and Oct. 25, 2001, respectively, the entire contents of which are incorporated by reference herein.

BACKGROUND OF THE INVENTION

1. Field of the Invention

The present invention relates to a semiconductor memory device which dynamically stores data with a channel body as a storage node.

2. Description of the Related Art

A memory cell of a DRAM generally used as a large capacity RAM is composed of one MOS transistor and one capacitor, and electric charge is stored in the capacitor with using the MOS transistor as a selection switch. Data is read out at the sight of a change in the potential of a bit line by redistributing the electric charge stored in the cell capacitor to the electric charge of the bit line. Accordingly, there is a lower limit to the storage charge amount of the cell capacitor relative to the initial charge amount of the bit line.

In the DRAM, the parasitic capacity of the bit line reduces with scale-down, but since write charge to the cell also reduces with a reduction in power consumption and scale-down, the capacitance of the cell capacitor does not reduce. The capacitance of the capacitor is proportional to its area and the permittivity of a dielectric (a capacitor insulating film) and inversely proportional to the thickness of the capacitor insulating film. When the thickness of the capacitor insulating film is reduced, a tunnel current flows; hence, insulation properties cannot be maintained. For this reason, there is a limit of about 2 nm to the reduction in the thickness of a film, and a lot of time and money are required to look for and develop a dielectric film which has a permittivity higher than the permittivity of a silicon oxide film such as offsets an area reduced in proportion to the square thereof, is stable in terms of structure, fits a silicon CMOS process, and which is very reliable in actual use.

Therefore, from the mid-1980's, a three-dimensional structure such as a stacked cell structure or a trench cell structure has been used for the capacitor of the DRAM. Even in these stacked cell structure and trench cell structure, recently the ratio of a plane size to a three-dimensional depth exceeds 10, resulting in a cigarette shape. Consequently, an etching limit to a silicon substrate in the case of a trench cell, and boring of a contact hole to bring a lower portion of a capacitor structure into contact with an upper portion thereof, filling of a conductor in this contact hole, and uniform covering properties of a dielectric in the case of a stacked cell come into question, and hence it has been said that those structures are unfit for further scale-down to a size under 100 nm.

An attempt to reduce the capacitor in size by using a gain of the MOS has been made from long ago, and this type of cell is called a gain cell. A drain current changes by the potential of a gate or a back gate of a read MOS transistor, and therefore the gain cell is classified broadly into two types, that is, one which uses a gate electrode as a storage node and the other which uses a channel body as a storage node. Examples of the one which uses the gate electrode of the read MOS transistor as the storage node are one composed of three transistors and one capacitor used in a 1 kbit DRAM by Intel Corporation in days of old and another composed of two transistors and one capacitor. As for capacitors, some are formed positively, and the others use a parasitic capacitor. In any case, in these gain cells, the number of devices is two or more, and gates (word lines) and drains (bit lines) are not common but separate for a write operation and a read operation, whereby the number of connections is large, and consequently, these gain cells are unfit for scale-down.

A gain cell of a type configured to use an SOI substrate, store charge with a channel body of a read MOS (sense MOS) as a storage node, and use a back gate bias effect is proposed. For example, the following documents are given.

(1) H. Wann and C. Hu, "A Capacitorless DRAM Cell on SOI Substrate." IEDM Digest of Technical Papers, pp. 635–638, DEC., 1933

(2) M. R. Tack, et. al, "The Multistable Charge Controlled Memory Effect in SOI MOS Transistors at Low Temperatures," IEEE Transactions on Electron Devices, vol. no.5, pp. 1371–1382 May 1990.

In the document (1), one gate electrode is provided and hence this cell seemingly has a one transistor structure, but in reality a PMOS transistor region and an NMOS transistor region are provided under the gate, and its size is larger compared with a single one transistor structure. Moreover, it is necessary to write "0" before writing "1". Also, as for write speed, it is more unfavorable compared with ordinary SRAM and DRAM. In Translated National Publication of Patent Application No. Hei 9-509284 by the same author, an operation example in which it is unnecessary to write "0" before writing "1" is disclosed, but the PMOS transistor region and the NMOS transistor region are similarly provided under the gate.

In the document (2), "1" and "0" cannot be simultaneously written in cells sharing a word line, and an erase operation by the use of an SOI substrate becomes necessary. As for write speed, this gain cell is more unfavorable compared with ordinary SRAM and DRAM.

Japanese Patent Laid-open No. Hei 3-171768 discloses a gain cell of a type configured to store charge with a channel body as a storage node and use a back gate bias effect. In this cell, the source/drain on the side where the bit line is not connected need to be isolated in a bit line direction or a word line direction, whereby the cell size is large. Moreover, it is necessary to write "0" before writing "1", and thus regarding write speed, it is more unfavorable than ordinary SRAM and DRAM.

Japanese Patent Laid-open No. Hei 8-213624 discloses a gain cell of a type configured to store charge with a channel body as a storage node and use the fact that there is difference in parasitic bipolar collector current depending on the potential of the channel body. Also in this gain cell, it is necessary to write "1" before writing "0", and regarding write speed, it is more unfavorable than ordinary SRAM and DRAM.

As described above, those recently proposed as a new DRAM need a special transistor structure and hence they have a complicated structure. Alternatively, even if they have a relatively simple structure, they have a drawback in controllability, whereby the achievement of high integration and high performance is difficult.

SUMMARY OF THE INVENTION

In order to accomplish the aforementioned and other objects, according to one aspect of the present invention, a semiconductor memory device having MIS transistors to constitute memory cells, each of the MIS transistors comprising:

a semiconductor layer;

a source region formed in the semiconductor layer;

a drain region formed apart from the source region in the semiconductor layer, the semiconductor layer between the source region and the drain region serving as a channel body in a floating state;

a main gate provided between the source region and the drain region to form a channel in the channel body; and an auxiliary gate provided separately from the main gate to control a potential of the channel body by capacitive coupling, the auxiliary gate being driven in synchronization with the main gate, wherein the MIS transistor has a first data state in which the channel body is set at a first potential and a second data state in which the channel body is set at a second potential.

According to another aspect of the present invention, a semiconductor memory device having MIS transistors to constitute memory cells, each of the MIS transistors having a first data state and a second data state, the semiconductor memory device, comprising:

a first semiconductor substrate;

auxiliary gates of the MIS transistors formed on the first semiconductor substrate to continue in one direction while their bottom faces and side faces are covered with an insulating film;

a second semiconductor substrate provided on the auxiliary gates with a first gate insulating film therebetween;

main gates of the MIS transistors formed on the second semiconductor substrate with a second gate insulating film to continue in parallel with the auxiliary gates;

source regions formed in space portions between the main gates and the auxiliary gates in the second semiconductor substrate;

drain regions formed apart from the source regions in space portions between the main gates and the auxiliary gates in the second semiconductor substrate;

source lines provided to be in contact with the source regions and continue in parallel with the main gates and the auxiliary gates;

an interlayer dielectric film covering the source lines; and bit lines formed on the interlayer dielectric film in a direction intersecting the main gates and the auxiliary gates and being in contact with the drain regions.

According to a further aspect of the present invention, a method of manufacturing a semiconductor memory device, comprising:

forming an auxiliary gate on a first semiconductor substrate with a first gate insulating film therebetween;

forming an insulating film which is planarized after covering the auxiliary gate;

sticking a second semiconductor substrate on the insulating film;

polishing the first semiconductor substrate to form a semiconductor layer with a predetermined thickness;

forming a device isolation insulating film for device isolation in the first semiconductor substrate;

forming a main gate which faces the auxiliary gate on the semiconductor layer with the first gate insulating film therebetween; and forming a source region and a drain region by ion-implanting impurities into the semiconductor layer with the main gate as a mask.

According to a still further aspect of the present invention, a method of manufacturing a semiconductor memory device, comprising:

forming a main gate on a first semiconductor substrate with a first gate insulating film therebetween;

forming a first insulating film which is planarized after covering the main gate;

sticking a second semiconductor substrate on the first insulating film;

polishing the first semiconductor substrate to form a semiconductor layer with a predetermined thickness;

forming a device isolation insulating film for device isolation in the first semiconductor substrate;

forming a second insulating film on the semiconductor layer;

boring an opening, which reaches the semiconductor layer, in the second insulating film to form a relay electrode connected to the semiconductor layer through the opening;

forming an auxiliary gate on the relay electrode with a second gate insulating film therebetween; and forming a source region and a drain region by ion-implanting impurities into the semiconductor layer with the auxiliary gate as a mask.

According to a still further aspect of the present invention, a method of manufacturing a semiconductor memory device, comprising:

forming a first insulating film on a first semiconductor substrate;

boring an opening, which reaches the first semiconductor substrate, in the first insulating film to form a relay electrode connected to the first semiconductor substrate through the opening;

forming an auxiliary gate on the relay electrode with a first gate insulating film therebetween;

forming a second insulating film which is planarized after covering the auxiliary gate;

sticking a second semiconductor substrate on the second insulating film;

polishing the first semiconductor substrate to form a semiconductor layer with a predetermined thickness;

forming a device isolation insulating film for device isolation in the first semiconductor substrate;

forming a main gate on the semiconductor layer with a second gate insulating film therebetween; and forming a source region and a drain region by ion-implanting impurities into the semiconductor layer with the main gate as a mask.

According to a still further aspect of the present invention, a method of manufacturing a semiconductor memory device, comprising:

forming a semiconductor layer on a semiconductor substrate with a first insulating film therebetween;

burying a device isolation insulating film in the semiconductor layer to demarcate device-formed regions device-isolated in a first direction;

burying a main gate, which faces a side face of the semiconductor layer with a first gate insulating film therebetween, in the device isolation insulating film;

forming an auxiliary gate, which faces the semiconductor layer with a second gate insulating film therebetween, on an upper face of the semiconductor layer in a state in which the auxiliary gate is electrically connected to the main gate and by using a material with a work function different from that of the main gate; and forming a source region and a drain region by ion-implanting impurities into the semiconductor layer with the auxiliary gate as a mask.

According to a still further aspect of the present invention, a method of manufacturing a semiconductor memory device, comprising:

forming a gate electrode material film on a first semiconductor substrate with a first insulating film therebetween;

bonding a second semiconductor substrate on the gate electrode material film with a first gate insulating film therebetween;

forming a device isolation insulating film in the second semiconductor substrate to demarcate device-formed regions continuing in a first direction in a stripe form;

depositing a second insulating film on the second semiconductor substrate where the device-formed regions are demarcated and pattern-forming the second insulating film as dummy gates continuing in a second direction orthogonal to the first direction;

etching the second semiconductor substrate, the first gate insulating film, and the gate electrode material film sequentially with the dummy gates as a mask to form auxiliary gates out of the gate electrode material film to continue in the second direction;

burying a third insulating film halfway in a thickness direction of the second semiconductor substrate in a space between the dummy gates;

forming a semiconductor layer on the third insulating film in the space between the dummy gates so that side faces thereof touch the second semiconductor substrate;

removing the dummy gates and forming a second gate insulating film on a surface of the exposed second semiconductor substrate;

burying main gates continuing in parallel with the auxiliary gates in space portions in the semiconductor layer;

ion-implanting impurities into the semiconductor layer to form source regions and drain regions;

forming source lines being in contact with the source regions and continuing in the second direction; and forming an interlayer dielectric film covering the source lines and forming bit lines being in contact with the drain regions and continuing in the first direction on the interlayer dielectric film.

BRIEF DESCRIPTION OF THE DRAWINGS

FIG. 7I is a diagram showing an example of a layout when the row decoder and the word line driver shown in FIG. 7G or FIG. 7H are disposed in relation to the memory cell array (when the row decoder and the word line driver on the right and the left side are disposed alternately for pairs of the first word line and the second word line);

FIG. 73B is a sectional view taken along the line II–II' in FIG. 73A;

FIG. 74 is a sectional view showing a step of depositing an insulating film for dummy word lines in the manufacturing process;

FIG. 75 is a sectional view showing a step of forming the dummy word lines and isolating auxiliary gates with the dummy word lines in the manufacturing process;

FIG. 76 is a sectional view showing a silicon nitride film forming step in the manufacturing process;

FIG. 77 is a sectional view showing a step of burying an insulating film in each isolation trench in the manufacturing process;

FIG. 78 is a sectional view showing a silicon nitride film removing step in the manufacturing process;

FIG. 79 is a sectional view showing a silicon layer growing step in the manufacturing process;

FIG. 80 is a sectional view showing a dummyword line removing step in the manufacturing process;

FIG. 81 is a sectional view showing a gate insulating film forming step and a silicon nitride film forming step in the manufacturing process;

FIG. 82 is a sectional view showing a main gate burying step in the manufacturing process;

FIG. 83 is a sectional view showing a silicon nitride film depositing step in the manufacturing process;

FIG. 84A is a plan view showing a silicon nitride film etching step in the manufacturing process;

Figure 68A:
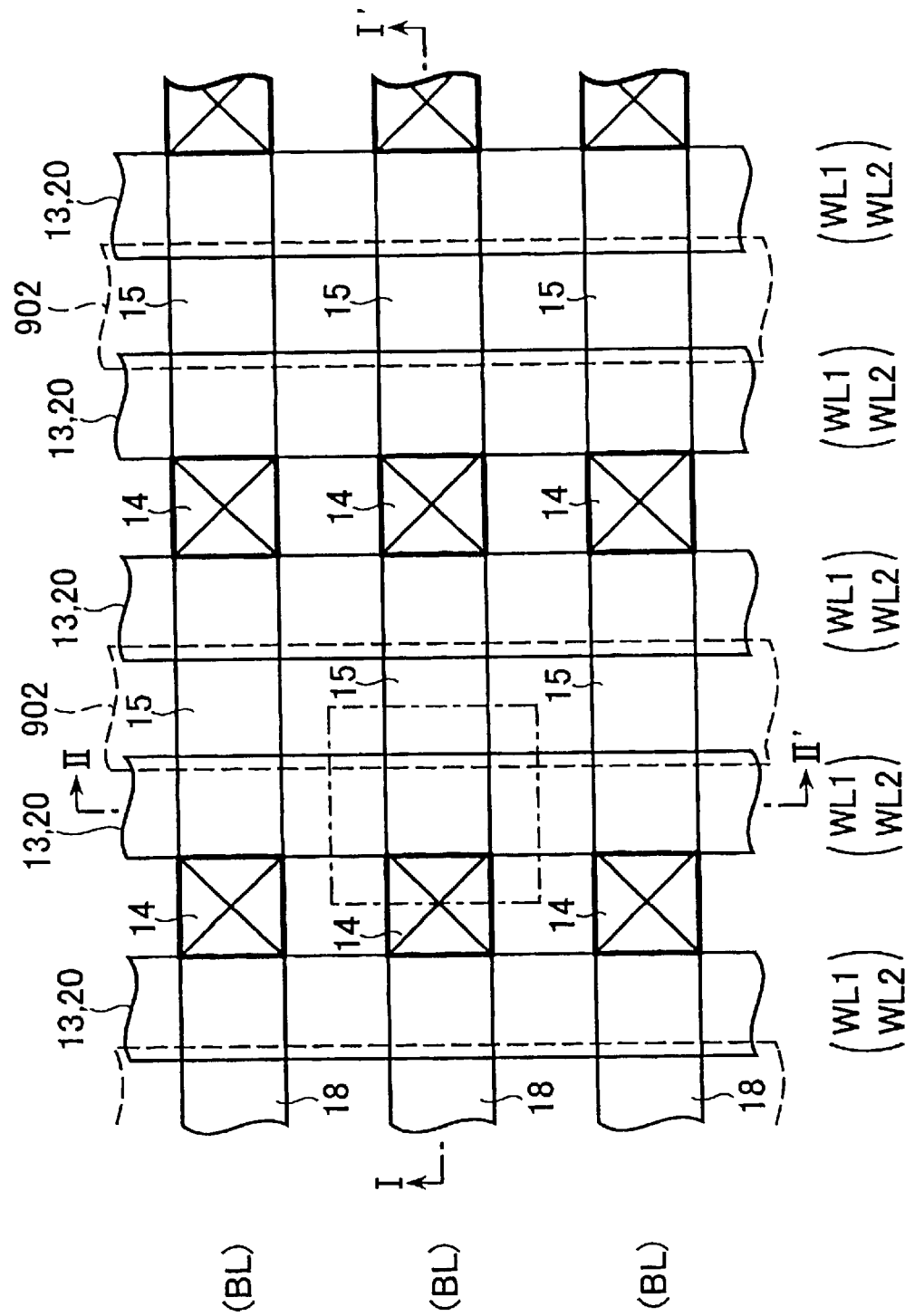
FIG. 68A is a plan view of a cell array according to a sixth embodiment.
Figure 68B:
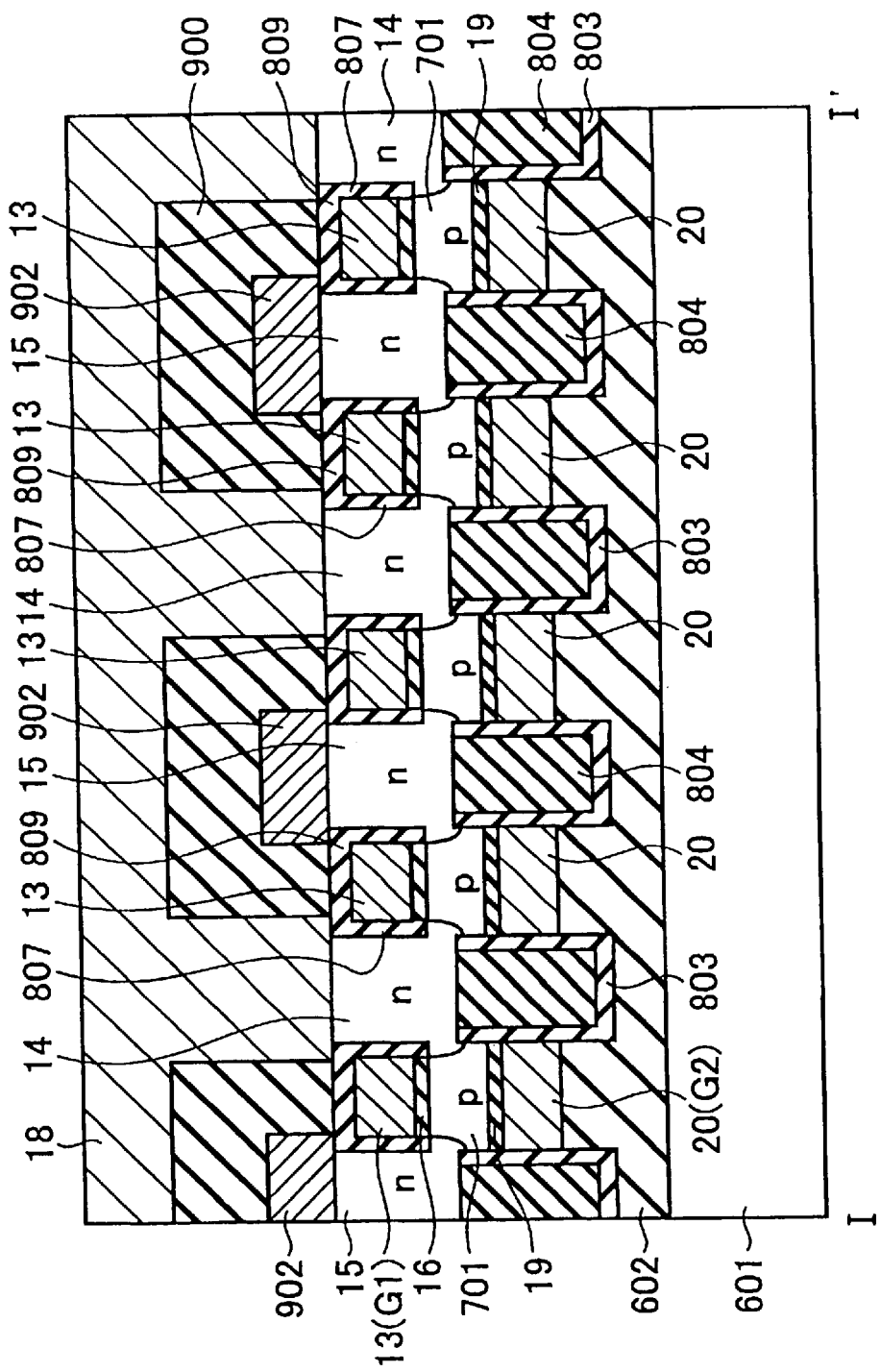
FIG. 68B is a sectional view taken along the line I–I' in FIG. 68A.
Figure 84A:
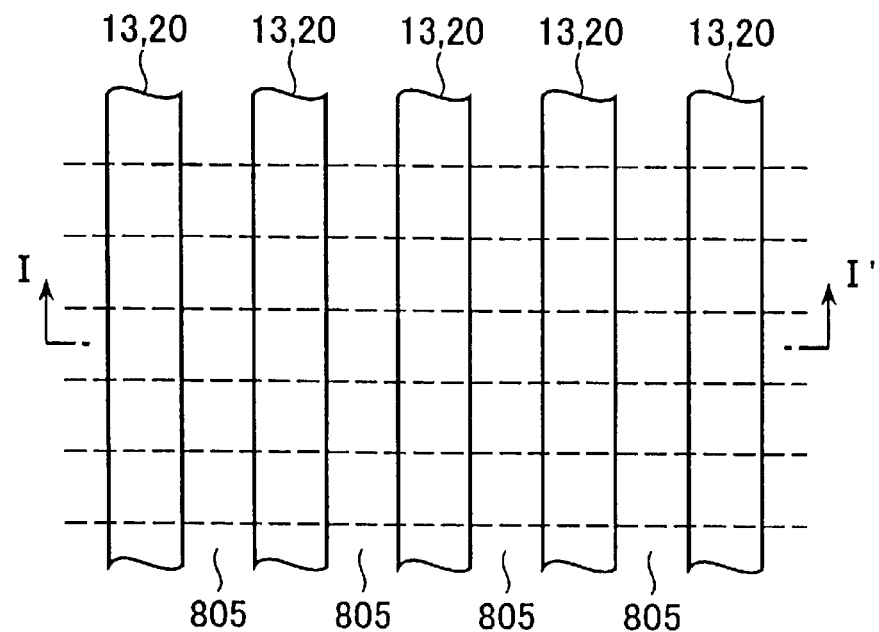
Figure 84B:
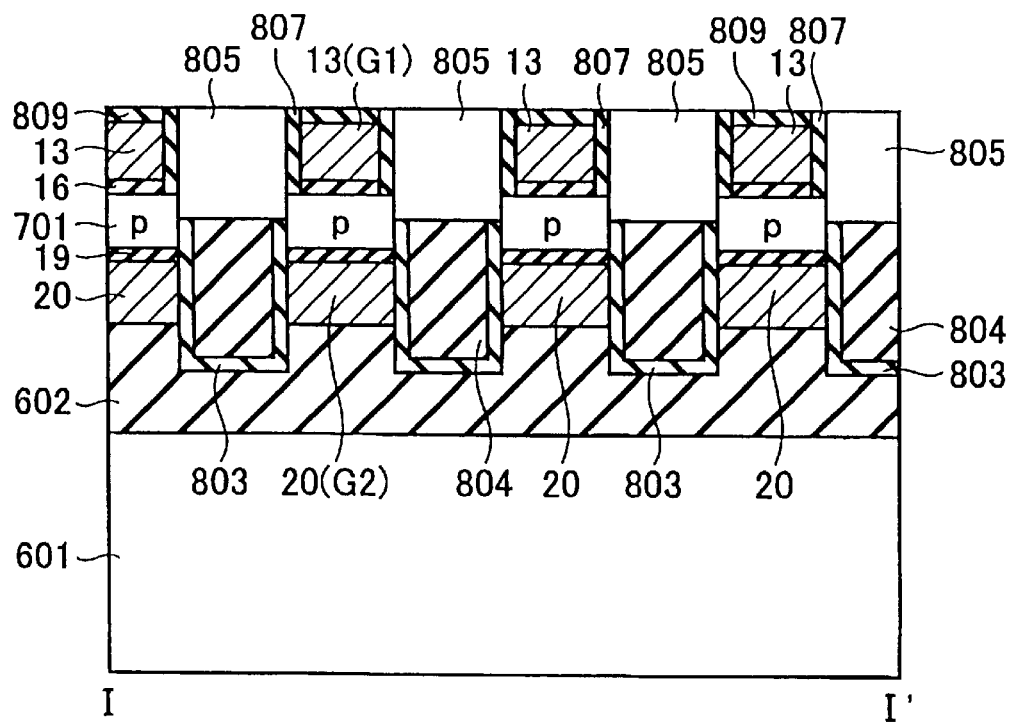
Figure 85:
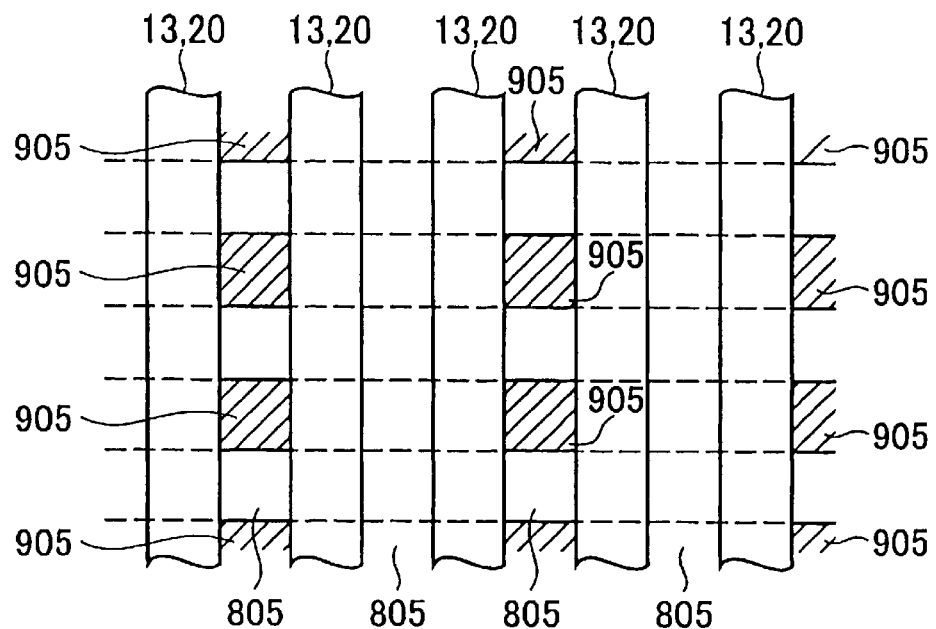
Figure 86:
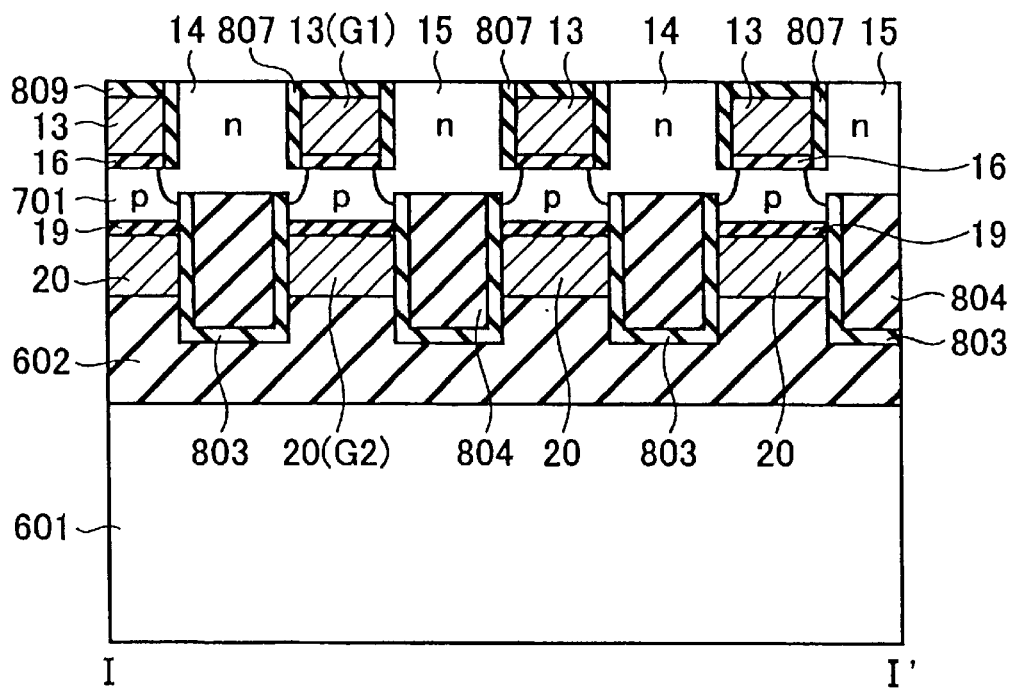
Figure 87:
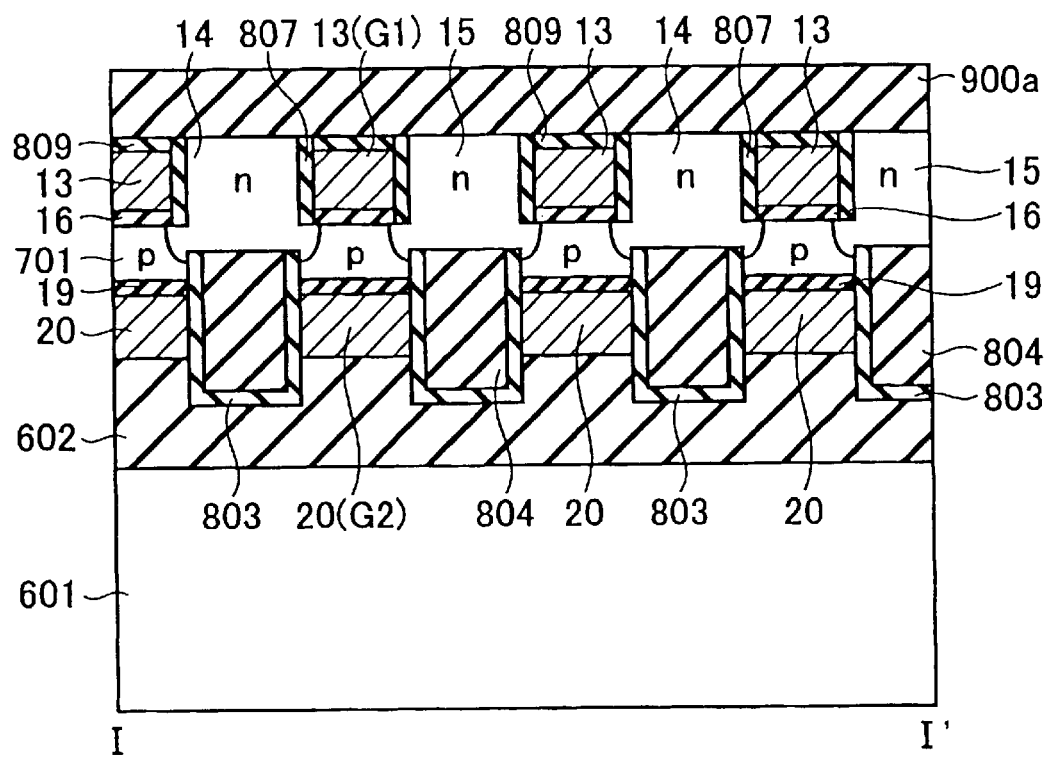
Figure 88:
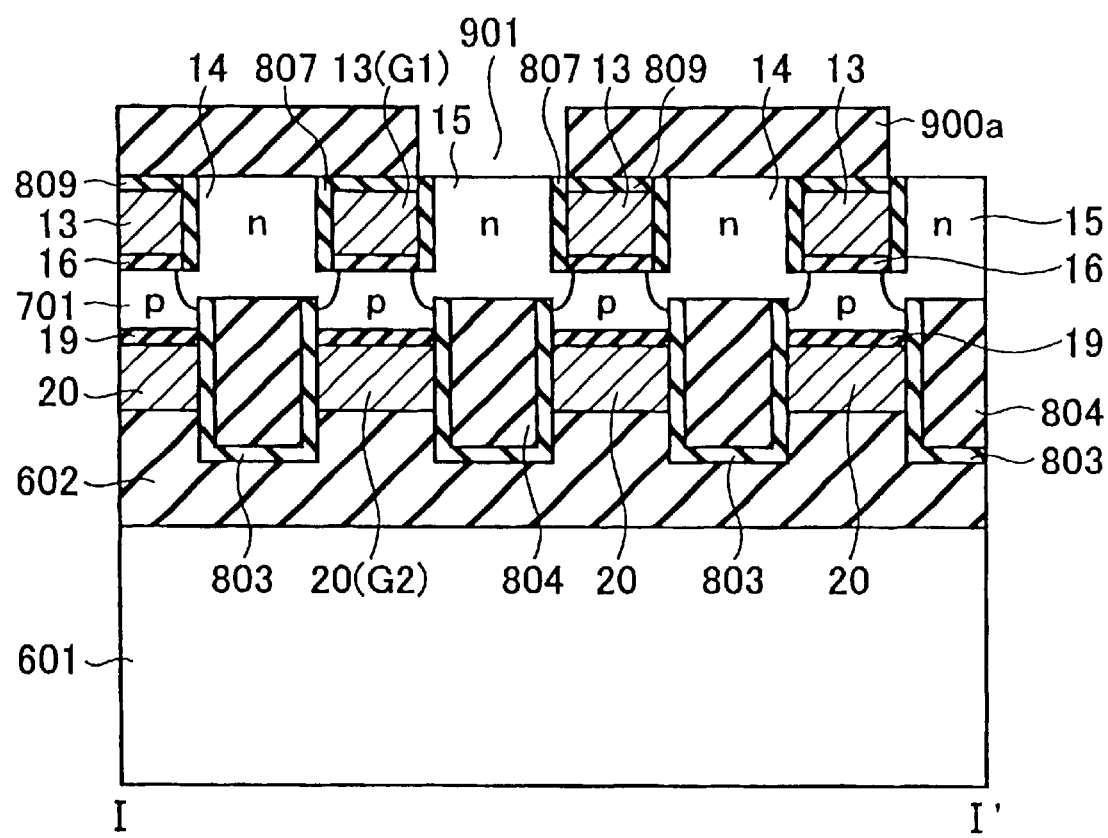
Figure 89:
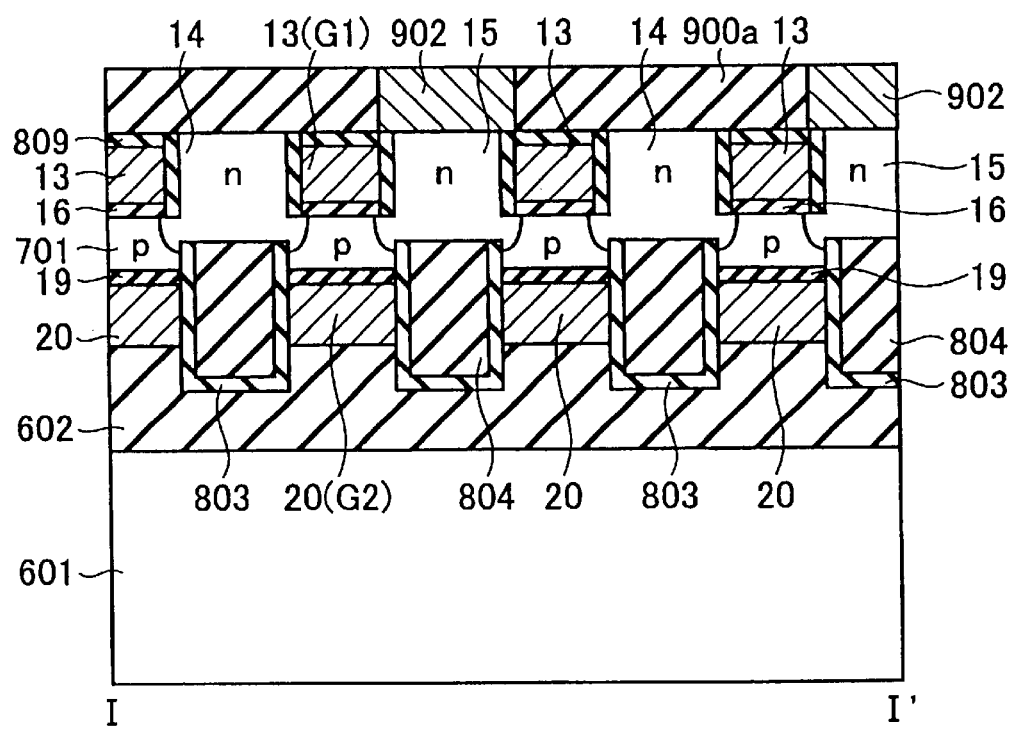
Figure 90:
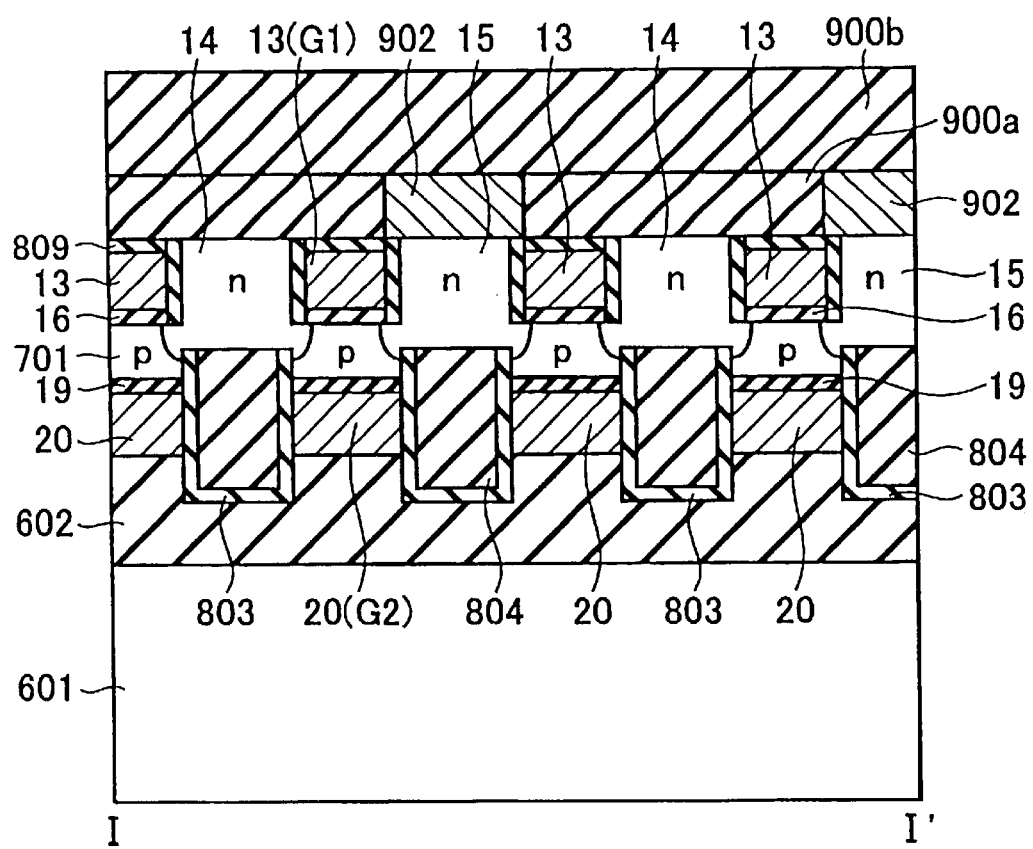
Figure 91:
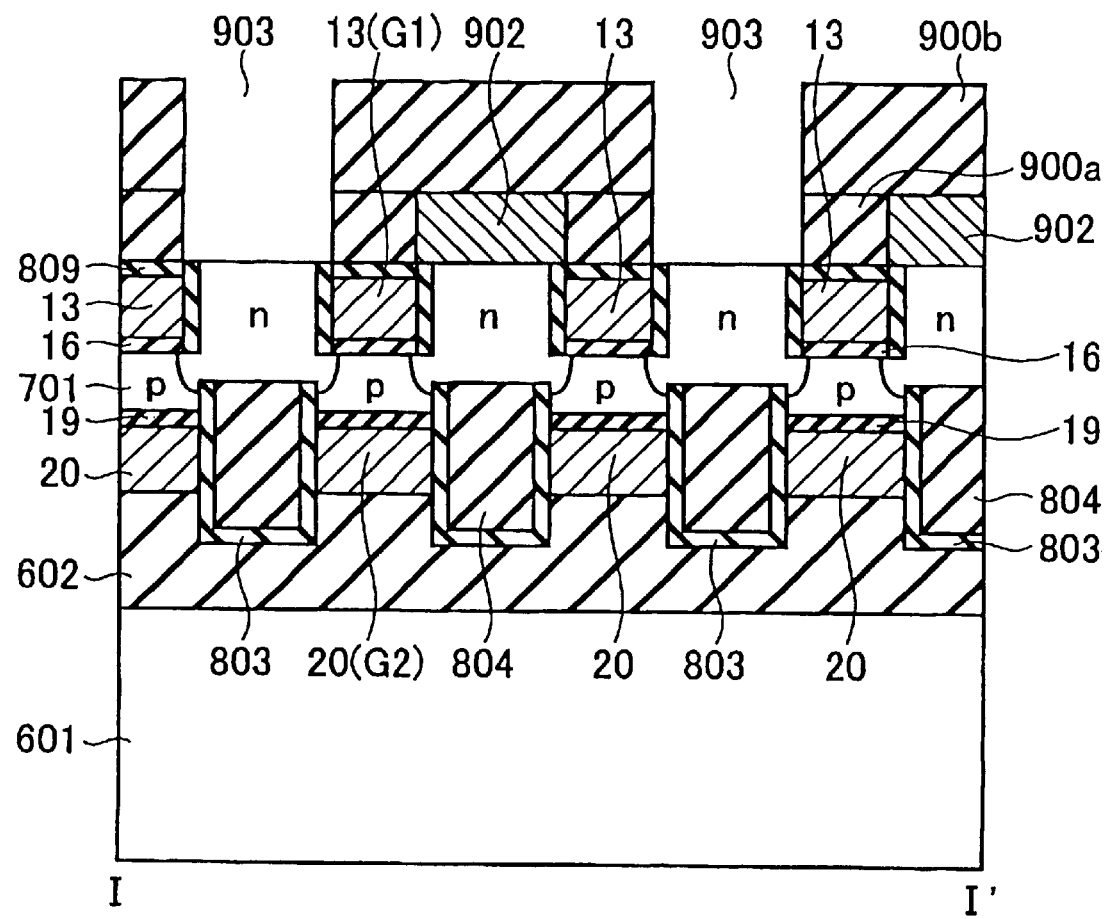
Figure 92:
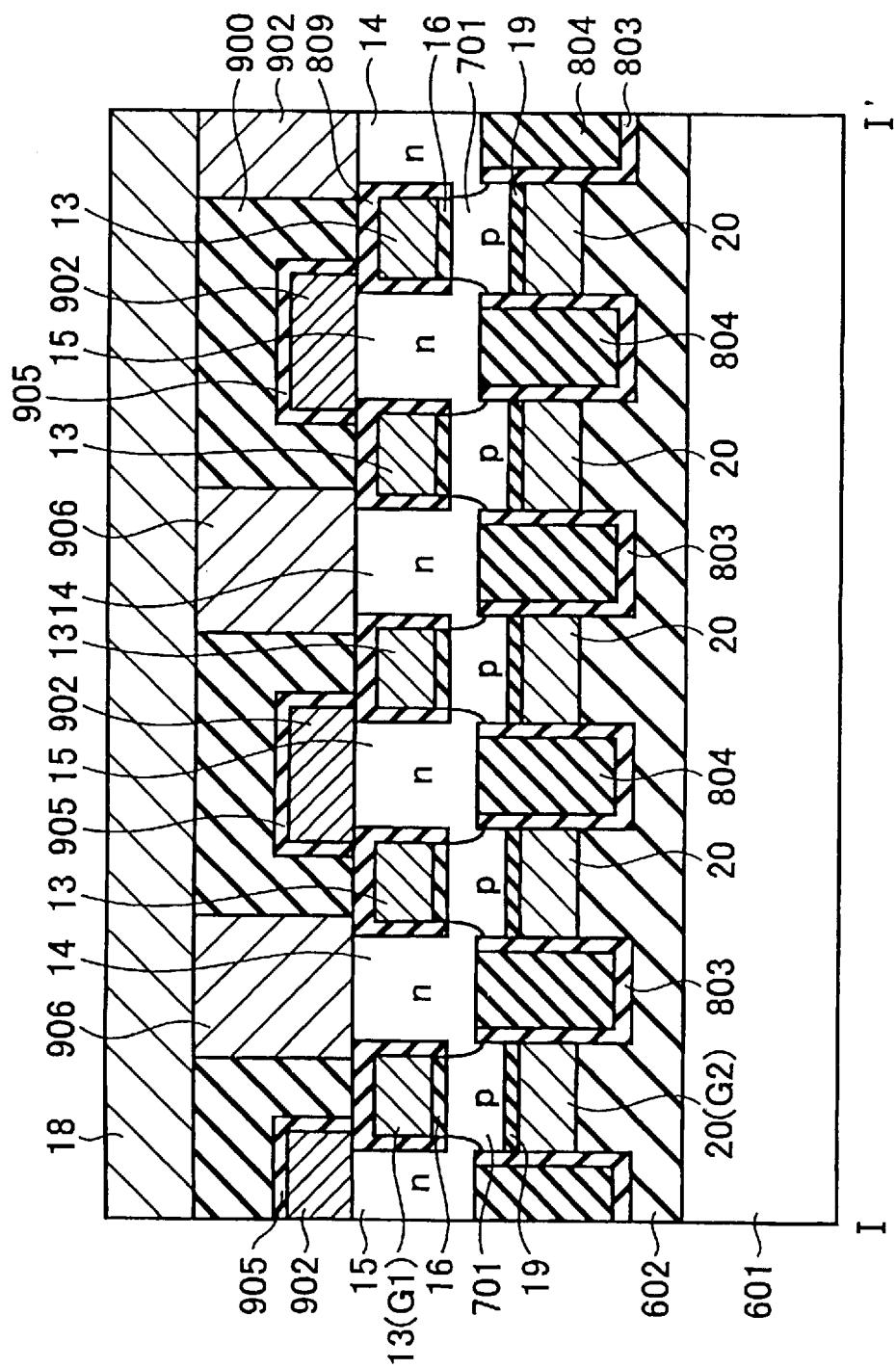

FIG. 84B is a sectional view taken along the line I–I' in FIG. 84A;

FIG. 85 is a plan view showing a device isolating step in the manufacturing process;

FIG. 86 is a sectional view showing a source/drain diffusion regions forming step in the manufacturing process;

FIG. 87 is a sectional view showing an interlayer dielectric film forming step in the manufacturing process;

FIG. 88 is a sectional view showing a source line-buried trench forming step in the manufacturing process;

FIG. 89 is a sectional view showing a source line burying step in the manufacturing process;

FIG. 90 is a sectional view showing an interlayer dielectric film forming step in the manufacturing process;

FIG. 91 is a sectional view showing a bit line contact hole and wiring trench forming step in the manufacturing process; and FIG. 92 is a sectional view showing a cell array according to another embodiment corresponding to FIG. 68B.

DERAILED DESCRIPTION OF THE INVENTION

Several embodiments of the present invention will be explained below with reference to the drawings. First, the basic principle of a memory cell used in the following embodiments will be explained before the concrete embodiments are explained.

Figure 1:
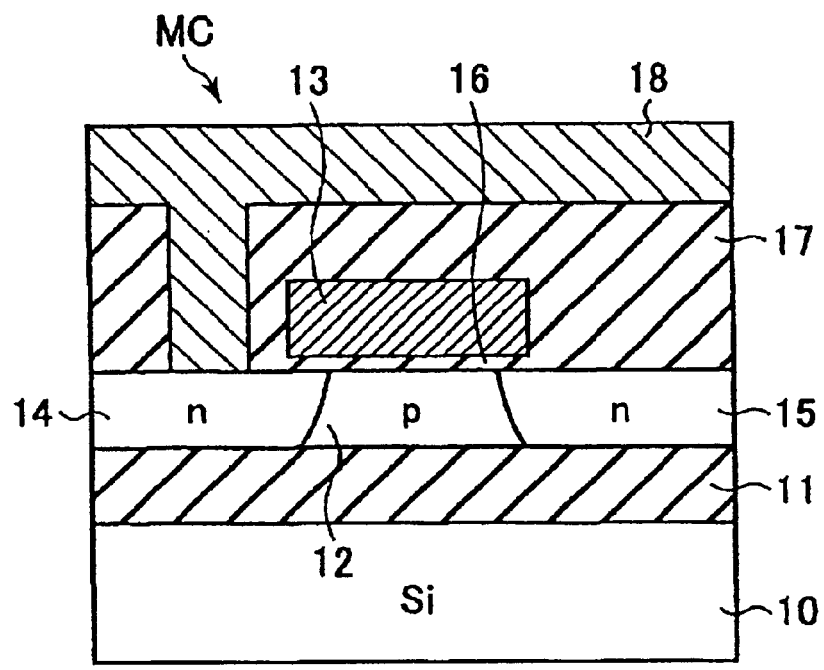
FIG. 1 is a diagram showing the basic structure of a DRAM cell used in respective embodiments.

FIG. 1 shows the basic sectional structure of a unit memory cell of a DRAM. A memory cell MC is composed of an n-channel MIS transistor with an SOI structure. Specifically, an SOI substrate, in which a silicon oxide film 11 as an insulating film is formed on a silicon substrate 10 and a p-type silicon layer 12 is formed on the silicon oxide film 11, is used. A gate electrode 13 is formed on the silicon layer 12 of this SOI substrate with a gate oxide film 16 therebetween, and an n-type drain diffusion region 14 and an n-type source drain region 15 are formed, being self-aligned by the gate electrode 13.

The drain diffusion region 14 and the source diffusion region 15 are formed deep to reach the silicon oxide film 11 at the bottom. Therefore, a channel body region composed of the p-type silicon layer 12 is insulatingly isolated from others at its bottom face and its side faces in a channel width direction and is floating in a channel length direction with a pn junction isolated if isolation in the channel width direction (a direction perpendicular to a paper surface in FIG. 1) is performed by an oxide film.

The operational principle of the DRAM cell composed of this MIS transistor utilizes an accumulation state of holes being majority carriers in the channel body (the p-type silicon layer 12 insulatingly isolated from others) of the transistor. Specifically, a large electric current is sent from the drain region 14 by operating the transistor in a pentode region to generate impact ionization near the drain region 14. Holes which are majority carriers produced by this impact ionization are held by the p-type silicon layer 12, and this state in which the holes are accumulated is defined, for example, as a data "1". A state in which a pn junction between the drain region 14 and the p-type silicon layer 12 is forward biased to emit the holes in the p-type silicon layer 12 to the drain side is defined as a data "0".

Figure 2:
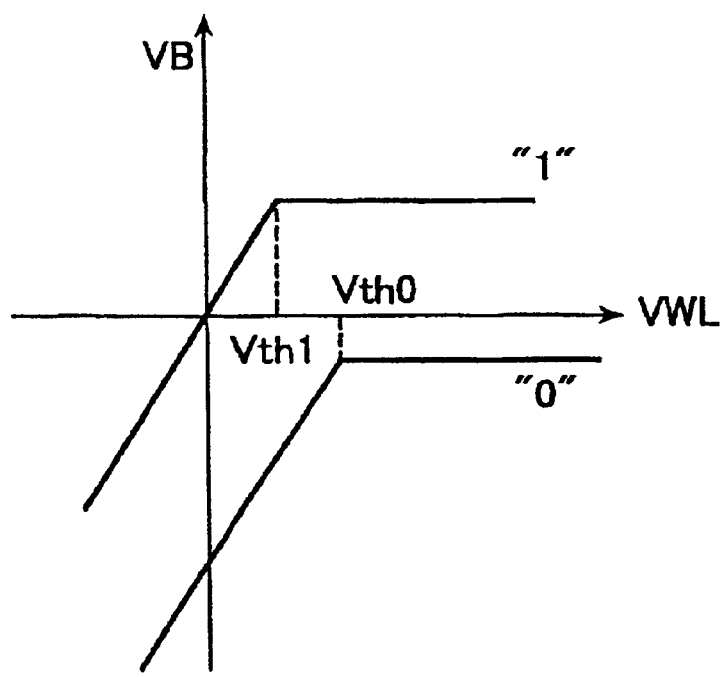
FIG. 2 is a diagram showing the relation between body potential and gate bias for explaining the operational principle of the DRAM cell.

The data "0" and "1" indicate difference in the potential of the channel body and are stored as difference in threshold voltage of the MIS transistor. FIG. 2 shows the relation between drive potential VWL and body potential VB. As shown in FIG. 2, a threshold voltage Vth1 in a data "1" state in which the body potential VB is high due to hole accumulation is lower than a threshold voltage Vth0 in a data "0" state. In order to hold the "1" data state in which the holes being majority carriers are accumulated in the body, it is necessary to apply a negative bias voltage to the gate 13. This data hold state is not changed even if a read operation is performed as long as a write operation of inverted data (erase) is not performed. Namely, unlike a one transistor/one capacitor DRAM which utilizes charge storage by a capacitor, non-destructive read-out is possible.

In the aforementioned basic DRAM cell structure, to what extent the difference in threshold voltage between data "0" and "1" can increase is an important point. As is obvious from the aforementioned operational principle, the write characteristic and hold characteristic of data are determined by controlling the body potential by capacitive coupling from the gate 13. However, since the threshold voltage is about the square root of the body potential, it is not easy to realize a great difference in threshold voltage between the data "0" and "1". Besides, in the aforementioned write operation, the memory cell MC during the "0" write operation performs triode operation, and hence the gate 13 and the channel body do not perform capacitive coupling when the channel is formed, whereby the body potential can not be increased.

Accordingly, in the following embodiments, as against the aforementioned basic structure of the memory cell, an auxiliary gate (a second gate) to control the body potential by capacitive coupling to the body of the MIS transistor is provided in addition to a main gate (a first gate) which is used for the formation of the channel. By driving the second gate in synchronization with the first gate, more certain data write operation is realized, and the data "0" and "1" with a great difference in threshold voltage can be stored.

Concrete embodiments will be explained below.

First Embodiment

Figure 3:
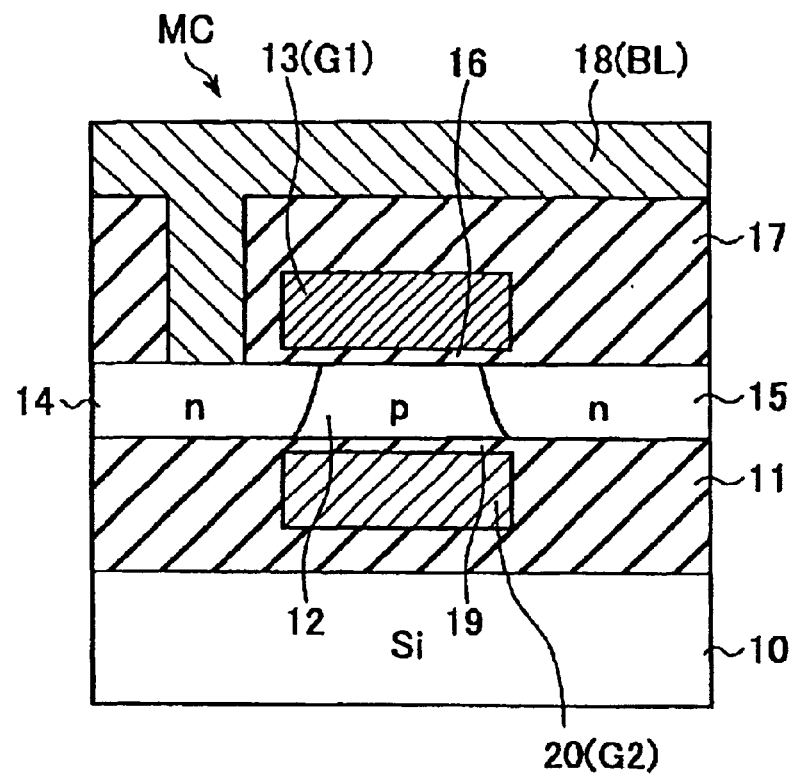
FIG. 3 is a diagram showing the sectional structure of a DRAM cell according to a first embodiment of the present invention.

FIG. 3 shows the structure of a memory cell MC according to a first embodiment corresponding to the basic structure in FIG. 1. A point different from FIG. 1 is that a second gate (G2) 20 to control the body potential is provided in addition to a first gate (G1) 13 which is a front gate used for the control of the channel of the transistor. In this embodiment, the second gate 20 is buried in the oxide film 11 under the silicon layer 12 as an opposite back gate to perform capacitive coupling to a bottom face of the silicon layer 12 with a gate insulating film 19 therebetween.

Figure 4:
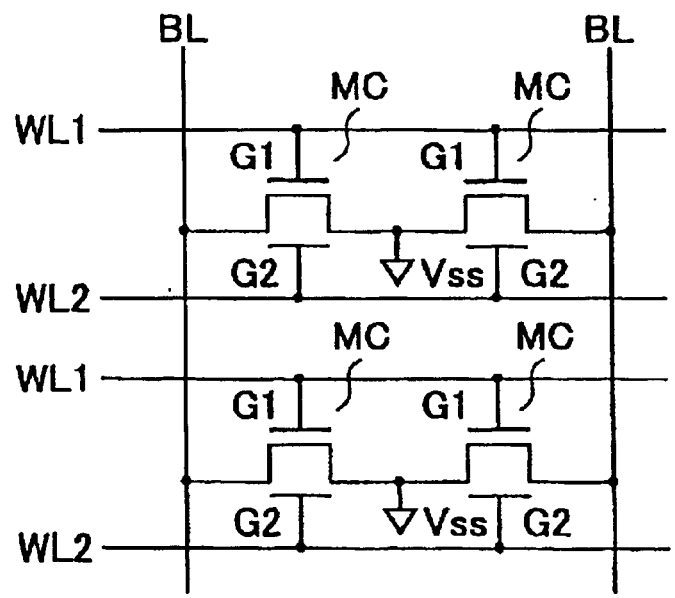
FIG. 4 is a diagram showing an equivalent circuit of a cell array using the DRAM cells.

FIG. 4 shows an equivalent circuit of a memory cell array in which a plurality of such memory cells MC are arranged in a matrix form. The first gates (G1) 13 of a plurality of memory cells MC arranged in one direction are connected to first word lines WL1, and the second gates (G2) 20 are connected to the second word lines WL2. Bit lines BL to which the drains of the memory cells MC are connected are disposed in a direction intersecting these word lines WL1 and WL2. The sources 15 of all the memory cells MC are connected to a fixed potential line (a ground potential line VSS).

Figure 5:
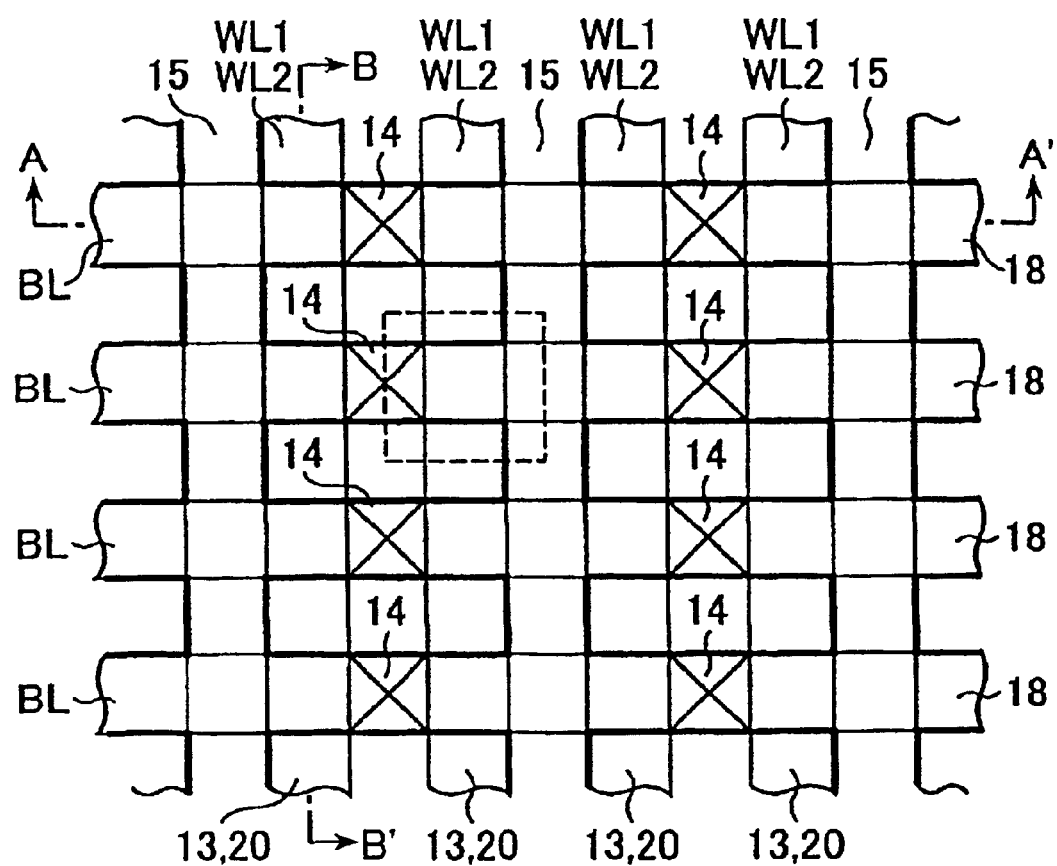
FIG. 5 is a diagram showing the layout of the cell array.
Figure 6A:
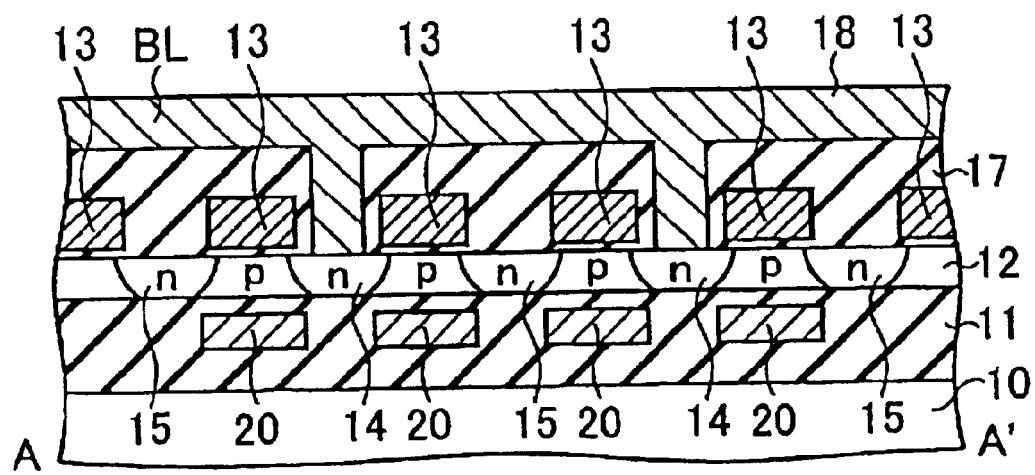
FIG. 6A is a sectional view taken along the line A–A' in FIG. 5.
Figure 6B:
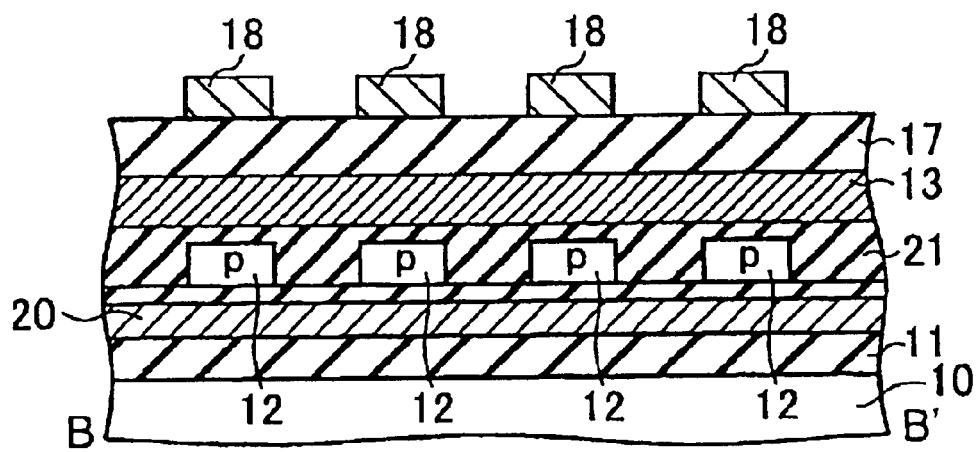
FIG. 6B is a sectional view taken along the line B–B' in FIG. 5.

FIG. 5 shows the layout of the memory cell array, and FIG. 6A and FIG. 6B respectively show sections taken along the line A–A' and the line B–B' in FIG. 5. The p-type silicon layer 12 is pattern-formed in a lattice form by burying a silicon oxide film 21 therein. Namely, two transistor regions sharing the drain region 14 are arranged, being device-isolated in the direction of the word lines WL1 and WL2 by the silicon oxide film 21. Alternatively, instead of burying the silicon oxide film 21, device isolation in a crosswise direction may be performed by etching the silicon layer 12. The first gates 13 and the second gates 20 are formed continuously in one direction to constitute the word lines WL1 and WL2. The sources 15 are continuously formed in the direction of the word lines WL1 and WL2 to constitute the fixed potential line (common source line). The transistors are covered with an interlayer dielectric film 17, and bit lines (BL) 18 are formed thereon. The bit lines 18 are disposed to come in contact with the drains 14 each shared by two transistors and intersect the word lines WL 1 and WL2.

Thereby, the silicon layers 12, each being a channel body of each transistor, are isolated from each other at their bottom faces and side faces in the channel width direction by the oxide film, and isolated from each other in the channel length direction by pn junction to be maintained in a floating state.

In this memory cell array structure, if the word lines WL and the bit lines BL are formed with a pitch of a minimum feature size F, a unit cell area is $2F \times 2F = 4F^2$ as shown by a broken line in FIG. 5.

As described above, the memory cell array capable of dynamic storage is structured with one MIS transistor as a 1-bit memory cell MC.

Figure 7A:
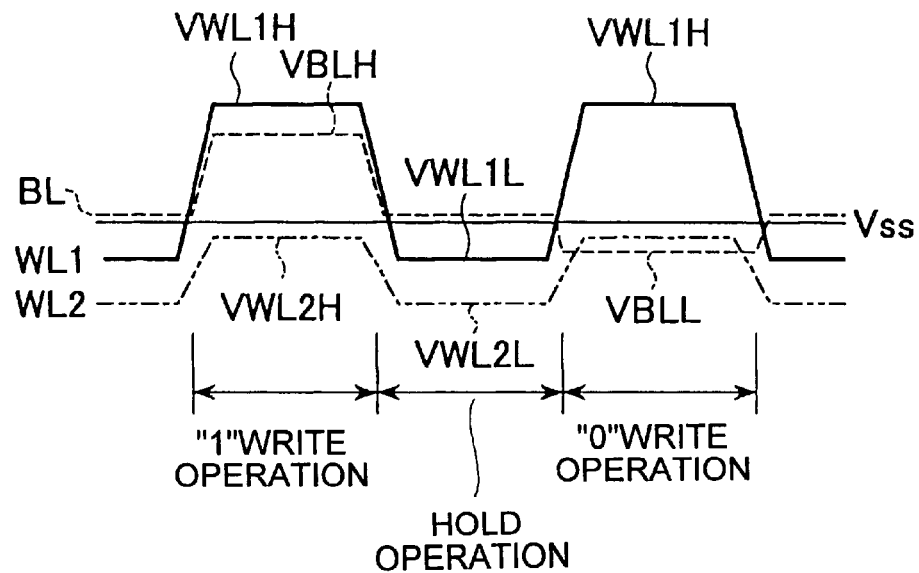
FIG. 7A is a waveform diagram showing a write operation of the DRAM cell when a first gate and a second gate are formed out of the same material.
Figure 7B:
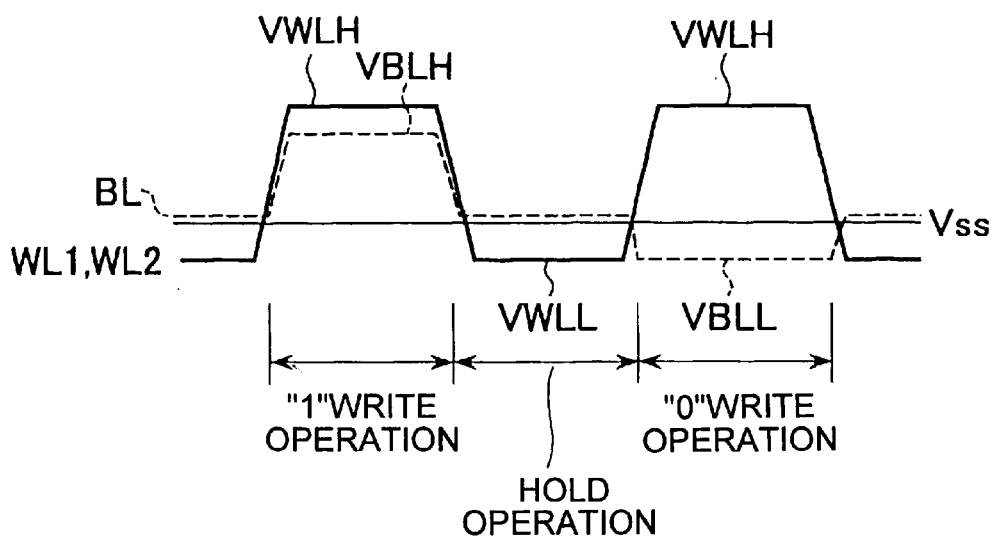
FIG. 7B is a waveform diagram showing a write operation of the DRAM cell when the first gate and the second gate are formed out of materials with different work functions.

FIG. 7A and FIG. 7B show voltage waveforms of the word lines WL1 and WL2 and the bit line BL at the time of a data write operation. The first word line WL1 and the second word line WL2, which form a pair, are driven synchronously. FIG. 7A shows that when the same material is used for the first gate 13 and the second gate 20, the accumulation of majority carriers on the second gate 20 side of the channel body becomes possible by controlling the second gate 20 at a potential lower than the first gate 13. Meanwhile, FIG. 7B shows that when electrode materials with different work functions are used for the first gate 13 and the second gate 20, the accumulation of majority carriers on the second gate 20 side of the channel body becomes possible by applying the same potential to both of them.

In the case of FIG. 7A, at the time of a "1" data write operation, a positive potential VWL1H higher than a reference potential VSS is applied to the selected first word line WL1, and a potential VWL2H (a negative potential lower than the reference potential VSS in the illustrated example) lower than the potential VWL1H is applied to the simultaneously selected second word line WL2, and a positive potential VBLH higher than the reference potential VSS is applied to the selected bit line BL. Thereby, in the selected memory cell MC, impact ionization due to a pentode operation occurs, whereby holes are accumulated in the channel body.

In a data hold operation, a negative potential VWL1L lower than the reference potential VSS is applied to the first word line WL1, and a still lower potential VWL2L is applied to the second word line WL2. Thereby, the "1" data in the state in which excessive holes are accumulated in the channel body is held.

At the time of a "0" datawrite operation, the same potentials VWL1H and VWL2H as at the time of the "1" data write operation are applied respectively to the selected first and second word lines WL1 and WL2, and a negative potential VBLL lower than the reference potential VSS is applied to the selected bit line BL. Thereby, in the selected memory cell MC, a drain junction is forward biased, and the holes in the channel body are emitted to the drain region 14, whereby the "0" data in the state of low body potential is written.

In the case of FIG. 7B, at the time of the "1" data write operation, a positive potential VWLH higher than the reference potential VSS is applied to the selected first and second word lines WL1 and WL2, and the positive potential VBLH higher than the reference potential VSS is applied to the selected bit line BL. Thereby, in the selected memory cell MC, impact ionization due to the pentode operation occurs, whereby holes are accumulated in the body.

In the data hold operation, a negative potential VWLL lower than the reference potential VSS is applied to the first and second word lines WL1 and WL2. Thereby, the "1" data in the state in which excessive holes are accumulated in the channel body is held.

At the time of the "0" data write operation, the same potential VWLH as at the time of the "1" data write operation is applied to the selected first and second word lines WL1 and WL2, and the negative potential VBLL lower than the reference potential VSS is applied to the selected bit line BL. Thereby, in the selected memory cell MC, the drain junction is forward biased, and the holes in the channel body are emitted to the drain, whereby the "0" data in the state of low body potential is written.

If the materials with different work functions are used for the two gates 13 and 20 as described above, it is possible to synchronously drive the first word line WL1 and the second word line WL2 at the same potential and control the accumulation of holes in the channel body.

As described above, in this embodiment, by driving the auxiliary gate (second gate) 20 together with the main gate (first gate) 13, "0" and "1" data operations with a great difference in threshold voltage become possible. Namely, the second gate 20 is maintained at the negative potential in the data hold state, and the potential of the second gate 20 is increased at the time of the data write operation while the hole accumulation state of the "1" data is maintained satisfactorily, which makes it possible to increase the body potential by capacitive coupling and ensure the data write operation. Even if the channel is formed on the first gate 13 side in the case of the "0" data write operation, the certain "0" data operation is possible because the body potential can be increased by the drive of the second gate 20.

Thus, "0" and "1" data with a great difference in threshold voltage can be stored.

Data is held by decreasing the potential of the non-selected first word line WL1 at which time the potential of second word line WL2 making a pair therewith is also decreased to control the body potential low, whereby data destruction in the non-selected memory cell MC which holds the "1" data is certainly prevented when the "0" datawrite operation is performed in another cell connected to the same bit line BL. Moreover, there is a fear of data destruction due to surface breakdown or a GIDL (Gate Induced Drain Leakage) current in the non-selected "0" data cell connected to the "1" write bit line BL, but this fear is dispelled by decreasing the body potential by the second word line WL2 in this embodiment.

Further, although an electric current flows from the source to the bit line BL when the potential of the bit line BL is decreased greatly at the time of the "0" write operation, the body potential is increased by the second gate 20 in this embodiment, whereby it is unnecessary to decrease the potential of the bit line BL so much. Accordingly, for example, it is possible to substantially equalize the potential of the bit line BL with the reference potential VSS of the source and suppress the electric current flowing from the source region 15 to the bit line BL.

At the time of a data read operation, a triode operation is necessary so as not to mistakenly perform the "1" write operation. For this reason, the potential of the bit line BL is lower than that at the time of the "1" write operation, and hence the extension of a depletion layer between the drain region 14 and the channel body is smaller than that at the time of the "1" write operation, leading to an increase in capacitive coupling of the bit line BL to the channel body. This causes capacitance redistribution of carriers injected into the channel body at the time of the write operation, resulting in a drop in body potential. In this embodiment, the accumulation state of the majority carriers of the channel body can be maintained satisfactorily by being controlled by the second gate 20.

Figure 7C:
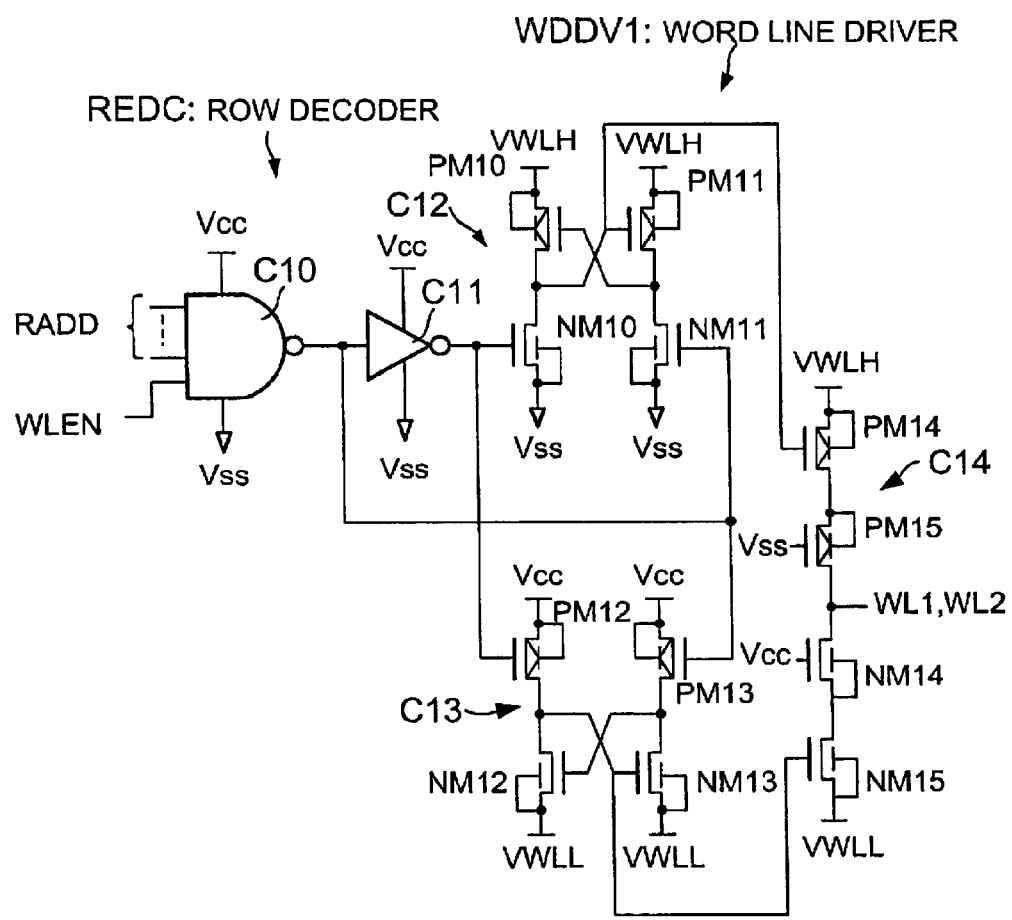
FIG. 7C is a diagram showing an example of the circuit configuration of a word line driver and a row decoder to generate waveforms of the write operation in FIG. 7B.

Next, an example of the concrete circuit configuration of a row decoder and a word line driver in this embodiment will be explained. FIG. 7C is a diagram showing an example of a row decoder RDEC and an example of a word line driver WDDV1 to generate the voltage waveform of the word lines WL1 and WL2 shown in FIG. 7B.

As shown in FIG. 7C, the row decoder RDEC is composed of a NAND circuit C10, and the word line driver WDDV1 is composed of an inverter circuit C11, a level shift circuit C12, a level shift circuit C13, and an output buffer circuit C14. According to this structure, the word line driver WDDV1 selected by the row decoder RDEC changes a potential of a high level into VWLH which is a potential higher than a positive potential VCC and supplies it to the word lines WL1 and WL2.

More specifically, a row address signal RADD and a word line enabling signal WLEN are inputted to the NAND circuit C10. All the high-level row address signals RADD and high-level word line enabling signals WLEN are inputted to the word line driver WDDV1 corresponding to the selected word lines WL1 and WL2. Accordingly, an output from the NAND circuit C10 of the word line driver WDDV1 corresponding to the selected word lines WL1 and WL2 is at a low level, that is, the reference potential VSS. The output from the NAND circuit C10 is inputted to the inverter circuit C11.

This inverter circuit C11 inverts the inputted signal and outputs it. Accordingly, in the selected word line driver WDDV1, an output from the inverter circuit C11 is at a high level, that is, the positive potential VCC. The output from the inverter circuit C11 is inputted to the level shift circuit C12 and the level shift circuit C13. The output from the NAND circuit C10 is also inputted to the level shift circuit C12 and the level shift circuit C13.

Outputs from the level shift circuit C12 and the level shift circuit C13 are inputted to the output buffer circuit C14. By the level shift circuit C12 and the output buffer circuit C14, the output of VCC being a high-level output potential of the inverter circuit C11 is changed to VWLH which is a positive potential higher than VCC and supplied to the word lines WL1 and WL2. Moreover, by the level shift circuit C13 and the output buffer circuit C14, the output of VSS being a low-level output potential of the inverter circuit C11 is changed to VWLL which is a potential lower than VSS and supplied to the word lines WL1 and WL2.

In this embodiment, the level shift circuit C12 is composed of p-type MOS transistors PM10 and PM11 and n-type MOS transistors NM10 and NM11. Source terminals of the p-type MOS transistors PM10 and PM11 are respectively connected to supply lines of the potential VWLH, and drain terminals thereof are respectively connected to drain terminals of the n-type MOS transistors NM10 and NM11. A gate terminal of the p-type MOS transistor PM10 is connected to a node between the p-type MOS transistor PM11 and the n-type MOS transistor NM11, and a gate terminal of the p-type MOS transistor PM11 is connected to a node between the p-type MOS transistor PM10 and the n-type MOS transistor NM10.

The output from the inverter circuit C11 is inputted to a gate terminal of the n-type MOS transistor NM10, and the output from the NAND circuit C10 is inputted to a gate terminal of the n-type MOS transistor NM11. Source terminals of these n-type MOS transistors NM10 and NM11 are respectively connected to supply lines of the potential VSS.

Meanwhile, the level shift circuit C13 is composed of a p-type MOS transistors PM12 and PM13 and n-type MOS transistors NM12 and NM13. Source terminals of the p-type MOS transistors PM12 and PM13 are respectively connected to supply lines of the potential VCC, and drain terminals thereof are respectively connected to drain terminals of the n-type MOS transistors NM12 and NM13. The output from the inverter circuit C11 is inputted to a gate terminal of the p-type MOS transistor PM12, and the output from the NAND circuit C10 is inputted to a gate terminal of the p-type MOS transistor PM13.

A gate terminal of then-type MOS transistor NM12 is connected to a node between the p-type MOS transistor PM13 and the n-type MOS transistor NM13, and a gate terminal of the n-type MOS transistor NM13 is connected to a node between the p-type MOS transistor PM12 and the n-type MOS transistor NM 12. Source terminals of these n-type MOS transistors NM12 and NM13 are respectively connected to supply lines of the potential VWLL.

The output buffer circuit C14 is configured by connecting p-type MOS transistors PM14 and PM15 and n-type MOS transistors NM14 and NM15 in series.

A source terminal of the p-type MOS transistor PM14 is connected to a supply line of the potential VWLH, and a gate terminal thereof is connected to the gate terminal of the p-type MOS transistor PM11 in the pressure increase circuit C12. A drain terminal of the p-type MOS transistor PM14 is connected to a source terminal of the p-type MOS transistor PM15. The potential VSS is inputted to a gate terminal of this p-type MOS transistor PM15. Hence, the p-type MOS transistor PM 15 is a normally-on MOS transistor. A drain terminal of the p-type MOS transistor PM15 is connected to a drain terminal of the n-type MOS transistor NM14. A voltage to drive the word lines WL1 and WL2 is outputted from a node between these p-type MOS transistor PM15 and n-type MOS transistor NM14.

The potential VCC is supplied to a gate terminal of the n-type MOS transistor NM14. Hence, then-type MOS transistor NM14 is a normally-on MOS transistor. A source terminal of the n-type MOS transistor NM14 is connected to a drain terminal of the n-type MOS transistor NM15. A gate terminal of this n-type MOS transistor NM15 is connected to the gate terminal of the n-type MOS transistor NM13 in the level shift circuit C13. A source terminal of the n-type MOS transistor NM15 is connected to a supply line of the potential VWLL.

Using the row decoder RDEC and the word line driver WDDV1 structured as above, the potentials VWLH and VWLL shown in FIG. 7B are generated and supplied to the word lines WL1 and WL2. Incidentally, in FIG. 7C, back gate connection is performed in each MOS transistor, but this is not always necessary.

The output buffer circuit C14 of this word line driver WDDV1 includes the normally-on MOS transistors PM15 and NM 14 in order that a differential voltage between the potential VWLH and the potential VWLL is not directly applied to the MOS transistors PM14 and NM15. Namely, by the normally-on MOS transistors PM15 and NM14, the differential voltage is reduced by a voltage corresponding to their drop in threshold. Accordingly, if this differential voltage is allowed to be directly applied to the MOS transistors PM14 and NM15, the MOS transistors PM15 and NM14 can be omitted as shown in FIG. 7D.

Figure 7D:
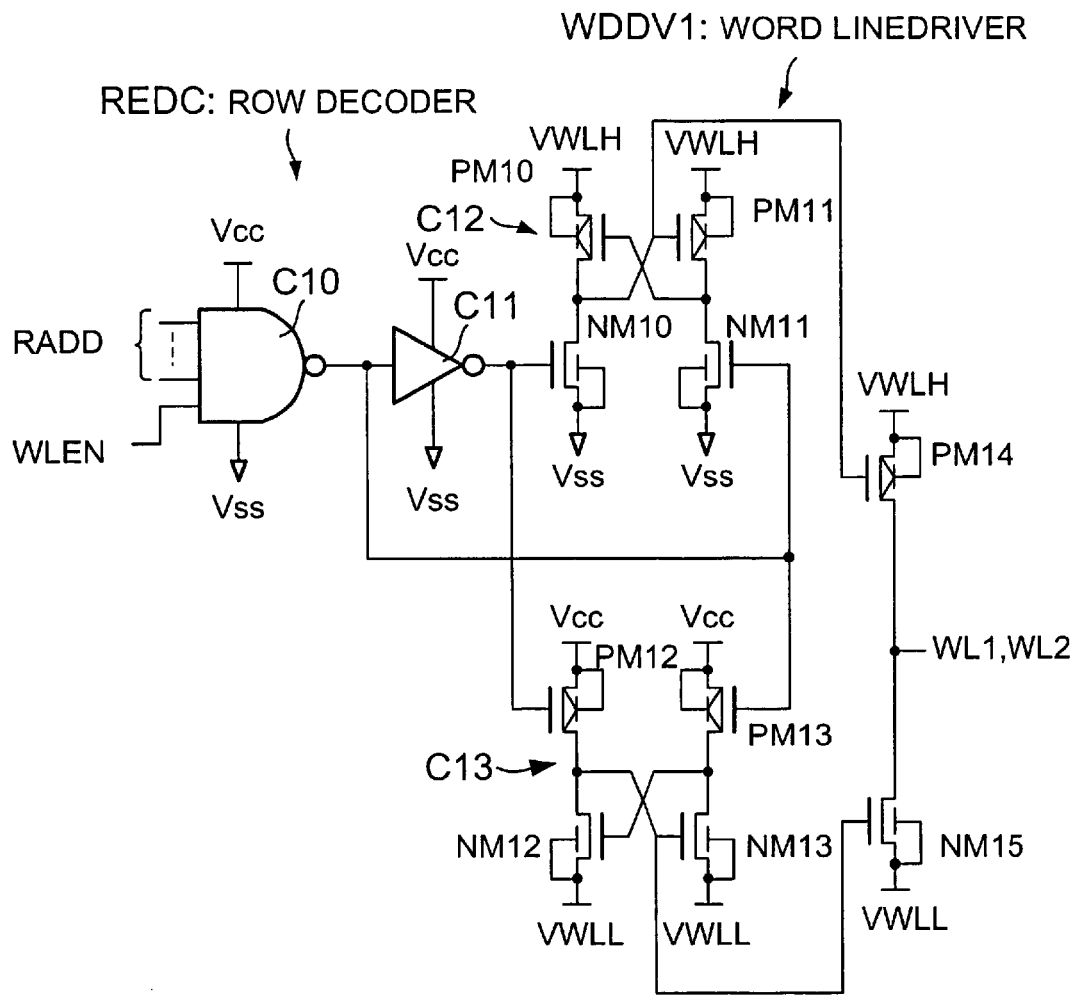
FIG. 7D is a diagram showing a modified example of the word line driver shown in FIG. 7C.
Figure 7E:
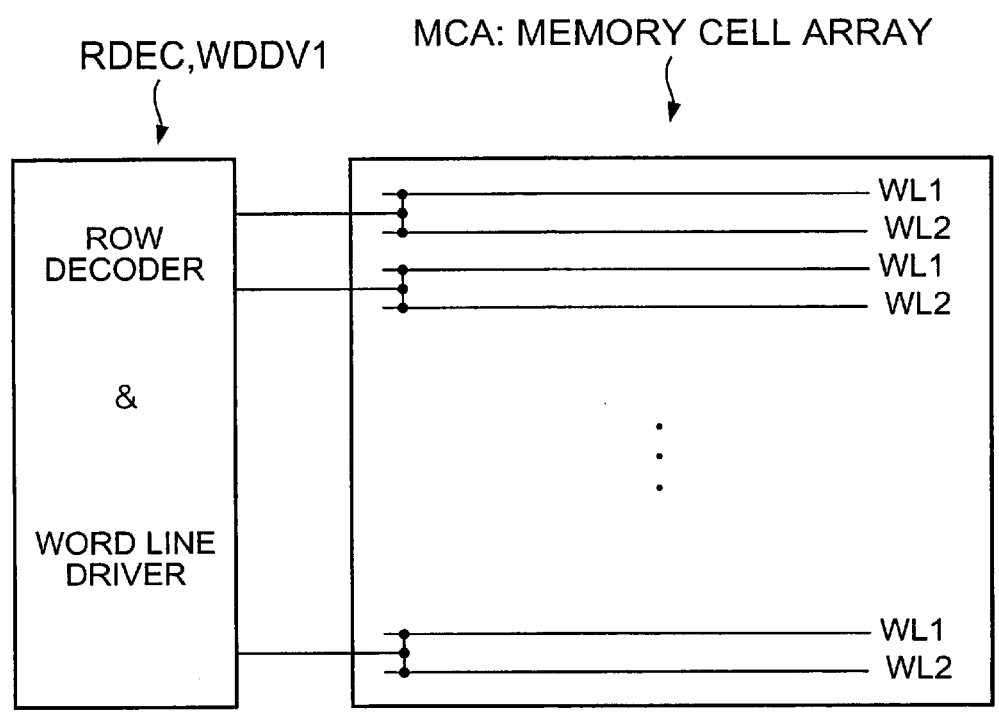
FIG. 7E is a diagram showing an example of a layout when the row decoder and the word line driver shown in FIG. 7C or FIG. 7D are disposed in relation to a memory cell array (disposed on one side)

FIG. 7E is a layout diagram in which the row decoder RDEC and the word line driver WDDV1 shown in FIG. 7C or FIG. 7D are arranged in relation to a memory cell array MCA. As shown in FIG. 7E, when a layout pitch of the word line driver WDDV1 and a wiring pitch of the word lines WL1 and WL2 are matched, the row decoder RDEC and the word line driver WDDV1 can be disposed on one side of the memory cell array MCA.

Figure 7F:
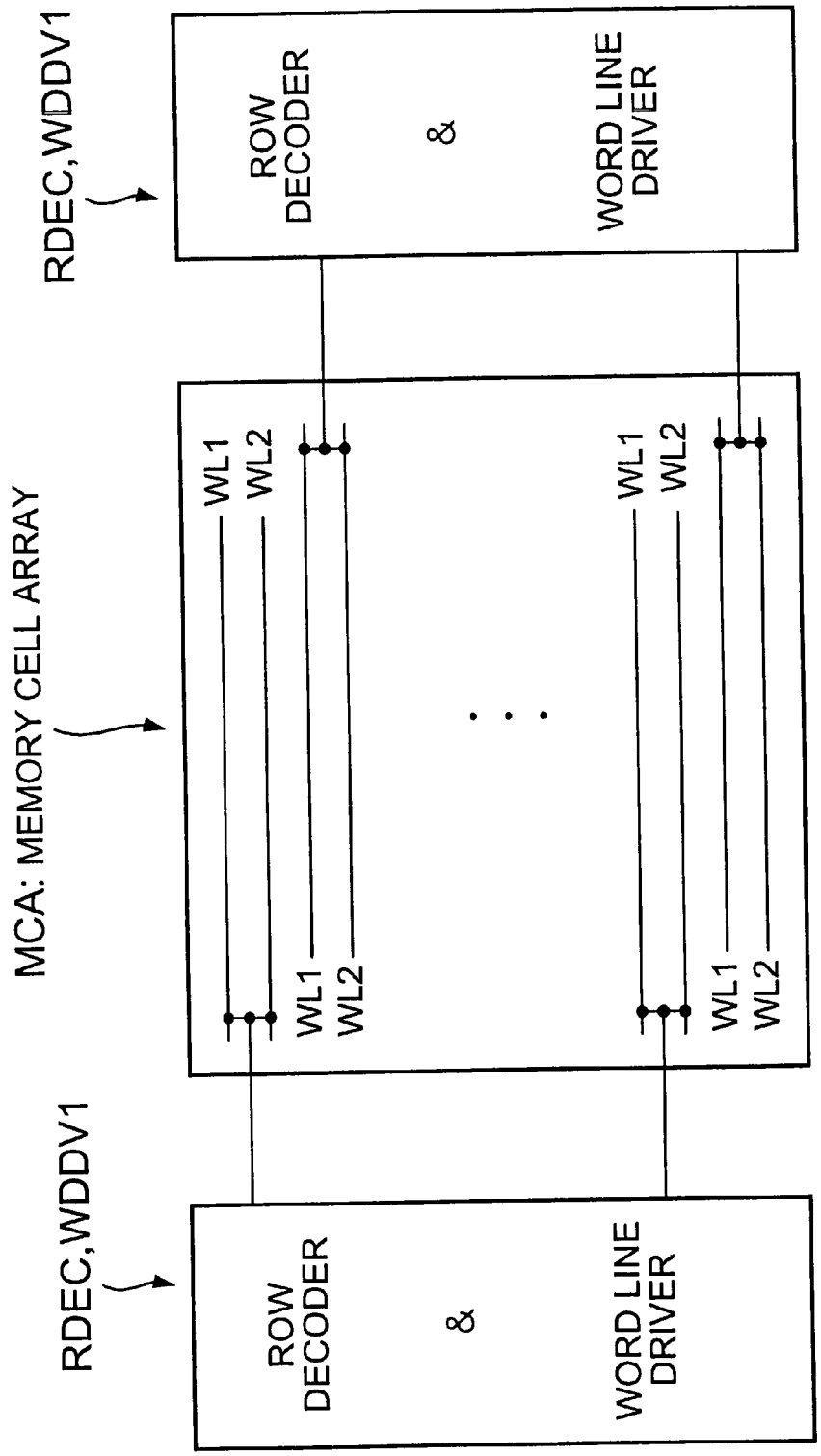
FIG. 7F is a diagram showing an example of the layout when the row decoder and the word line driver shown in FIG. 7C or FIG. 7D are disposed in relation to a memory cell array (disposed on either side)

On the other hand, when the layout area of the word line driver WDDVL increases and the layout pitch of the word line driver WDDV1 and the wiring pitch of the word lines WL1 and WL2 can not be matched, such a layout as shown in FIG. 7F is devised. Specifically, the row decoder RDEC and the word line driver WDDV1 are disposed on either side of the memory cell array MCA, and, for example, the word lines WL1 and WL2 at odd number positions are decoded and driven by the row decoder RDEC and the word line driver WDDV1 on the left side of the memory cell array MCA and the word lines WL1 and WL2 at even number positions are decoded and driven by the row decoder RDEC and the word line driver WDDV1 on the right side of the memory cell array MCA.

Figure 7G:
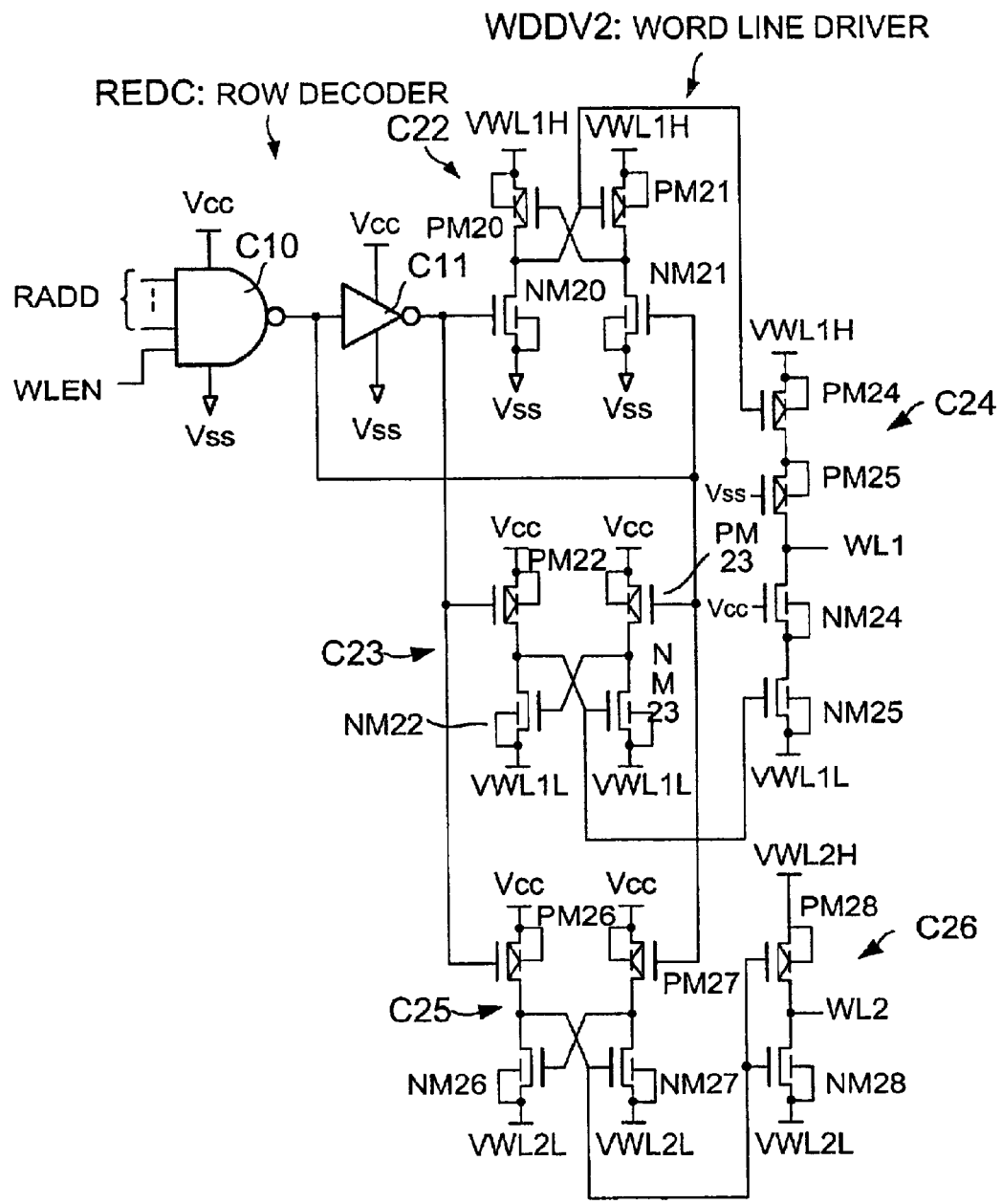
FIG. 7G is a diagram showing an example of the circuit configuration of a word line driver and a row decoder to generate waveforms of the write operation in FIG. 7A.

Next, the circuit configuration of a row decoder and a word line driver corresponding to FIG. 7A will be explained. FIG. 7G is a diagram showing an example of the row decoder and an example of a word line driver WDDV2 to generate the voltage waveforms of the word lines WL1 and WL2 shown in FIG. 7A.

As shown in FIG. 7G, the row decoder RDEC is composed of the NAND circuit C10, and the word line driver WDDV2 is composed of the inverter circuit C11, a level shift circuit C22, a level shift circuit C23, and an output buffer circuit C24, a level shift circuit C25, and an output buffer circuit C26. The relation of voltage level here is VWL1H>VSS>VWL2H>VWL1L>VWL2L in accordance with the example in FIG. 7A.

Only points different from FIG. 7C will be explained. The level shift circuit C22 has basically the same configuration as the level shift circuit C12 in FIG. 7C and includes p-type MOS transistors PM20 and PM21 and n-type MOS transistors NM20 and NM21. However, source terminals of the p-type MOS transistors PM20 and PM21 are connected to supply lines of the potential VWL1H.

The level shift circuit 23 has basically the same configuration as the level shift circuit C13 in FIG. 7C and includes p-type MOS transistors PM22 and PM23 and n-type MOS transistors NM22 and NM23. However, source terminals of the n-type MOS transistors NM22 and NM23 are connected to supply lines of the potential VWL1L.

The output buffer circuit C24 has basically the same configuration as the buffer circuit C14 in FIG. 7C and includes p-type MOS transistors PM24 and PM25 and n-type MOS transistors NM24 and NM25 which are connected in series. However, a source terminal of the p-type MOS transistor PM24 is connected to a supply line of the potential VWL1H, and a source terminal of the n-type MOS transistor NM25 is connected to a supply line of the potential VWL1L.

In addition to this, the word line driver WDDV2 in FIG. 7G includes the level shift circuit C25 and the output buffer circuit C26. The level shift circuit C25 has the same configuration as the level shift circuit C23 and includes p-type MOS transistors PM26 and PM27 and n-type MOS transistors NM26 and NM27. However, source terminals of the n-type MOS transistors NM26 and NM27 are connected to supply lines of the potential VWL2L.

The output buffer circuit C26 has the same configuration as the output buffer circuit C24, but comprises two MOS transistors of a p-type MOS transistor PM28 and an n-type MOS transistor NM28. A source terminal of the p-type MOS transistor PM28 is connected to a supply line of the potential VWH2H, and a source terminal of the n-type MOS transistor NM28 is connected to a supply line of the potential VWL2L.

The reason why no normally-on MOS transistor is inserted is that since the differential voltage between the potential VWL2H and the potential VWL2L is not so large as can be seen from FIG. 7A, any problem does not arise even if this differential voltage is directly applied to the MOS transistors PM28 and NM28.

As can be seen from this configuration, an output from the output buffer circuit C24 varies between the potential VWL1H and the potential VWL1L, whereby the first word line WL1 is driven. An output from the output buffer circuit C26 varies in synchronization with the output from the output buffer circuit C24, whereby the second word line WL2 is driven. Incidentally, back gate connection is performed in each MOS transistor in FIG. 7G, but this is not always necessary.

Figure 7H:
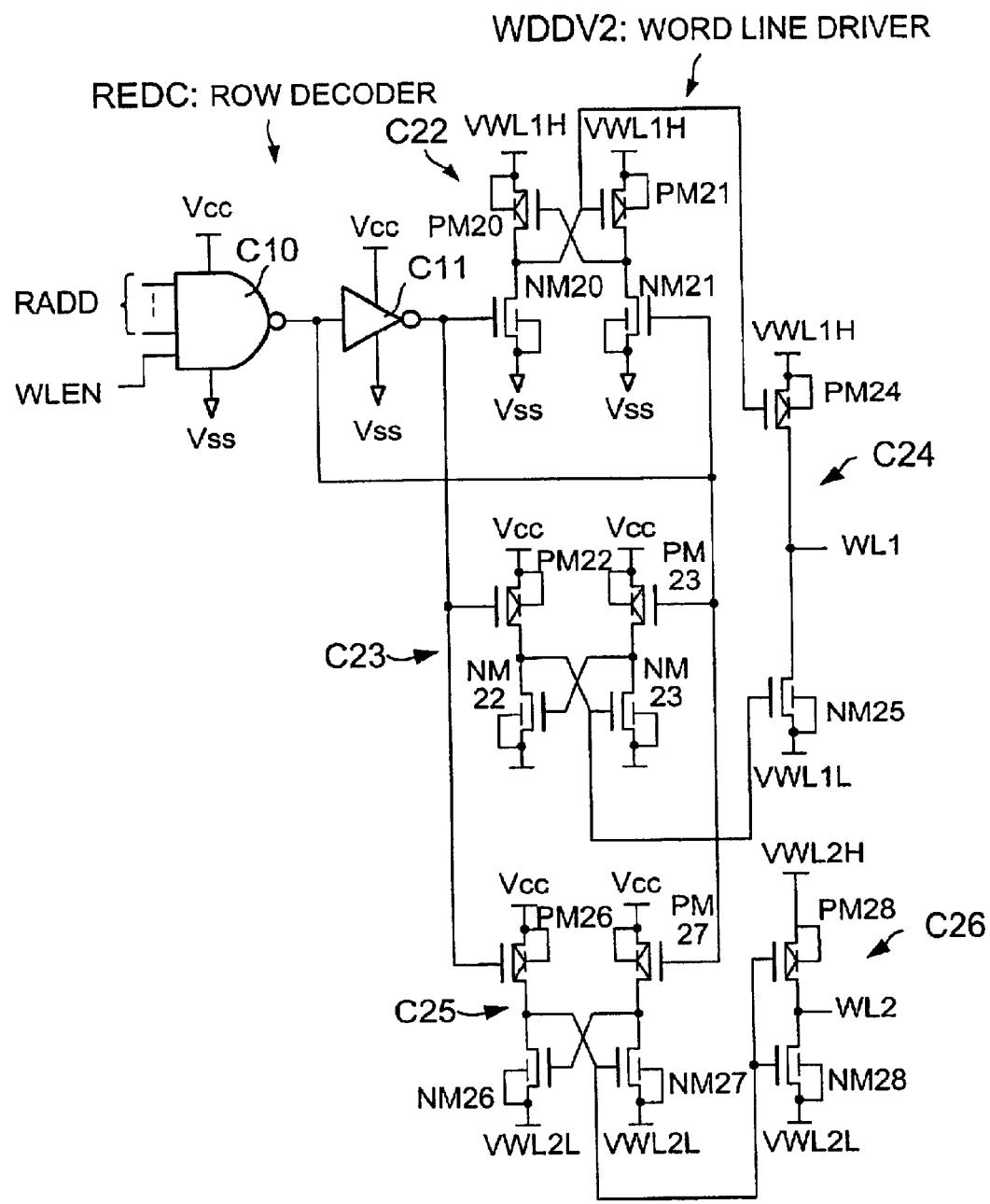
FIG. 7H is a diagram showing a modified example of the word line driver shown in FIG. 7G.

Likewise with the word line driver WDDV1 shown in FIG. 7D, it is possible to omit the P-type MOS transistor PM25 and the n-type MOS transistor NM24 also in the word line driver WDDV2 as shown in FIG. 7H.

FIG. 7I is a layout diagram in which the row decoder RDEC and the word line driver WDDV1 shown in FIG. 7G or FIG. 7H are arranged in relation to the memory cell array MCA. In the word line driver WDDV2 shown in FIG. 7G and FIG. 7H, since the first word line WL1 and the second word line WL2 are driven synchronously at different potentials, its layout area is larger than that of the word line driver WDDV1 shown in FIG. 7C and FIG. 7D. Accordingly, it is difficult to match a layout pitch of the word line driver WDDV2 with a wiring pitch of the word lines WL1 and WL2. For this reason, in a layout shown in FIG.

7I, the row decoder RDEC and the word line driver WDDV2 are disposed on either side of the memory cell array MCA. Namely, the word lines WL1 and WL2 at odd number positions are decoded and driven by the row decoder RDEC and the word line driver WDDV2 on the left side of the memory cell array MCA and the word lines WL1 and WL2 at even number positions are decoded and driven by the row decoder RDEC and the word line driver WDDV2 on the right side of the memory cell array MCA.

Figure 7J:
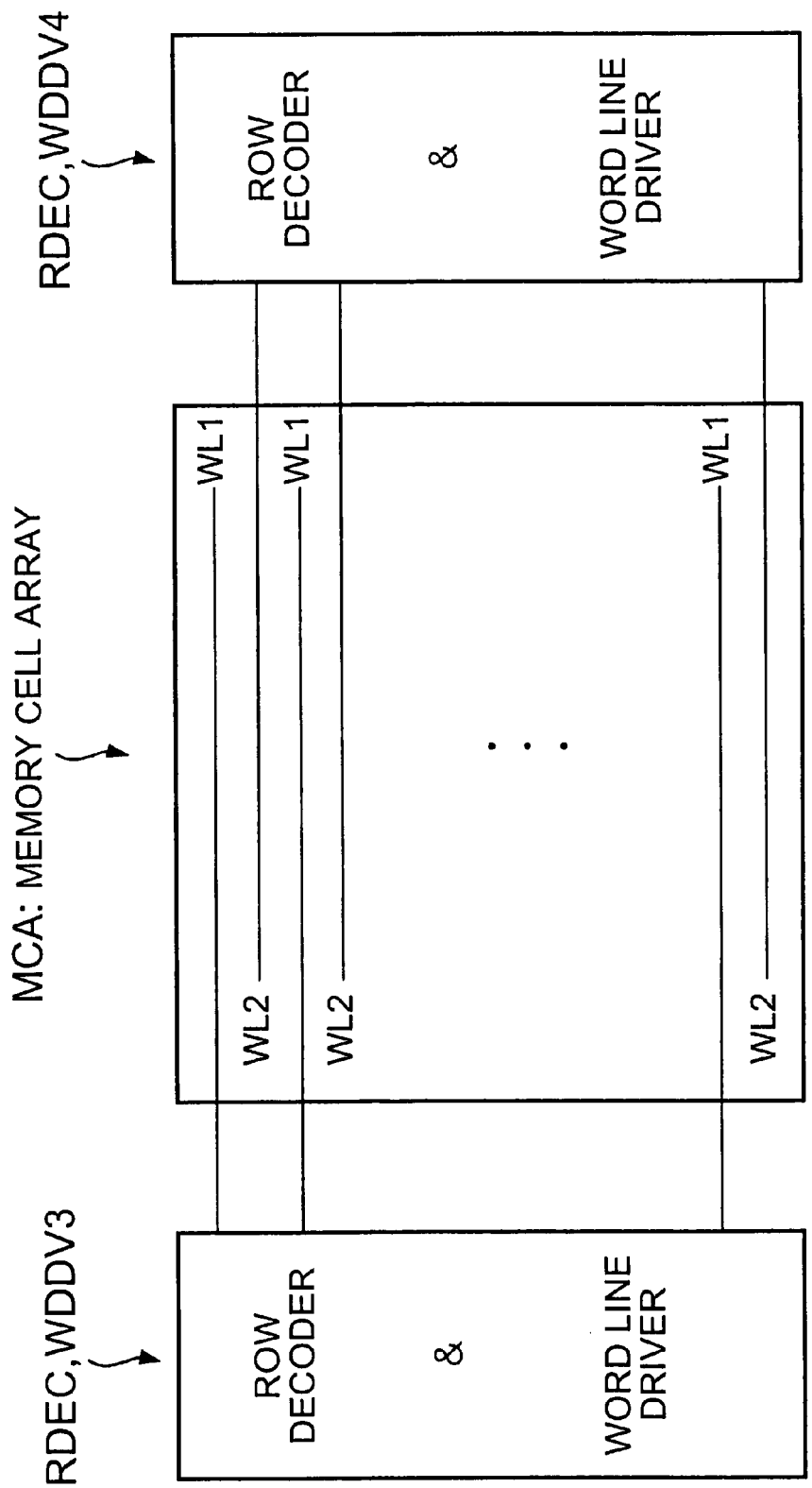
FIG. 7J is a diagram showing an example of the layout when the row decoder and the word line driver shown in FIG. 7G or FIG. 7H are disposed in relation to the memory cell array (when the row decoder and the word line driver for the first word lines are disposed on one side and the row decoder and the word line driver for the second word lines are disposed on the other side)

Moreover, as shown in FIG. 7J, for example, it is suitable to dispose a word line driver WDDV3 for the first word lines WL1 on the left side of the memory cell array MCA and dispose a word line driver WDDV4 for the second word lines WL2 on the right side of the memory cell array MCA. This disposition can facilitate power supply wiring. Namely, it is suitable to situate potential supply lines of the potential VWL1H and the potential VWL1L only on the left side of the memory cell array MCA where the word line driver WDDV3 for the first word lines WL1 is provided and situate potential supply lines of the potential VWL2H and the potential VWL2L only on the right side of the memory cell array MCA where the word line driver WDDV4 for the second word lines WL2 is provided.

In this layout, however, individual row decoders RDEC are needed for both the word line driver WDDV3 and the word line driver WDDV4. An example of such a word line driver WDDV3 is shown in FIG. 7K, and an example of such a word line driver WDDV4 is shown in FIG. 7L.

Figure 7K:
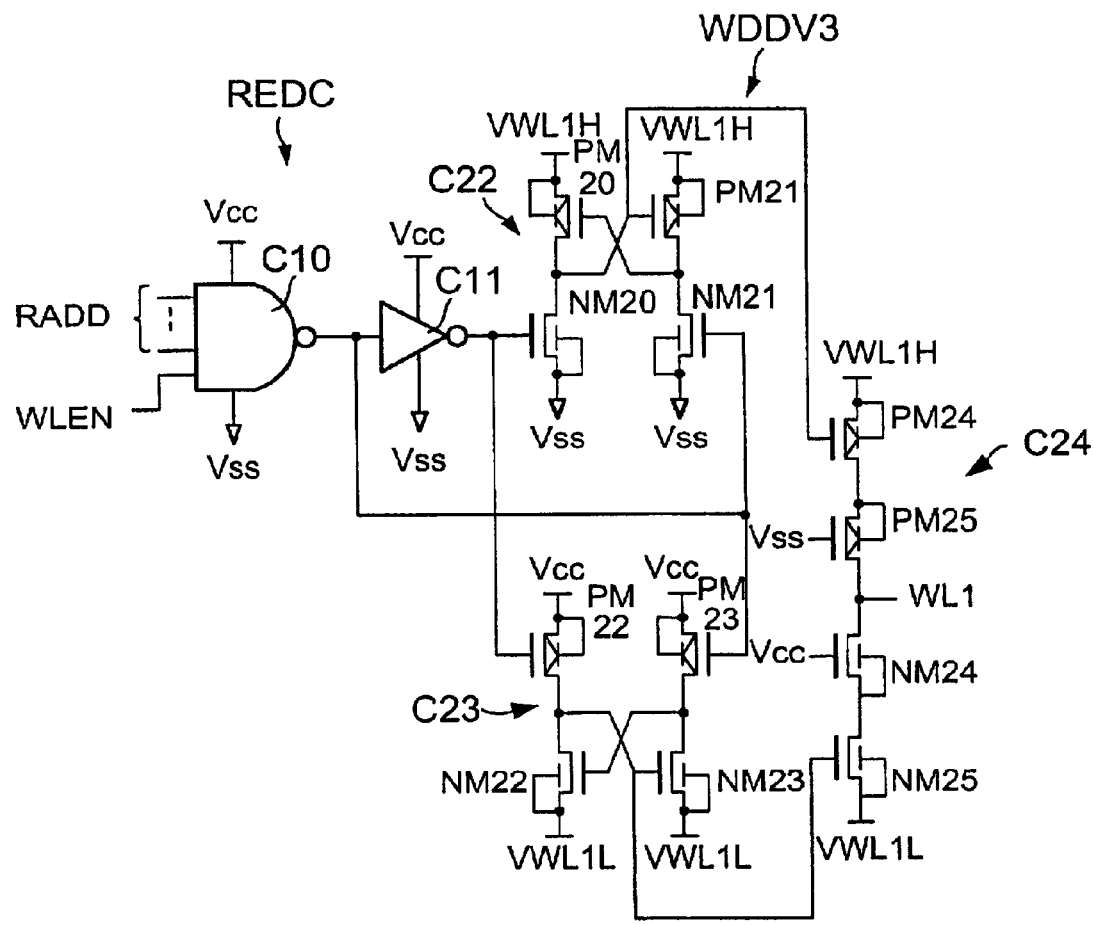
FIG. 7K is a diagram showing an example of the circuit configuration of the row decoder and the word line driver for the first word lines when the layout shown in FIG. 7J is adopted.

As shown in FIG. 7K, the word line driver WDDV3 for the first word lines WL1 comprises the level shift circuit C22 connected to the row decoder RDEC via the inverter circuit C11, the level shift circuit C23 directly connected to the row decoder RDEC, and the output buffer circuit C24. Their configurations are the same as those in the aforementioned word line driver WDDV2 in FIG. 7G.

Figure 7L:
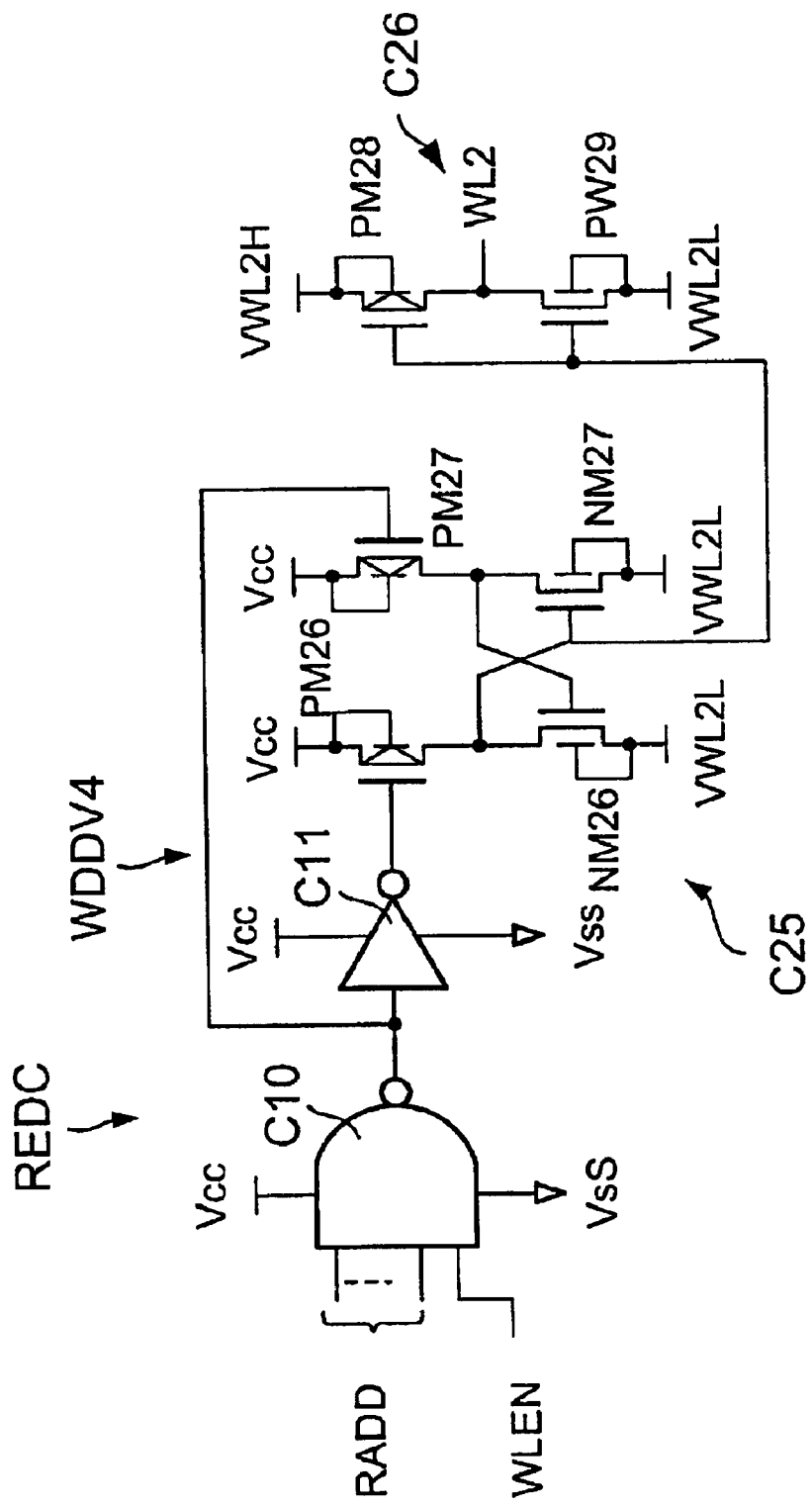
FIG. 7L is a diagram showing an example of the circuit configuration of the row decoder and the word line driver for the second word lines when the layout shown in FIG. 7J is adopted.

Meanwhile, as shown in FIG. 7L, the word line driver WDDV4 for the second word lines WL1 comprises the row decoder RDEC, the inverter circuit C11, the level shift circuit C25, and the output buffer circuit C26. The configurations of the level shift circuit C25 and the output buffer circuit C26 are the same as those in the aforementioned word line driver WDDV2 in FIG. 7G. However, since the word line driver WDDV4 is disposed on the right side of the memory cell array MCA, the row decoder RDEC can not be shared with the word line driver WDDV3, and hence the row decoder RDEC and the inverter circuit C11 are additionally provided for the word line driver WDDV4.

The row address signals RADD and WLEN are inputted synchronously to the row decoder RDEC of the word line driver WDDV3 and the row decoder RDEC of WDD4, and as a result word line driving potentials synchronized at different voltage amplitudes are outputted.

Figure 7M:
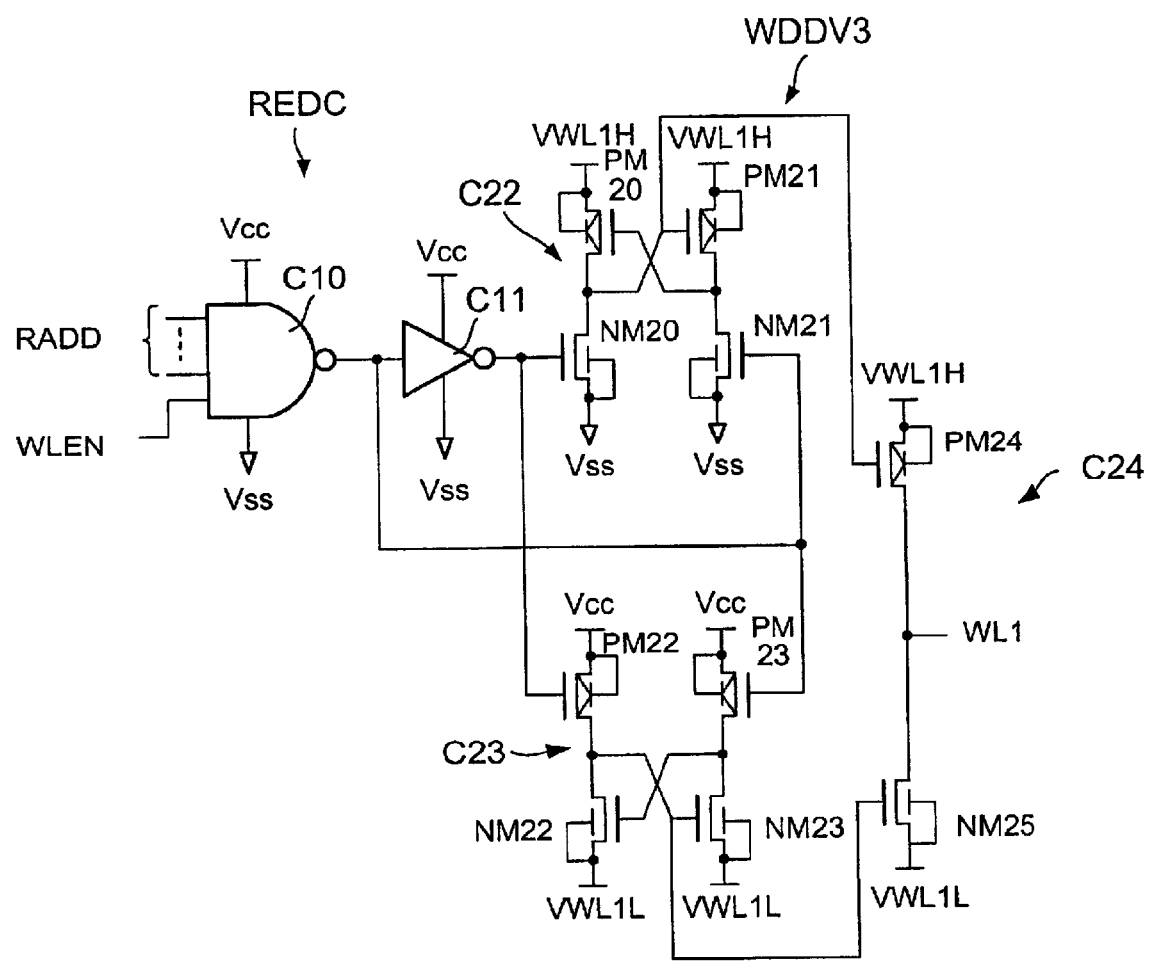
FIG. 7M is a diagram showing a modified example of the word line driver shown in FIG. 7K.

Incidentally, in FIG. 7K and FIG. 7L, back gate connection is performed in each MOS transistor, but this is not always necessary. Moreover, in the word line driver WDDV3 shown in FIG. 7K, the p-type MOS transistor PM25 and the n-type MOS transistor NM24 can be omitted as shown in FIG. 7M.

Figure 7N:
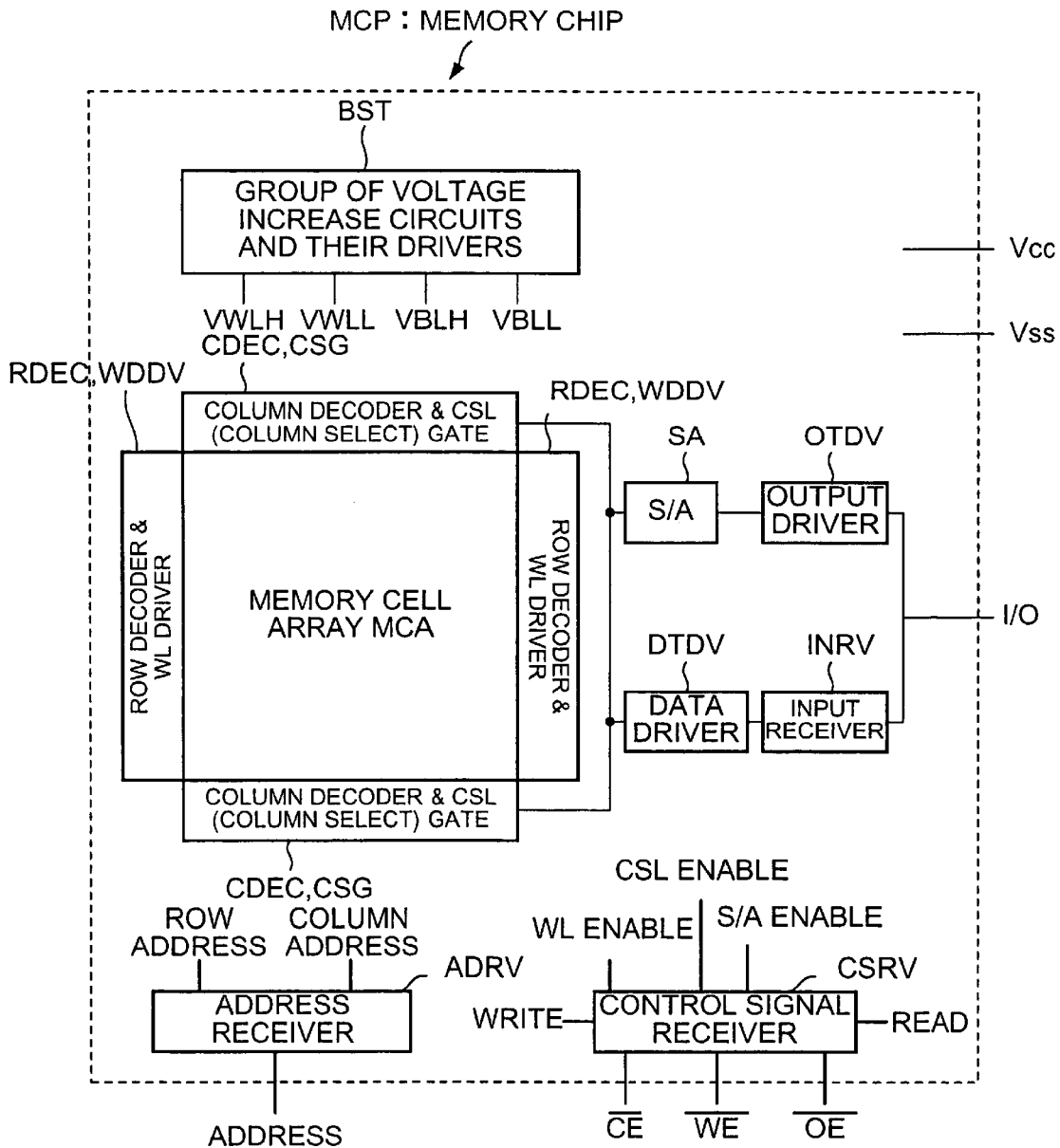
FIG. 7N is a diagram showing an example of a layout of a memory chip in which a memory cell array composed of memory cells in the respective embodiments and its row decoders and word line drivers are disposed.

FIG. 7N is a diagram showing an example of the entire layout of a memory chip MCP having the aforementioned memory cell array MCA, row decoder RDEC, and word line driver WDDV. As shown in FIG. 7N, VSS being a supply voltage on the low voltage side and VCC being a supply voltage on the high voltage side are inputted. These potentials VSS and VCC are supplied to a circuit BST composed of a group of voltage increase circuits and their drivers, and various voltages necessary for this memory chip MCP are generated. An example in which four kinds of potentials VWLH, VWLL, VBLH, and VBLL corresponding to voltage wave forms in FIG. 7B are generated is shown here. When the memory cell array MCA using voltage waveforms in FIG. 7A is used, six kinds of potentials VWL1H, VWL1L, VWL2H, VWL2L, VBLH, and VBLL are generated. The various potentials generated by this circuit BST are supplied to necessary circuits via potential supply lines. Especially, the four kinds of potentials shown in this diagram are supplied to the row decoder RDEC and the word line driver WDDV as described above.

Moreover, an address to specify a memory cell which performs a data write operation and a data read operation for the memory chip MCP is inputted to the memory chip MCP. This address is inputted to an address receiver ADRV and separated into a row address signal and a column address signal. The row address signal is supplied to the row address decoder RDEC and the column address signal is supplied to a column address decoder CDEC.

Data is inputted/outputted from a data I/O terminal. More specifically, data to be written in the memory cell array MCA is inputted from the data I/O terminal and inputted to an input receiver INRV. Then, the data is supplied to a column select gate CSG via a data driver DTDV, and the data is written in the memory cell array MCA.

Meanwhile, a signal read from the memory cell array MCA is outputted from the column select gate CSG to a sense amplifier SA, and data is detected by the sense amplifier SA. The detected data is outputted from the data I/O terminal via an output driver OTDV.

This memory chip MCP includes a control signal receiver CSRV to which various kinds of control signals are inputted. Based on the control signals inputted from the outside of the memory chip MCP, the control signal receiver CSRV generates various control signals needed within the memory chip MCP and outputs them.

Incidentally, although the layout in which the row decoder RDEC and the word line driver WDDV are provided on either side of the memory cell array MCA is illustrated in the memory chip MCP in FIG. 7N, the row decoder RDEC and the word line driver WDDV are sometimes provided only one side of the memory cell array MCA as described above.

It should be noted that the hitherto explained configurations of the word line drivers WDDV1, WDDV2, WDDV3, and WDDV4 and configuration of the memory chip MCP can be applied to embodiments explained below.

Second Embodiment

Figure 8:
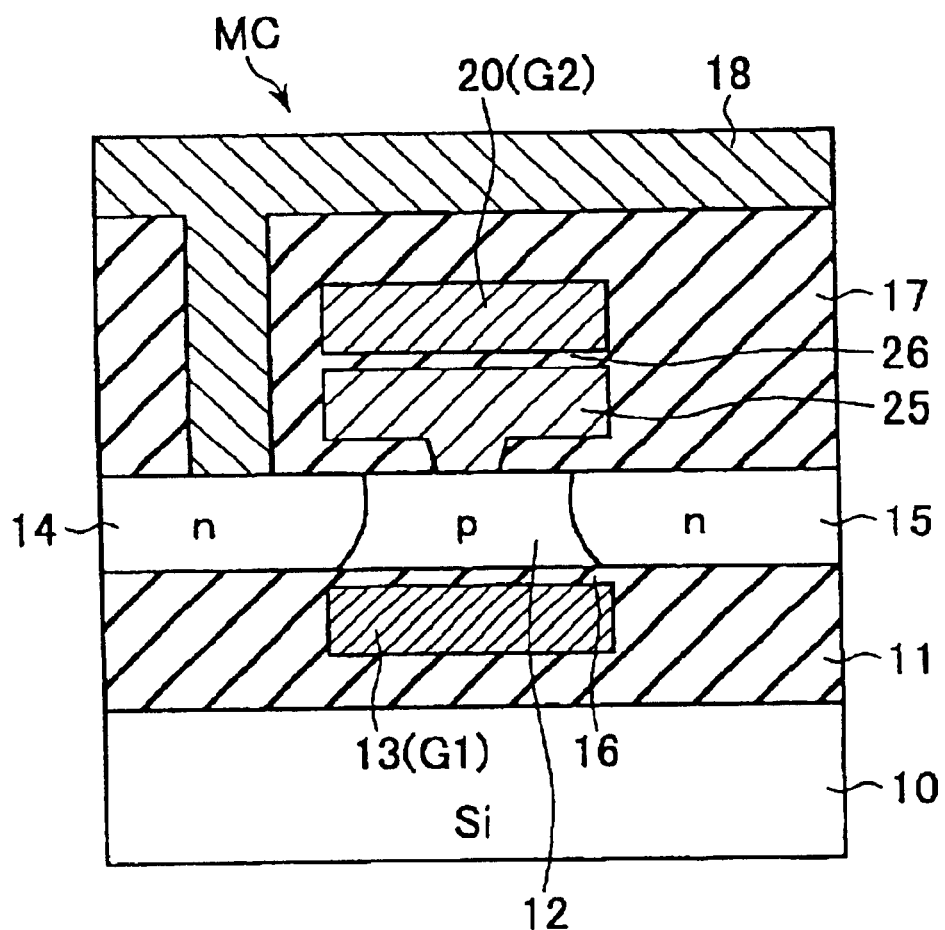
FIG. 8 is a diagram showing the sectional structure of a DRAM cell according to a second embodiment of the present invention.

FIG. 8 shows the structure of a DRAM cell according to a second embodiment corresponding to FIG. 3. In this embodiment, the first gate (G1) 13 is buried in the buried oxide film 11 under the silicon layer 12. The second gate (G2) 20 is disposed above the silicon layer 12, but does not directly face the silicon layer 12. Namely, a relay electrode 25 connected to the silicon layer 12 is provided between the silicon layer 12 and the second gate 20. The second gate 20 faces the relay electrode 25 with an insulating film 26 therebetween, thereby composing a capacitor.

Also in this embodiment, the second gate 20 performs potential control by capacitive coupling for the silicon layer 12 similarly to the preceding embodiment. The first gate 13 and the second gate 20 of the memory cell MC are respectively connected to the first and second word lines WL1 and WL2, and the drain region 14 is connected to the bit line BL. Thus, a memory cell array such as shown in FIG. 4 is structured.

Also in this embodiment, the same effect as that of the preceding embodiment can be obtained. The first gate 20 composes the capacitor with the relay electrode 25 without directly facing the channel body, and hence by making the area of the relay electrode 25 larger than the actual area of the channel body region, larger capacitive coupling can be given.

Third Embodiment

Figure 9:
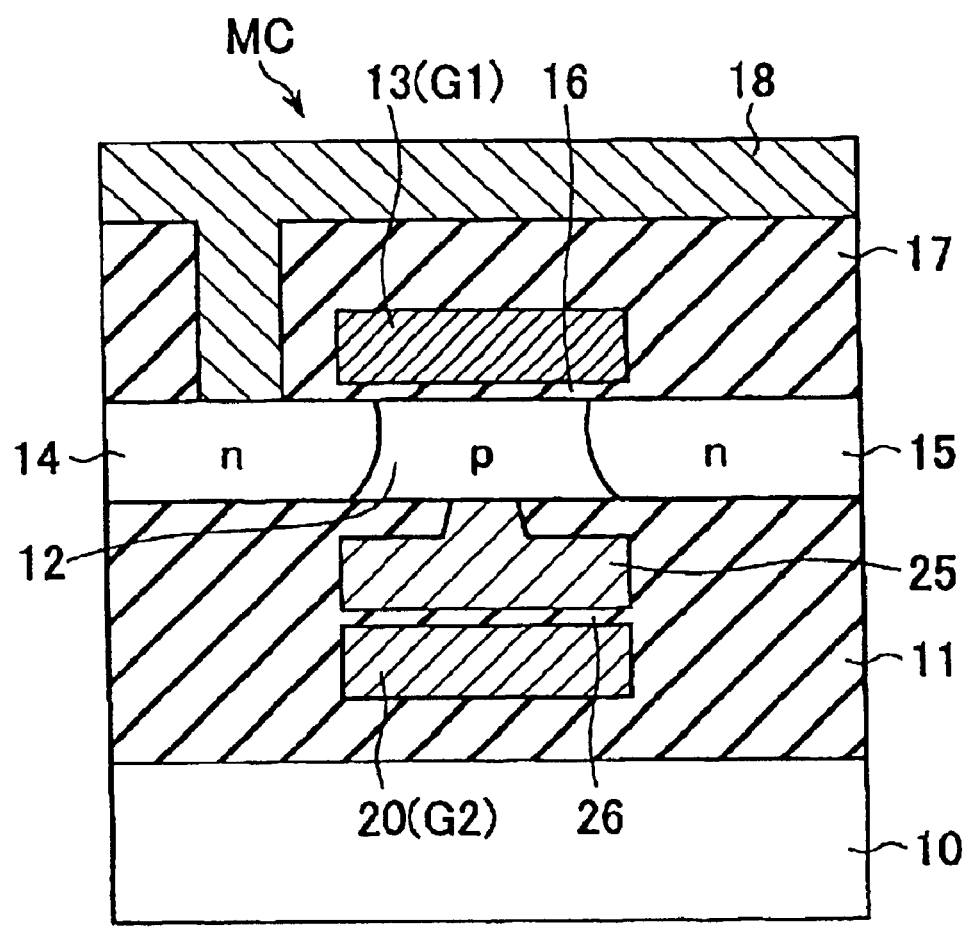
FIG. 9 is a diagram showing the sectional structure of a DRAM cell according to a third embodiment of the present invention.

FIG. 9 shows the structure of a DRAM cell according to a third embodiment corresponding to FIG. 3. In this embodiment, the first gate 13 is formed to face the upper face of the silicon layer 12 likewise with FIG. 3, and the second gate 20 is buried in the oxide film 11 under the silicon layer 12 to form the same capacitor structure as in FIG. 8.

Also in this embodiment, the same effect as that of the preceding embodiment can be obtained. Moreover, by the same reason as in the second embodiment, capacitive coupling of the second gate 20 to the channel body can be increased.

Fourth Embodiment

Figure 10A:
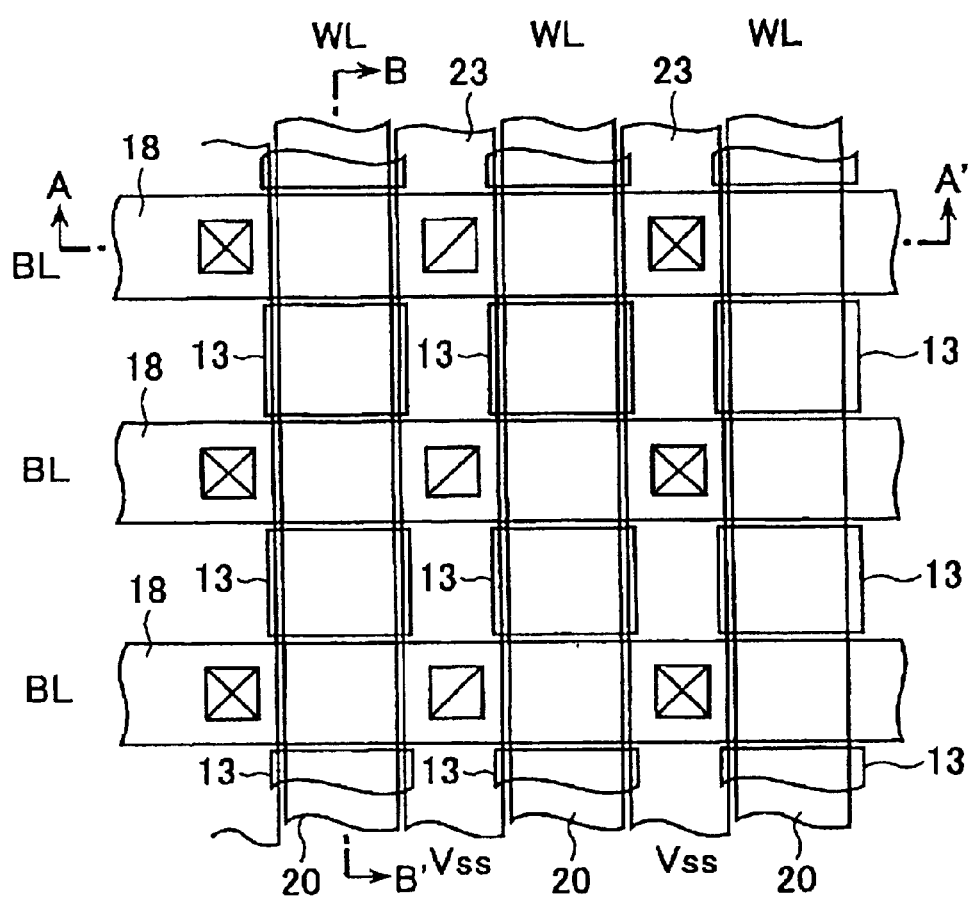
FIG. 10A is a diagram showing the layout of a DRAM cell array according to a fourth embodiment.
Figure 10B:
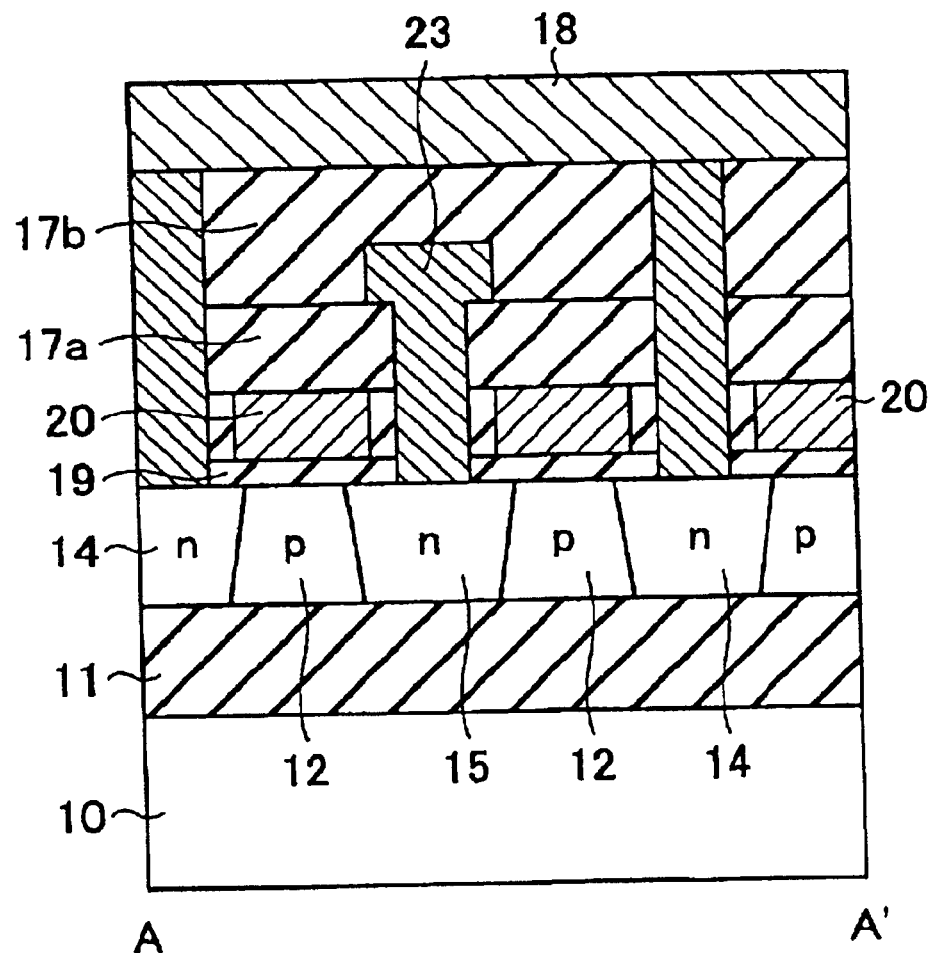
FIG. 10B is a sectional view taken along the line A–A' in FIG. 10A.
Figure 10C:
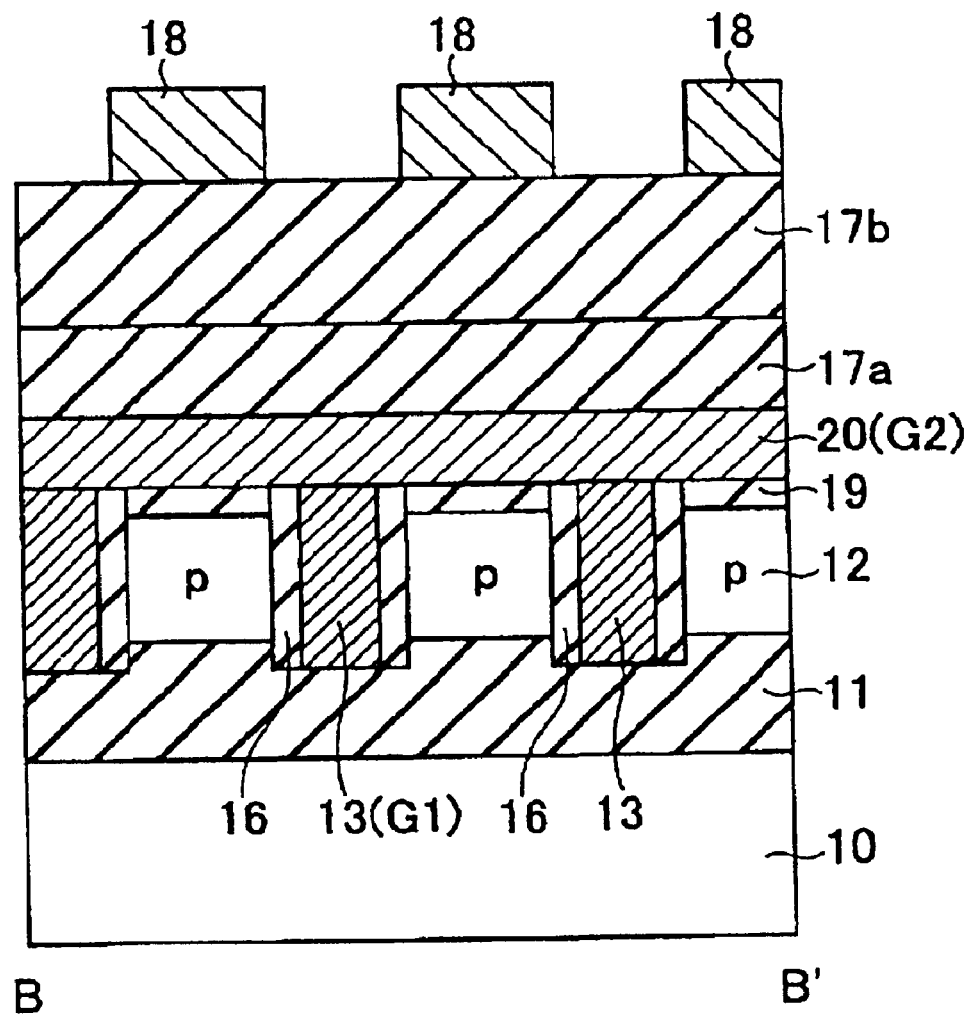
FIG. 10C is a sectional view taken along the line B–B' in FIG. 10A.

FIG. 10A shows the layout of a DRAM cell array according to a fourth embodiment, FIG. 10B shows its section taken along the line A–A' and FIG. 10C shows its section taken along the line B–B'.

In this embodiment, the second gate (G2) 20 is formed to face the upper face of the silicon layer 12 as shown in FIG. 10B, and the first gate (G1) 13 is formed to face both side faces of the silicon layer 12 as shown in FIG. 10A and FIG. 10C. Namely, an MIS transistor with the side face of the silicon layer 12 as a channel is formed. As can be seen from this, in this embodiment, channels are formed on both side faces of the silicon layer. As shown in FIG. 10A, the first gates 13 are disposed in respective memory cells MC discontinuously in the direction of the bit line BL. The second gates 20 connect these first gates 13 jointly to be formed continuously as the word lines WL. Accordingly, the first and second gates 13 and 20 are controlled at the same potential.

An interlayer dielectric film 17 has a two-layer structure of a first layer 17a and a second layer 17b, a fixed potential line 23 which connects the sources 15 jointly is disposed on the first layer 17a, and the bit lines 18 is disposed on the second layer 17b.

In this embodiment, it is necessary to avoid a channel from being formed right under the second gate 20 at the same time when a channel is formed on the side face of the silicon layer by the first gate 13 and enable the potential control of a body right under the second gate 20 by the second gate 20. For this reason, materials with different work functions are used for the first gate 13 and the second gate 20. For example, when the memory cell MC is an n-channel MIS transistor as in this embodiment, n-type polysilicon is used for the first gate 13, and p-type polysilicon or a metal such as platinum having a work function larger than the n-type polysilicon is used for the second gate 20 so that a storage state can be maintained with the silicon layer 12 as a p-type body. A silicon nitride film, for example, is used for the gate insulating film (capacitor insulating film) 19 under the second gate 20.

When the memory cell has a p-channel, p-type polysilicon is used for the first gate 13, and a metal such as hafnium is used for the second gate 20.

Also by this embodiment, the same effect as that of the preceding embodiment can be obtained.

Fifth Embodiment

Figure 11:
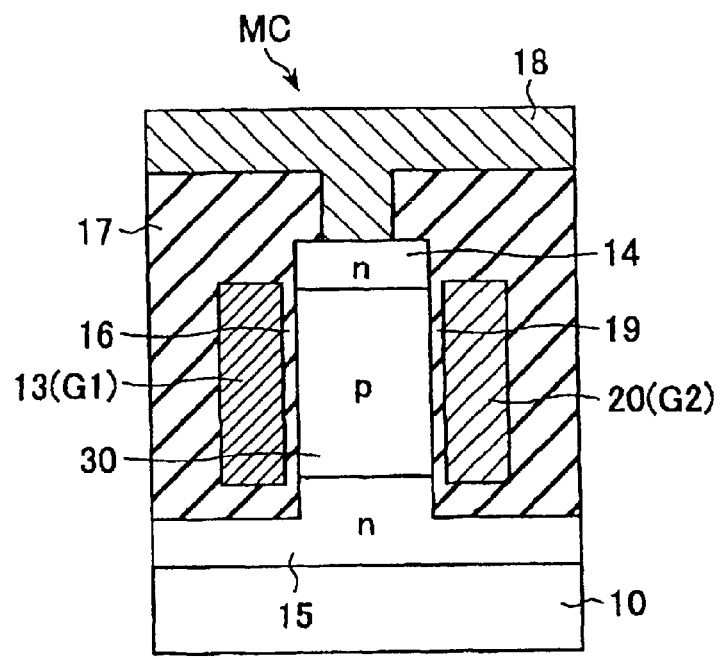
FIG. 11 is a diagram showing the sectional structure of a DRAM cell according to a fifth embodiment.

FIG. 11 shows the sectional structure of a DRAM cell according to a fifth embodiment. In this embodiment, a vertical MIS transistor is formed in a p-type pillar silicon portion 30 formed on the silicon substrate 10 instead of the SOI substrate. Specifically, the n-type drain region 14 is formed on the top of the pillar silicon portion 30 and the n-type source region 15 is formed at the bottom thereof. Moreover, the first gate (G1) 13 and the second gate (G2) 20 are formed to face each other on both side faces of the pillar silicon portion 30. Hence, the memory cell MC is composed of the vertical MIS transistor with the pillar silicon portion 30 as a floating channel body, instead of the SOI substrate.

This vertical MIS transistor structure is known as an SGT (Surrounding Gate Transistor).

Also by this embodiment, the same effect as that of the preceding embodiment can be obtained.

Next, manufacturing processes corresponding to the aforementioned respective embodiments will be explained.

Manufacturing Process Corresponding to First Embodiment

Figure 12:
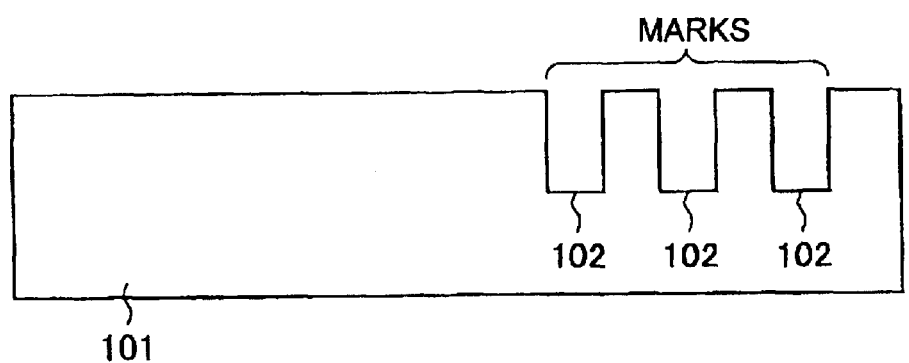
FIG. 12 is a diagram showing a mark forming step in a process of manufacturing the memory cell according to the first embodiment shown in FIG. 3.
Figure 13:
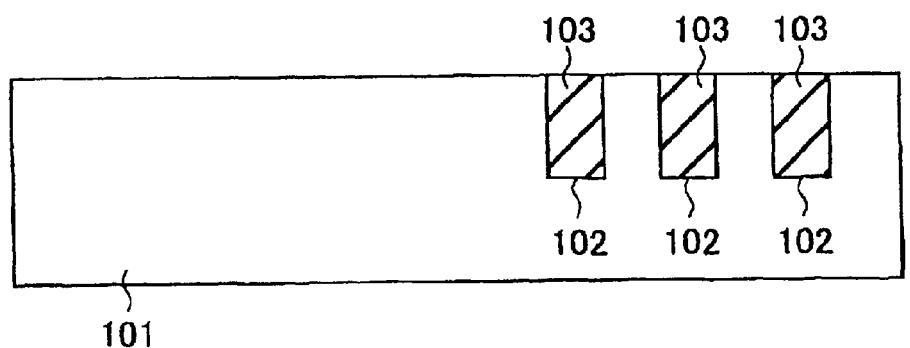
FIG. 13 is a diagram showing the mark forming step in the manufacturing process.

FIG. 12 to FIG. 18 show the process of manufacturing a DRAM cell corresponding to the first embodiment shown in FIG. 3. In this embodiment, two silicon substrates are used in order that two gates 13 and 20 are disposed above and below the silicon layer. As shown in FIG. 12, in a first silicon substrate 101, trenches 102 are worked each as an alignment mark at the outside of a cell array region. As shown in FIG. 13, an oxide film 103 is buried in each of the trenches 102. The depth of the trench 102 is more than the thickness of an SOI layer which is adjusted by shaving the silicon substrate 101 later. More specifically, as will be described later, since the silicon substrate 101 becomes the silicon layer 12 in FIG. 3, the trenches 102 are formed deeper than the thickness of the silicon layer 12.

Figure 14:
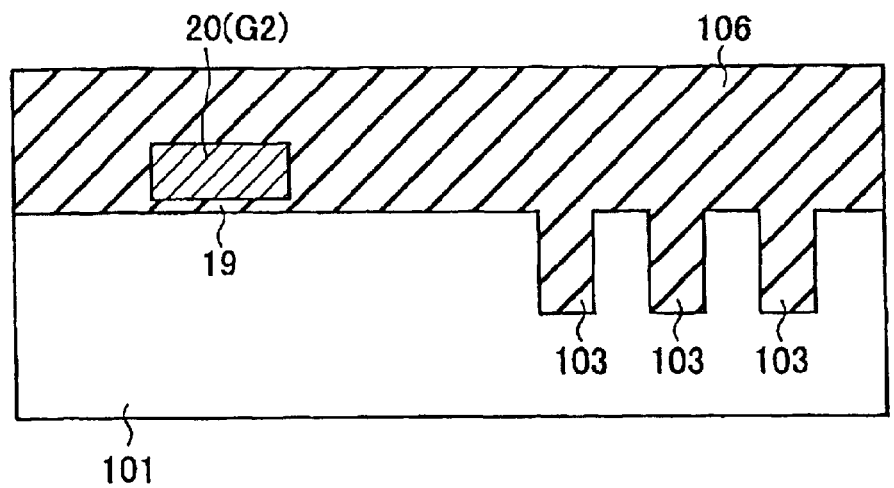
FIG. 14 is a diagram showing a gate (G2) forming step in the manufacturing process.
Figure 15:
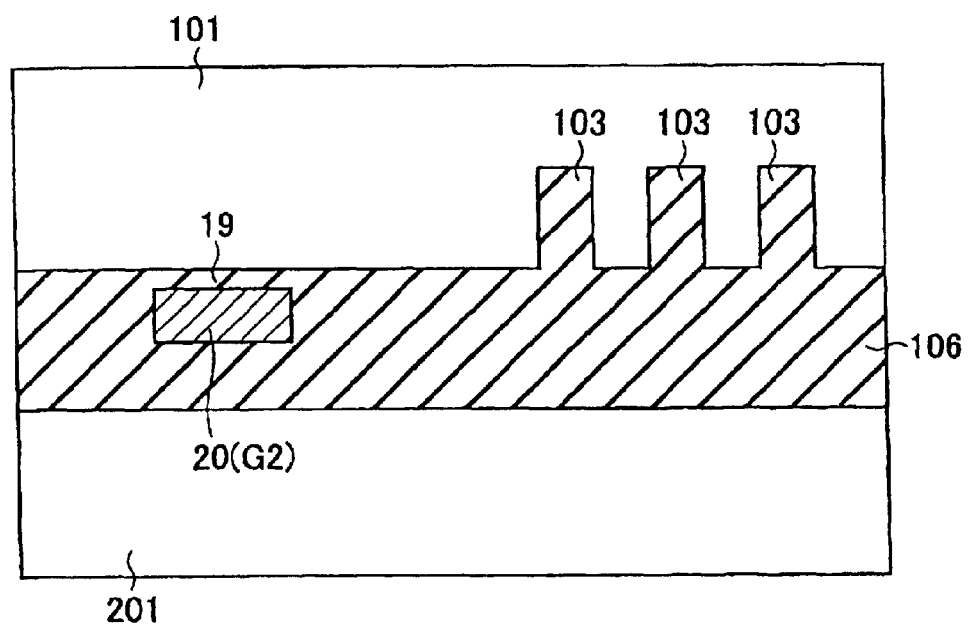
FIG. 15 is a diagram showing a substrate sticking step in the manufacturing process.

Thereafter, as shown in FIG. 14, the second gates 20 (G2) are pattern-formed on the silicon substrate 101 with the gate insulating film 19 therebetween so as to continue as the word line WL2. A face on which the second gates 20 are formed is covered with an insulating film such as a silicon oxide film 106 and then planarized. CMP (Chemical Mechanical Polishing) is used for planarization. Then, as shown in FIG. 15, a second silicon substrate 201 is stuck on the planarized face of the silicon oxide film 106.

Figure 16:
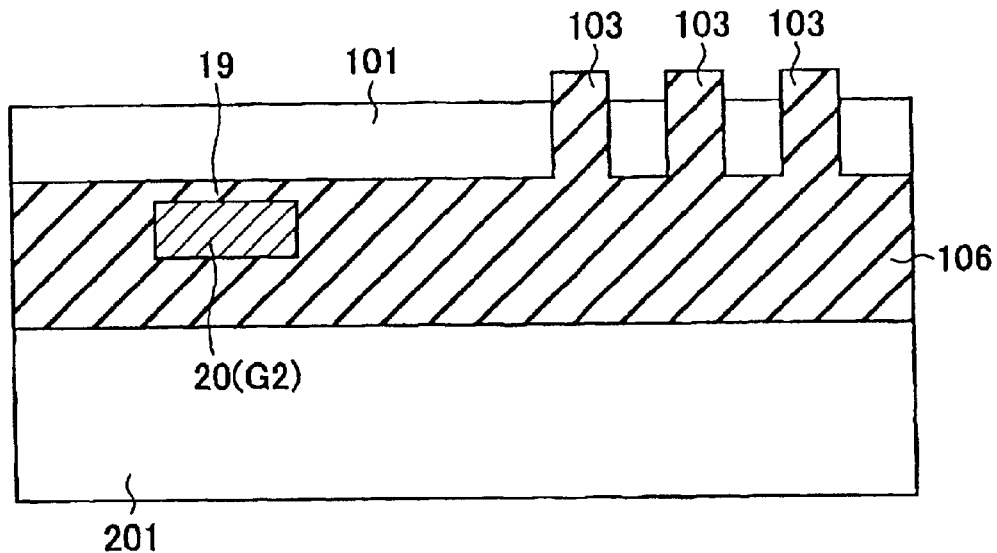
FIG. 16 is a diagram showing a substrate polishing step in the manufacturing process.

Thereafter, as shown in FIG. 16, the first silicon substrate 101 is polished until an intended thickness of the SOI layer is obtained. The silicon substrate 101 thus polished becomes the silicon layer 12 in FIG.3. On this occasion, the previously buried silicon oxide film 103 protrudes, so that it can be used as a mark for alignment with the already formed second gates 20 in the next step of forming the first gates 13.

Figure 17:
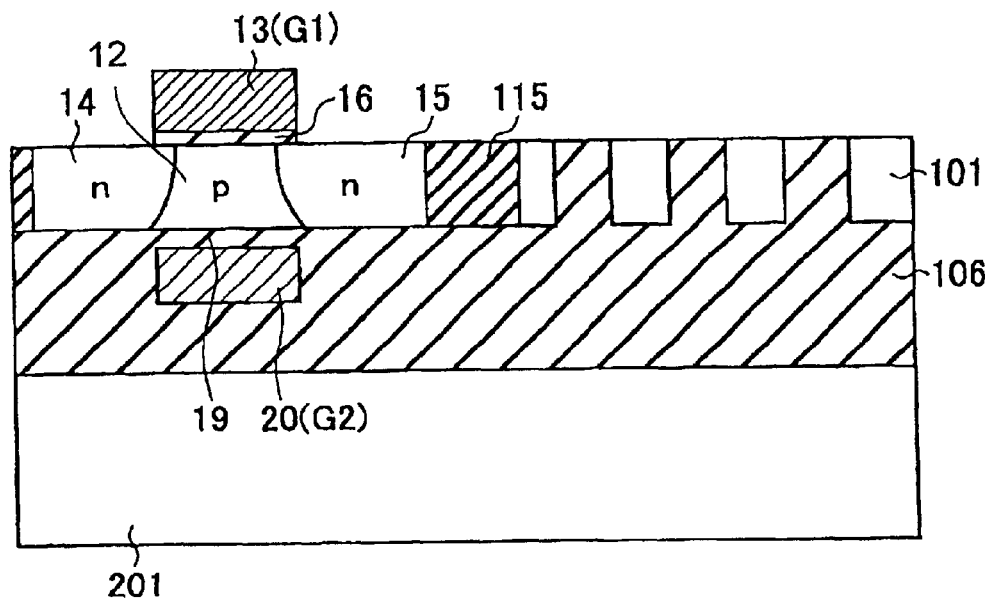
FIG. 17 is a diagram showing a gate (G1) forming step in the manufacturing process.
Figure 18:
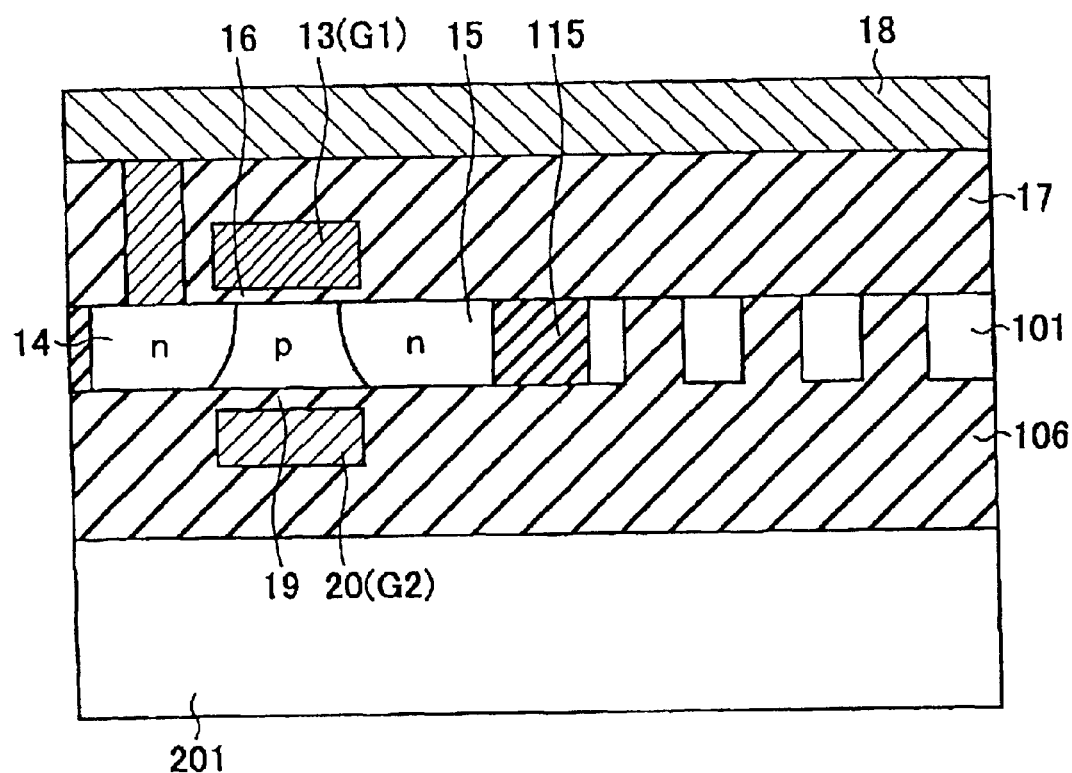
FIG. 18 is a diagram showing a bit line forming step in the manufacturing process.

Namely, as shown in FIG. 17, a device isolation oxide film 115 to perform device isolation in the crosswise direction is buried in the silicon substrate 101 by an STI method, and thereafter the first gates (G1) 13 are pattern-formed to continue as the word line WL1 with the gate insulating film 16 therebetween. The device isolation insulating film 115 is shown only in the bit line direction in this diagram, but the device isolation insulating films 115 are formed at predetermined intervals also in the word line direction so that the silicon layer 12 isolated from others is formed in each memory cell MC region. Further, ion implantation is performed to form the drain region 14 and the source region 15. Then, as shown in FIG. 18, the interlayer dielectric film 17 is formed, and the bit lines 18 are formed thereon.

Manufacturing Process Corresponding to Second Embodiment

Figure 19:
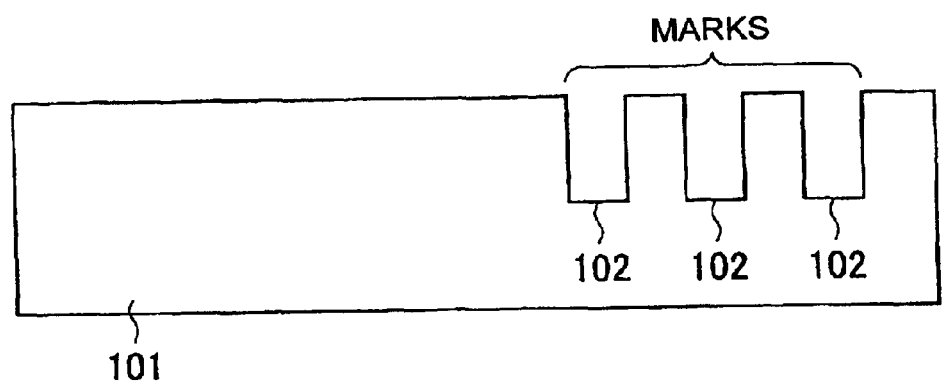
FIG. 19 is a diagram showing a mark forming step in a process of manufacturing the memory cell according to the second embodiment shown in FIG. 8.
Figure 20:
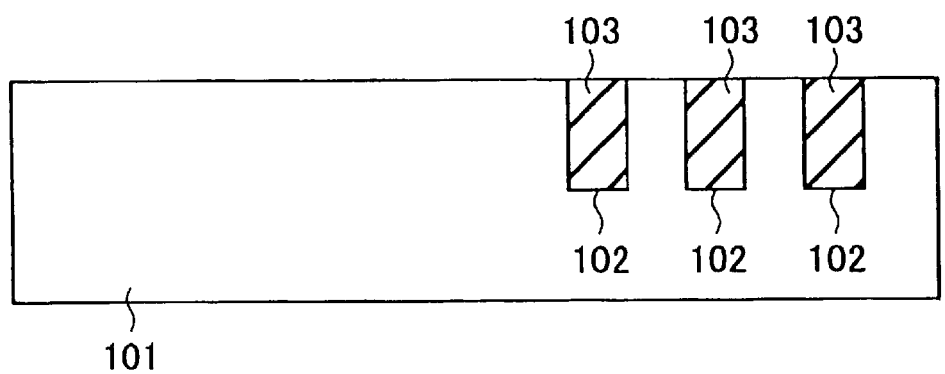
FIG. 20 is a diagram showing the mark forming step in the manufacturing process.

FIG. 19 to FIG. 26 show the process of manufacturing a DRAM cell corresponding to the second embodiment shown in FIG. 8. Also in this embodiment, two silicon substrates are used in order that two gates 13 and 20 are disposed above and below the silicon layer. As shown in FIG. 19, in the first silicon substrate 101, the trenches 102 are worked each as an alignment mark at the outside of a cell array region. As shown in FIG. 20, the oxide film 103 is buried in each of the trenches 102. The depth of the trench 102 is more than the thickness of an SOI layer which is adjusted by shaving the silicon substrate 101 later. More specifically, as will be described later, since the silicon substrate 101 becomes the silicon layer 12 in FIG. 8, the trenches 102 are formed deeper than the thickness of the silicon layer 12.

Figure 21:
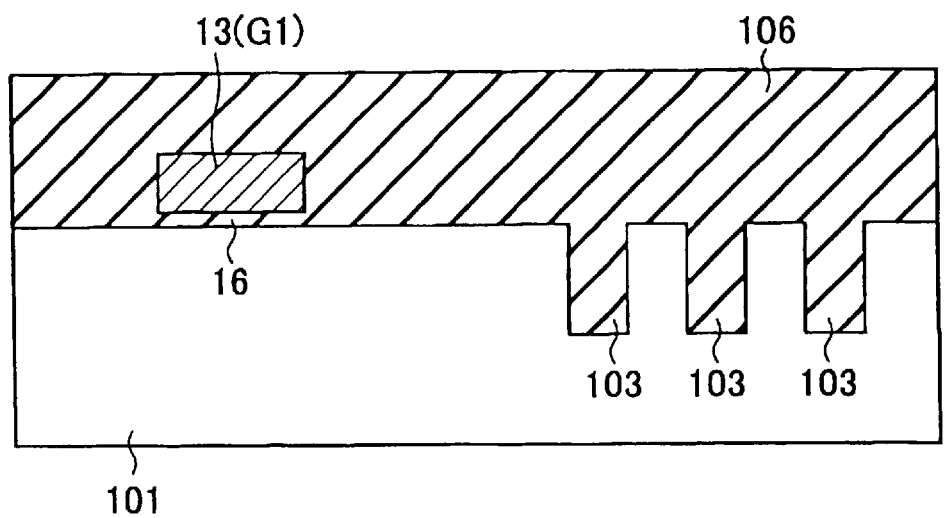
FIG. 21 is a diagram showing a gate (G1) forming step in the manufacturing process.
Figure 22:
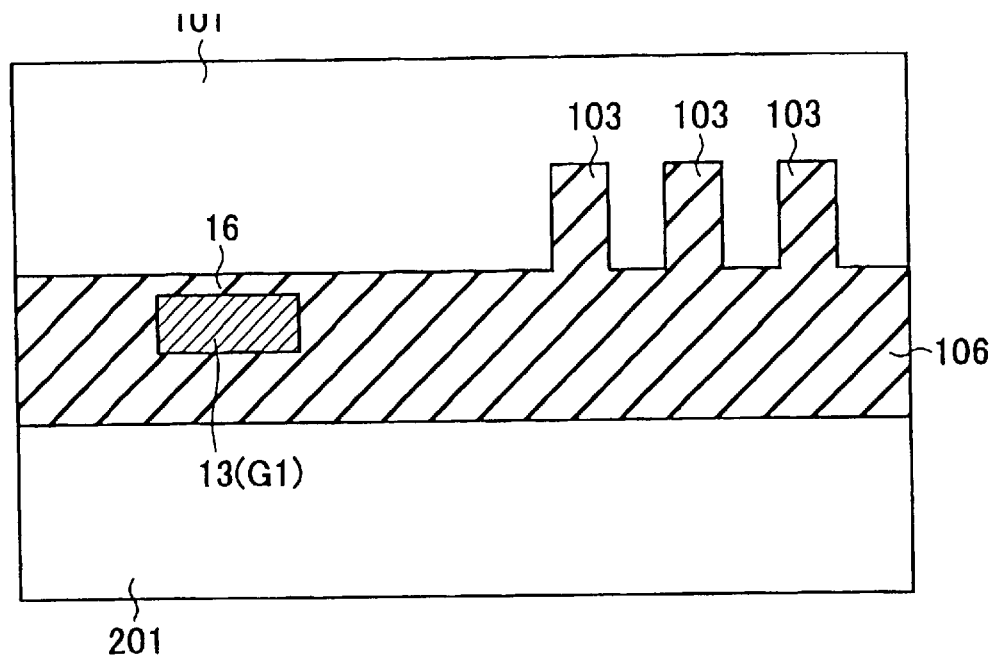
FIG. 22 is a diagram showing a substrate sticking step in the manufacturing process.

Thereafter, as shown in FIG. 21, the first gates 13 (G1) are pattern-formed on the silicon substrate 101 with the gate insulating film 16 therebetween so as to continue as the word line WL1. A face on which the first gates 13 are formed is covered with the insulating film such as the silicon oxide film 106 and then planarized. CMP (Chemical Mechanical Polishing) is used for planarization. Then, as shown in FIG. 22, the second silicon substrate 201 is stuck on the planarized face of the silicon oxide film 106.

Figure 23:
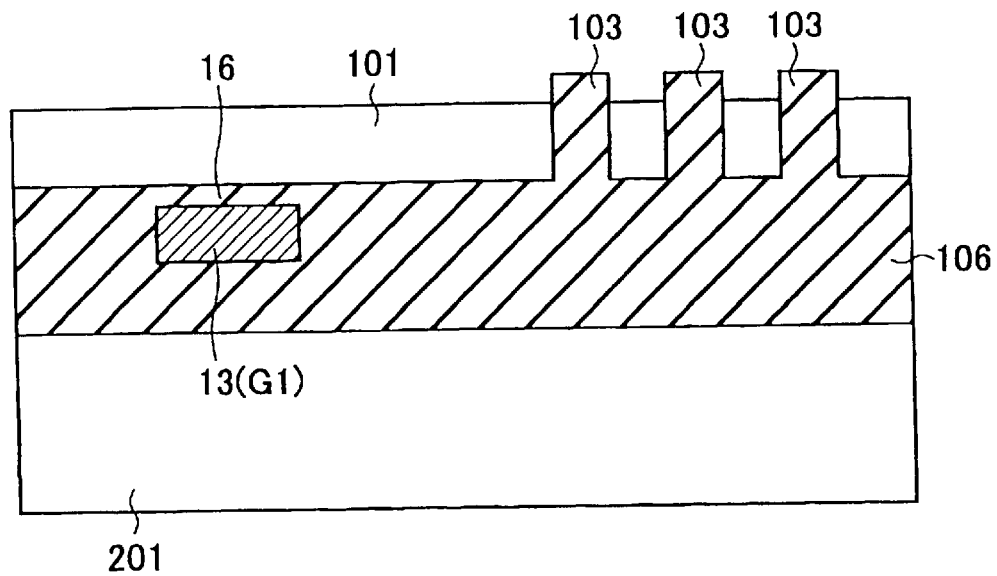
FIG. 23 is a diagram showing a substrate polishing step in the manufacturing process.

Thereafter, as shown in FIG. 23, the first silicon substrate 101 is polished until an intended thickness of the SOI layer is obtained. The silicon substrate 101 thus polished becomes the silicon layer 12 in FIG. 8. On this occasion, the previously buried silicon oxide film 103 protrudes, so that it can be used as a mark for alignment with the already formed first gates 13 in the next step of forming the second gates 20.

Figure 24:
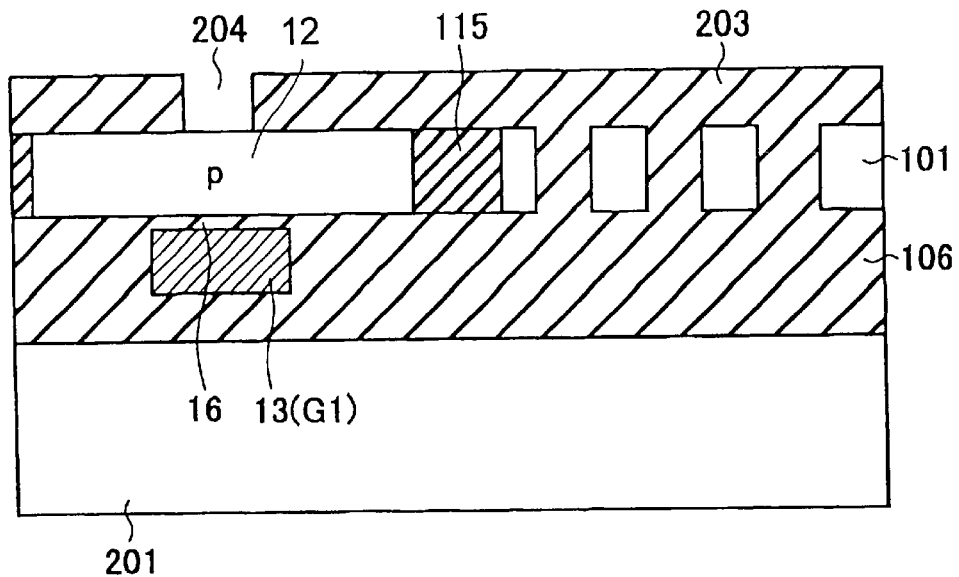
FIG. 24 is a diagram showing an insulating film forming step in the manufacturing process.
Figure 25:
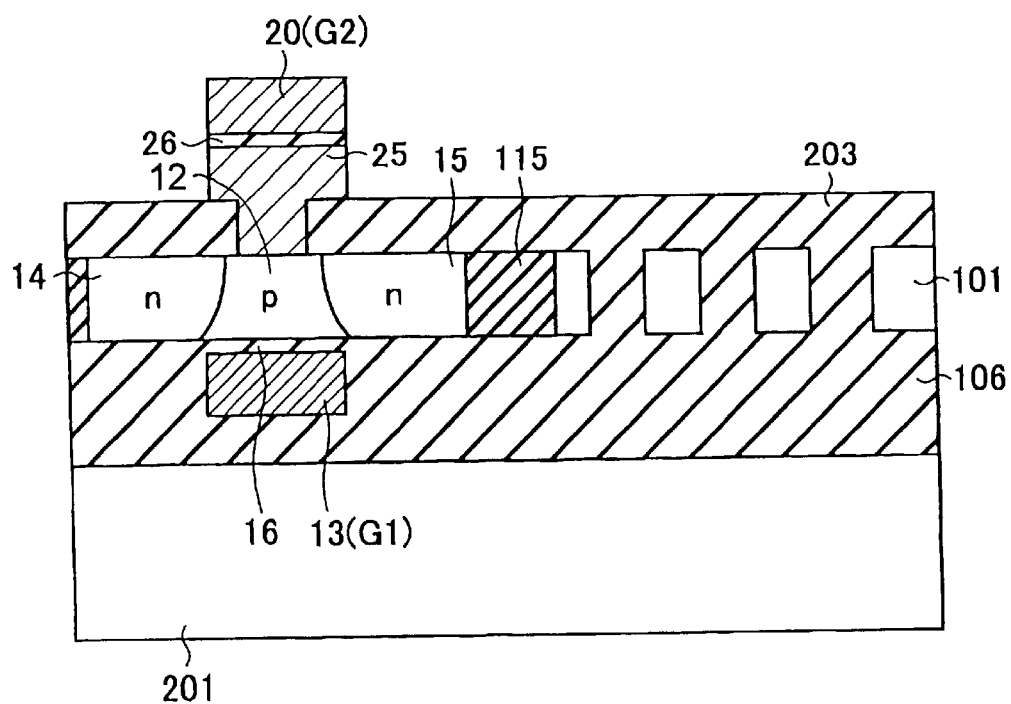
FIG. 25 is a diagram showing a gate (G2) forming step in the manufacturing process.
Figure 26:
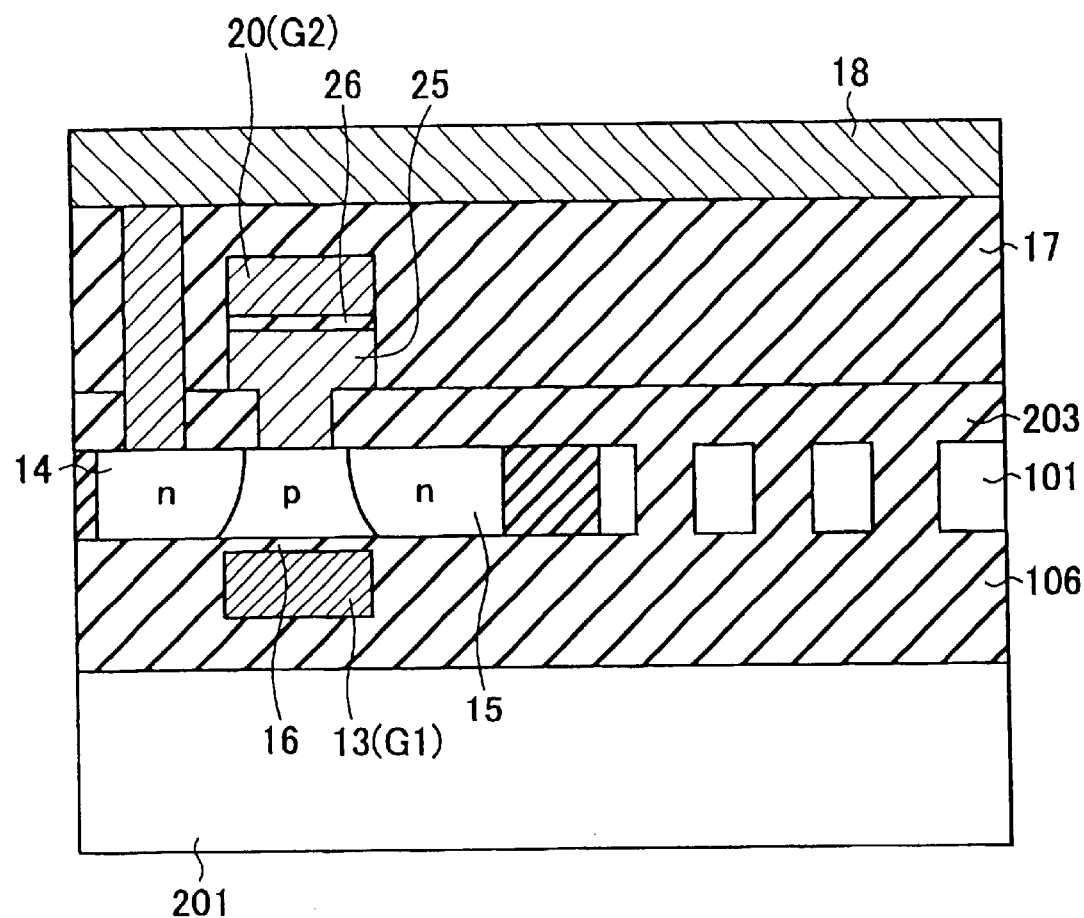
FIG. 26 is a diagram showing a bit line forming step in the manufacturing process.

As shown in FIG. 24, after the device isolation oxide film 115 is buried in the silicon substrate 101 the thickness of which is adjusted, a silicon oxide film 203 is deposited therein, and an opening 204 is made at a position corresponding to the channel body of the transistor. The device isolation insulating film 115 is shown only in the bit line direction in this diagram, but the device isolation insulating films 115 are formed at predetermined intervals also in the word line direction so that the silicon layer 12 isolated from others is formed in each memory cell MC region. Then, as shown in FIG. 25, the relay electrode 25 connected to the channel body via the opening is formed, and the second gate 20 (G2) is formed thereon with the capacitor insulating film 26 therebetween. The relay electrode 25 and the second gate 20 can be patterned integrally as the word line WL2 after being formed continuously with the capacitor insulating film 26 therebetween. With the second gate 20 as a mask, ions are implanted in the silicon layer 12 from above the silicon oxide film 203 to form the drain region 14 and the source region 15. Thereafter, as shown in FIG. 26, the interlayer dielectric film 17 is formed, and the bit lines 18 are formed thereon.

Manufacturing Process Corresponding to Third Embodiment

Figure 27:
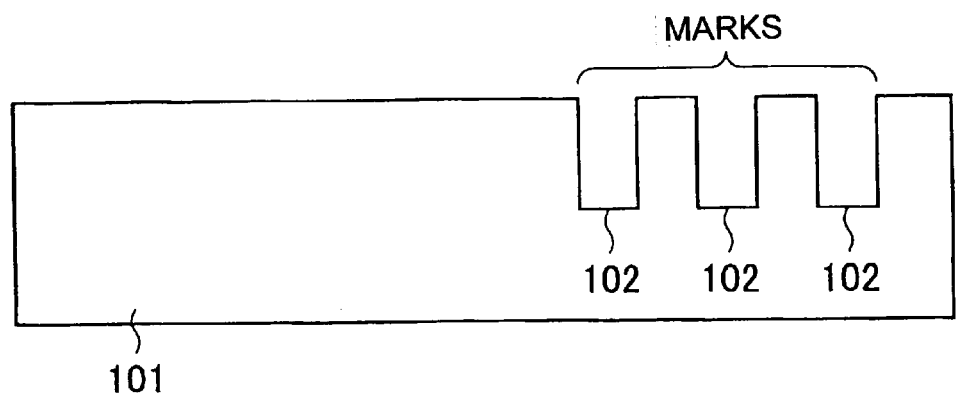
FIG. 27 is a diagram showing a mark forming step in a process of manufacturing the memory cell according to the third embodiment shown in FIG. 9.
Figure 28:
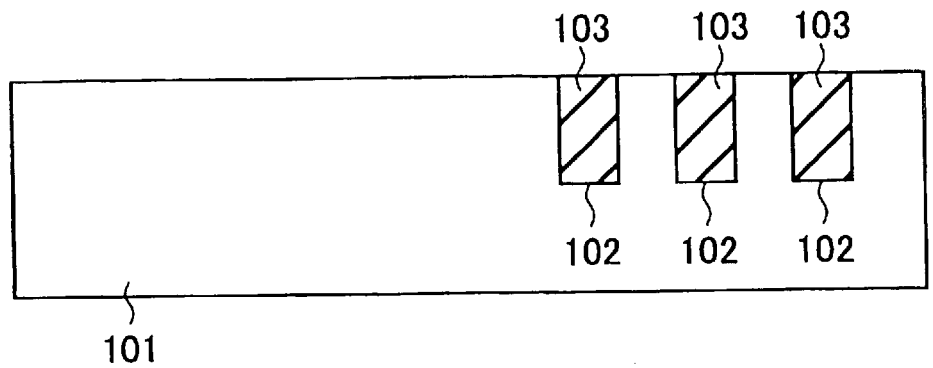
FIG. 28 is a diagram showing the mark forming step in the manufacturing process.

FIG. 27 to FIG. 33 show the process of manufacturing a DRAM cell corresponding to the third embodiment shown in FIG. 9. Also in this embodiment, two silicon substrates are used in order that two gates 13 and 20 are disposed above and below the silicon layer. As shown in FIG. 27, in the first silicon substrate 101, the trenches 102 are worked each as an alignment mark at the outside of a cell array region. As shown in FIG. 28, the oxide film 103 is buried in each of the trenches 102. The depth of the trench 102 is more than the thickness of an SOI layer which is adjusted by shaving the silicon substrate 101. More specifically, as will be described later, since the silicon substrate 101 becomes the silicon layer 12 in FIG. 9, the trenches 102 are formed deeper than the thickness of the silicon layer 12.

Figure 29:
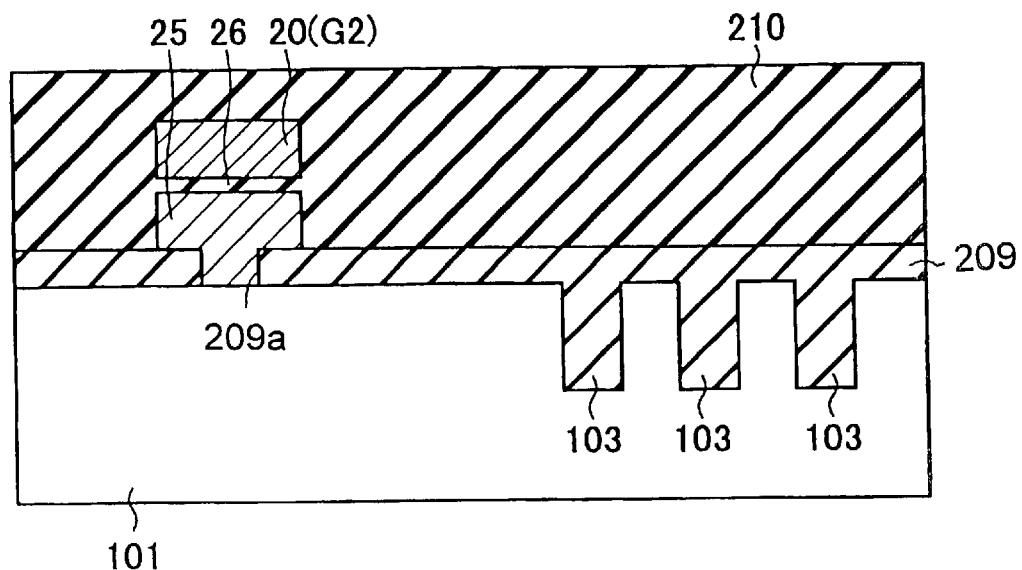
FIG. 29 is a diagram showing a gate (G2) forming step in the manufacturing process.

Thereafter, as shown in FIG. 29, a silicon oxide film 209 is deposited, and an opening 209a is formed at a position corresponding to the channel body of the transistor. The relay electrode 25 connected to the channel body via the opening 209a is formed, and the second gate 20 (G2) is formed thereon with the capacitor insulating film 26 therebetween. The relay electrode 25 and the second gate 20 can be patterned integrally as the word line WL2 after being deposited continuously with the capacitor insulating film 26 therebetween.

Figure 30:
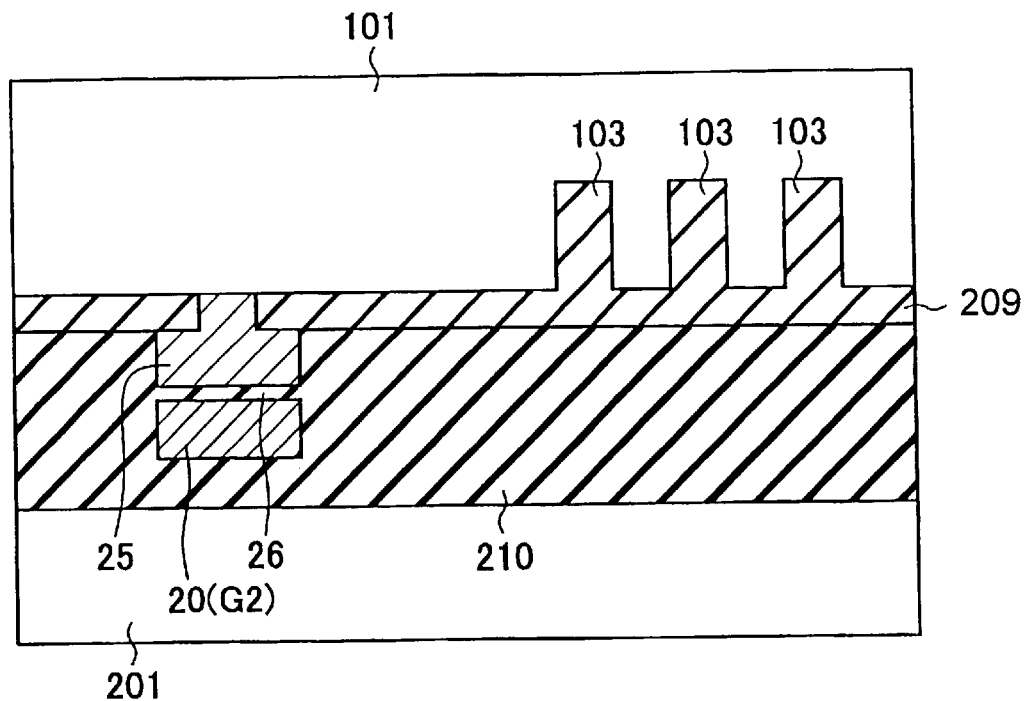
FIG. 30 is a diagram showing a substrate sticking step in the manufacturing process.

A face on which the second gates 20 are formed is covered with an insulating film such as a silicon oxide film 210 and then planarized. CMP (Chemical Mechanical Polishing) is used for planarization. Then, as shown in FIG. 30, the second silicon substrate 201 is stuck on the planarized face of the silicon oxide film 210.

Figure 31:
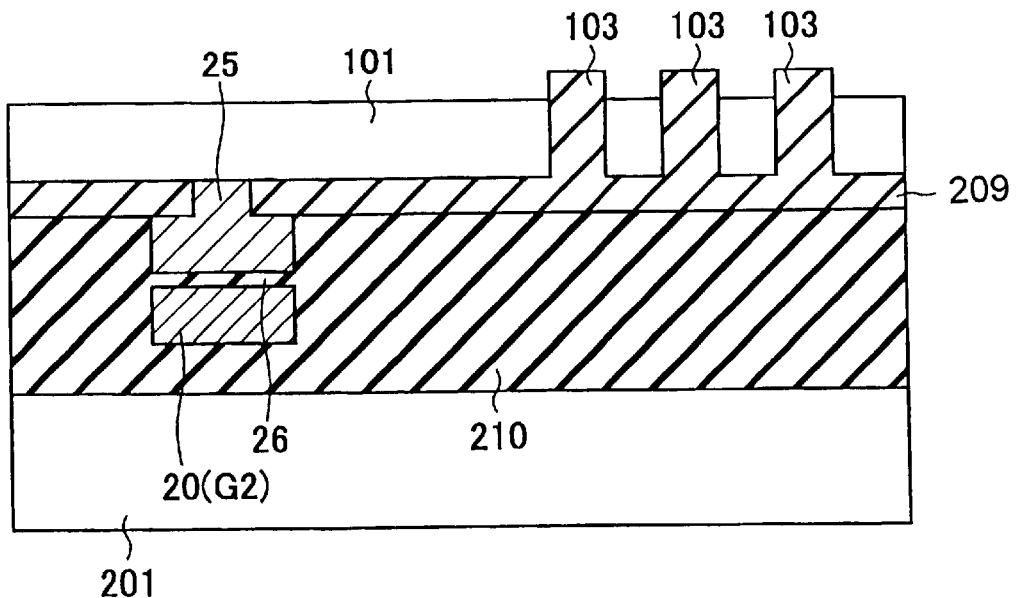
FIG. 31 is a diagram showing a substrate polishing step in the manufacturing process.

Thereafter, as shown in FIG. 31, the first silicon substrate 101 is polished until an intended thickness of the SOI layer is obtained. The silicon substrate 101 thus polished becomes the silicon layer 12 in FIG. 9. On this occasion, the previously buried silicon oxide film 103 protrudes, so that it can be used as a mark for alignment with the already formed second gates 20 in the next step of forming the first gates 13.

Figure 32:
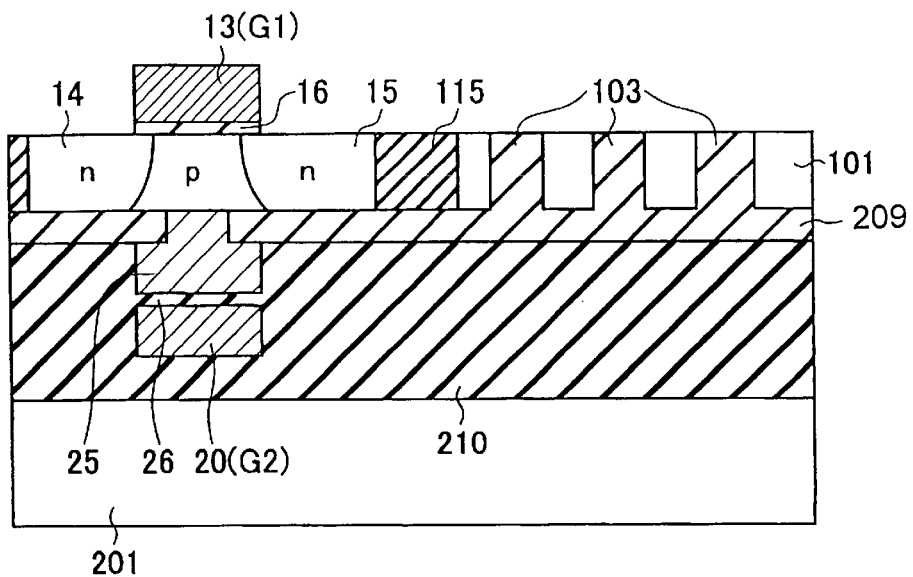
FIG. 32 is a diagram showing a gate (G1) forming step in the manufacturing process.
Figure 33:
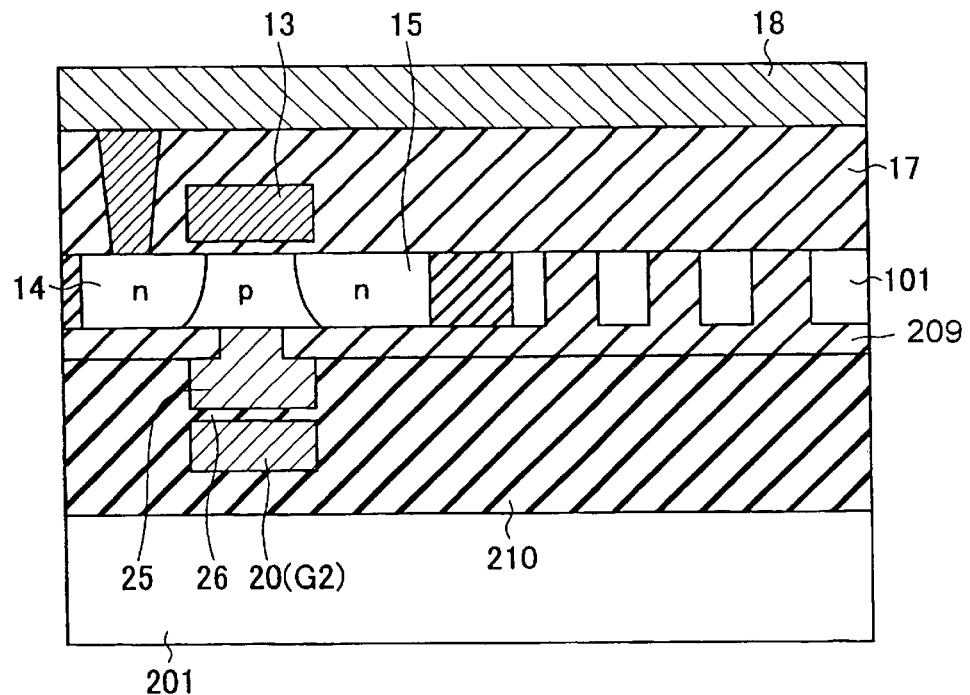
FIG. 33 is a diagram showing a bit line forming step in the manufacturing process.

As shown in FIG. 32, after the device isolation oxide film 115 is buried in the silicon substrate 101 the thickness of which is adjusted, the first gates (G1) 13 are pattern-formed to continue as the word line WL1 with the gate insulating film 16 therebetween. The device isolation insulating film 115 is shown only in the bit line direction in this diagram, but the device isolation insulating films 115 are formed at predetermined intervals also in the word line direction so that the silicon layer 12 isolated from others is formed in each memory cell MC region. Further, the drain region 14 and the source region 15 are formed by ion implantation. Thereafter, as shown in FIG. 33, the interlayer dielectric film 17 is formed, and the bit lines 18 are formed thereon.

Manufacturing Process Corresponding to Fourth Embodiment

FIG. 34A, FIG. 34B to FIG. 38A, and FIG. 38B show the process of manufacturing a cell array corresponding to the embodiment 4 shown in FIG. 10A to FIG. 10C, corresponding to sections in FIG. 10B and FIG. 10C.

Figure 34A:
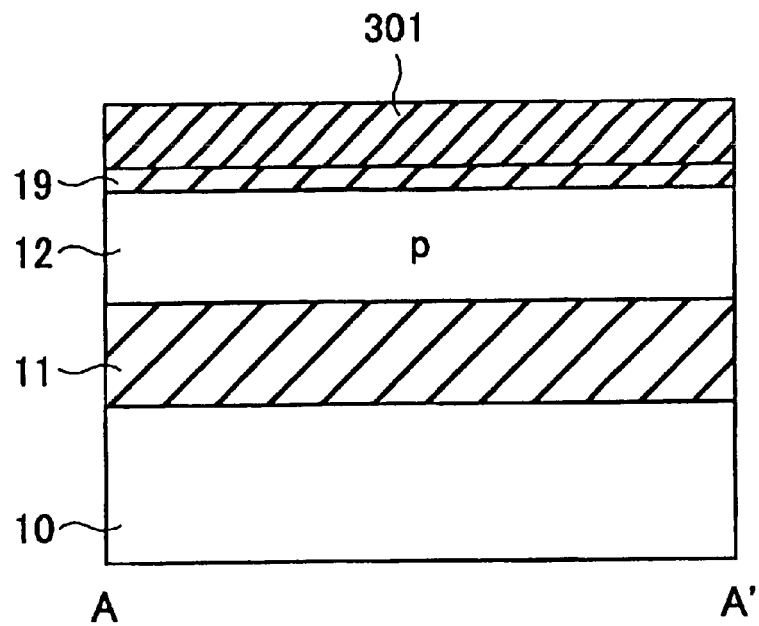
FIG. 34A is a diagram showing a device isolating step in a process of manufacturing a memory cell according to the fourth embodiment shown in FIG. 10A to FIG. 10C (a sectional view taken along the line A–A' in FIG. 10A)
Figure 34B:
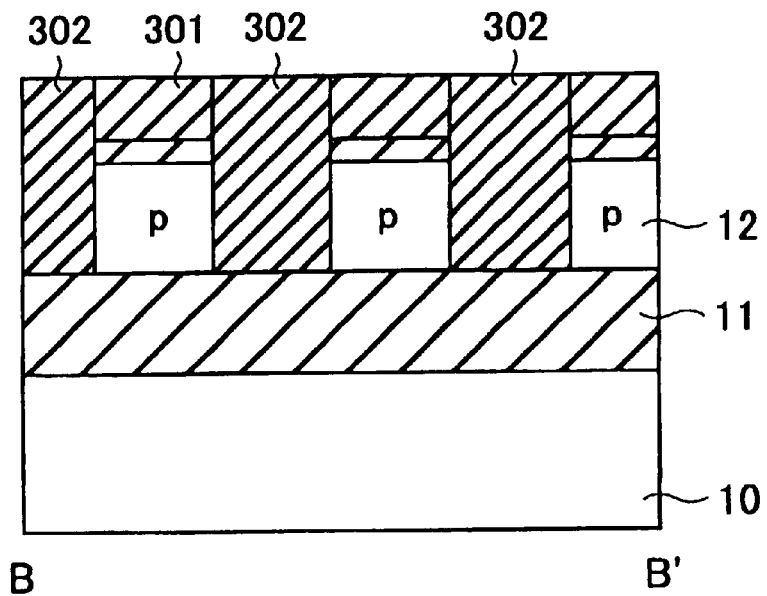
FIG. 34B a diagram showing the device isolating step in the process of manufacturing the memory cell according to the fourth embodiment shown in FIG. 10A to FIG. 10C (a sectional view taken along the line B–B' in FIG. 10A)

As shown in FIG. 34A and FIG. 34B, the oxide film 11 is formed on the silicon substrate 10, and the p-type silicon layer 12 with a predetermined thickness is formed on the oxide film 11. On the silicon layer 12, for example, a laminated film composed of the silicon nitride film 19 and a silicon oxide film 301 is formed as a capacitor insulating film. Subsequently, the silicon oxide film 301 of the laminated film is formed into a stripe pattern with continuity in the word line direction, with this stripe-patterned silicon oxide film as a mask, the silicon nitride film 19 and the silicon layer 12 are etched to reach the oxide film 11, and a device isolation insulating film 302 is buried therein. Thereby, the silicon layer 12 is divided into a plurality of stripe-patterned device-formed regions continuing in the bit line direction.

Figure 35A:
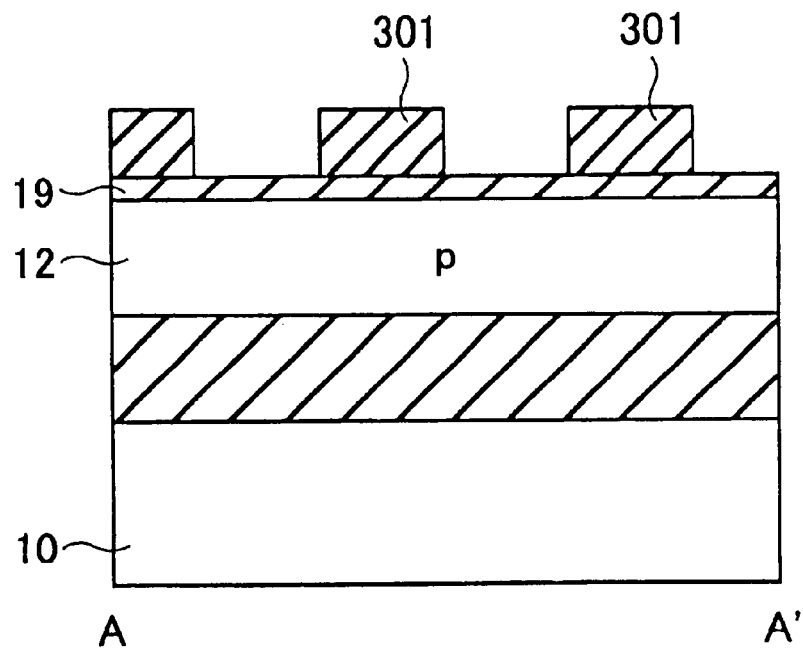
FIG. 35A is a diagram showing a gate-buried portion forming step in the manufacturing process (a sectional view taken along the line A–A' in FIG. 10A)
Figure 35B:
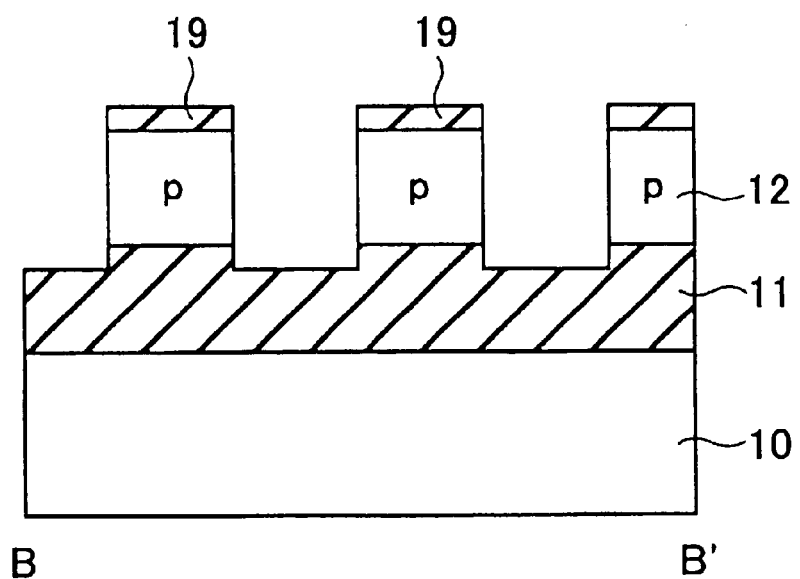
FIG. 35B is a diagram showing the gate-buried portion forming step in the manufacturing process (a sectional view taken along the line B–B' in FIG. 10A)

Then, as shown in FIG. 35A and FIG. 35B, the silicon oxide films 301 and 302 and the silicon nitride film 19 corresponding to regions where the first gates 13 are buried are etched to expose side faces of the transistor-formed regions of the p-type silicon layer 12. On this occasion, the silicon oxide film 302 is removed between the p-type silicon layers 12 adjoining in the word line direction, and the foundation oxide film 11 is partially over-etched.

Figure 36A:
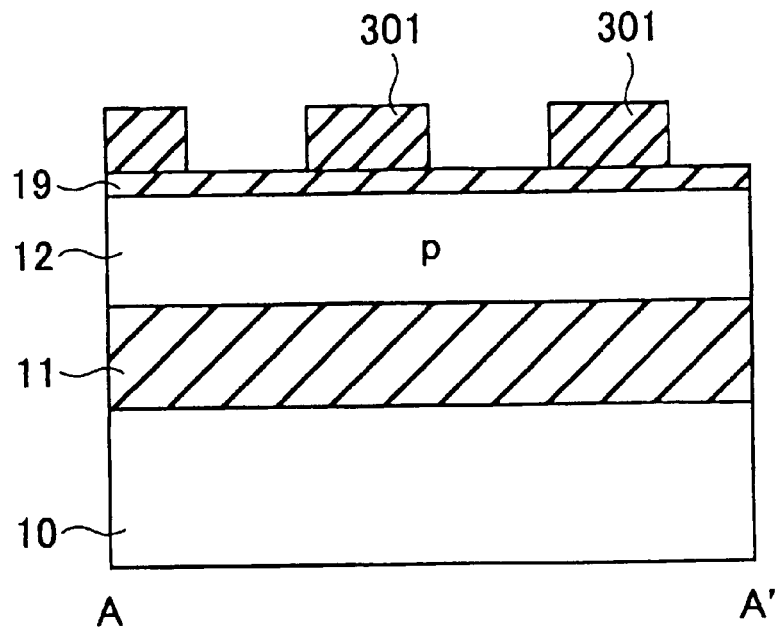
FIG. 36A is a diagram showing a gate (G1) burying step in the manufacturing process (a sectional view taken along the line A–A' in FIG. 10A)
Figure 36B:
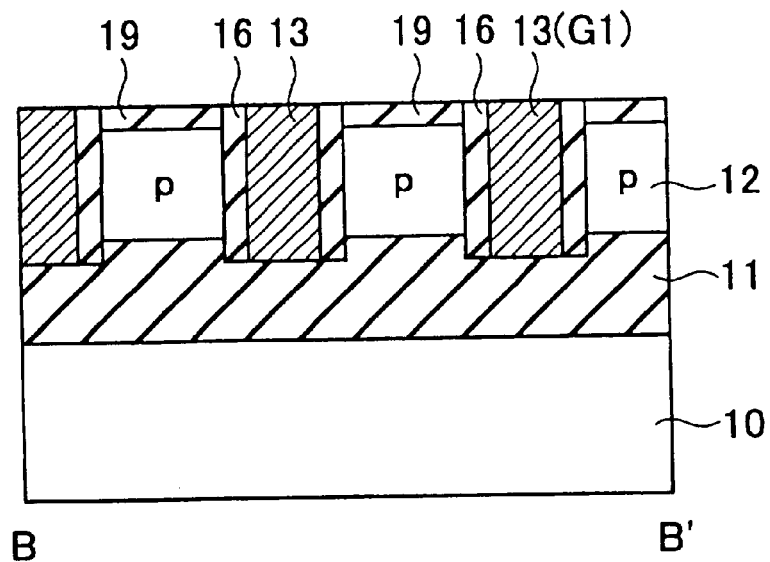
FIG. 36B is a diagram showing the gate (G1) burying step in the manufacturing process (a sectional view taken along the line B–B' in FIG. 10A)

As shown in FIG. 36A and FIG. 36B, after the gate insulating film 16 is formed on either side face of the silicon layer 12, the first gates (G1) 13 are formed by being buried between the silicon layers 12 in the respective memory cell MC regions by deposition of polycrystalline silicon and etching.

Figure 37A:
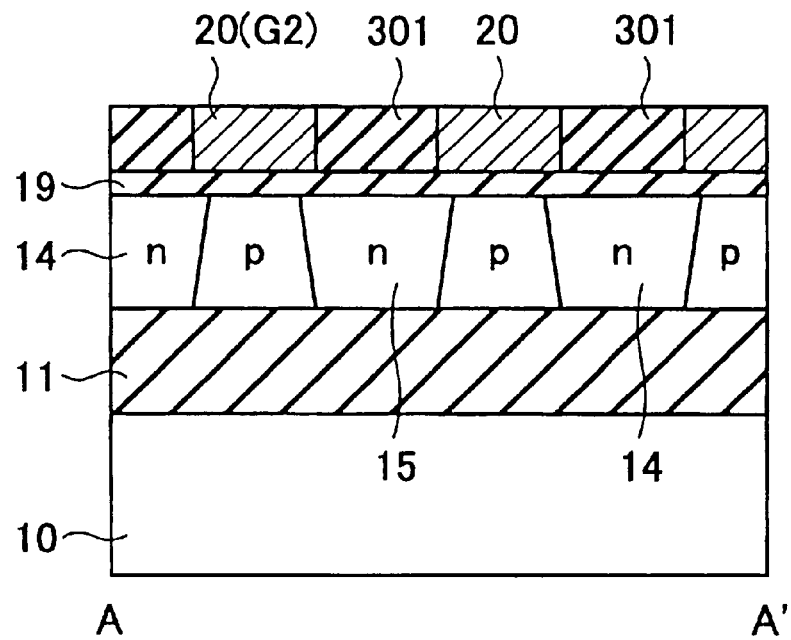
FIG. 37A is a diagram showing a gate (G2) forming step in the manufacturing process (a sectional view taken along the line A–A' in FIG. 10A)
Figure 37B:
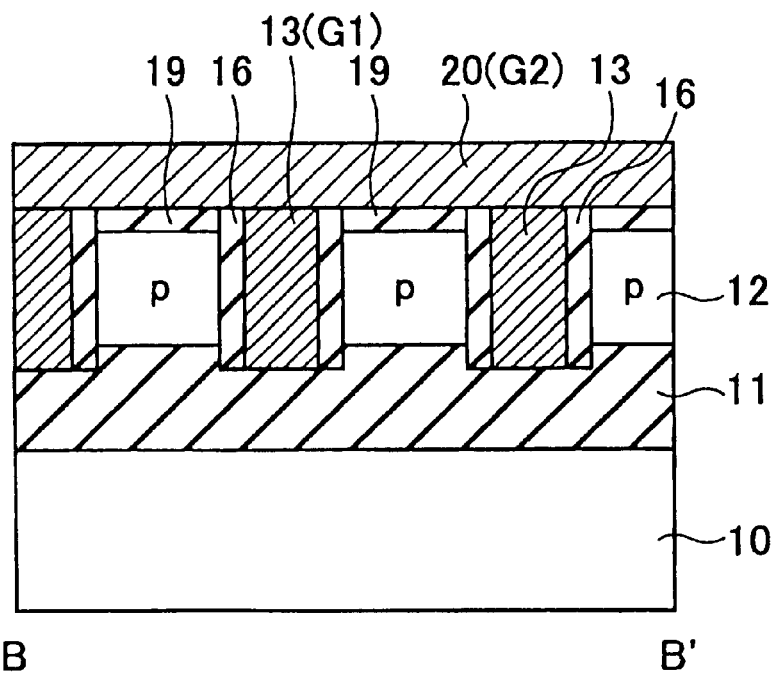
FIG. 37B is a diagram showing the gate (G2) forming step in the manufacturing process (a sectional view taken along the line B–B' in FIG. 10A)

Thereafter, as shown in FIG. 37A and fig. 37B, the second gates 20 which connect the first gates 13 jointly to constitute the word lines WL are buried between the oxide films 301. A metal material such as platinum having a work function larger than the first gate 13 is used for the second gate as stated above. Further, in order to suppress a reaction between the polysilicon of the first gates 13 and the platinum of the second gates 20, a barrier metal (for example, TiN or TaN, etc.) may be formed on the first gates 13 for prevention against the chemical reaction after forming the first gates 13. Then, ions are implanted in the silicon layer 12 from above the oxide film 301 to form the drains 14 and the sources 15 in the silicon layer 12.

Figure 38A:
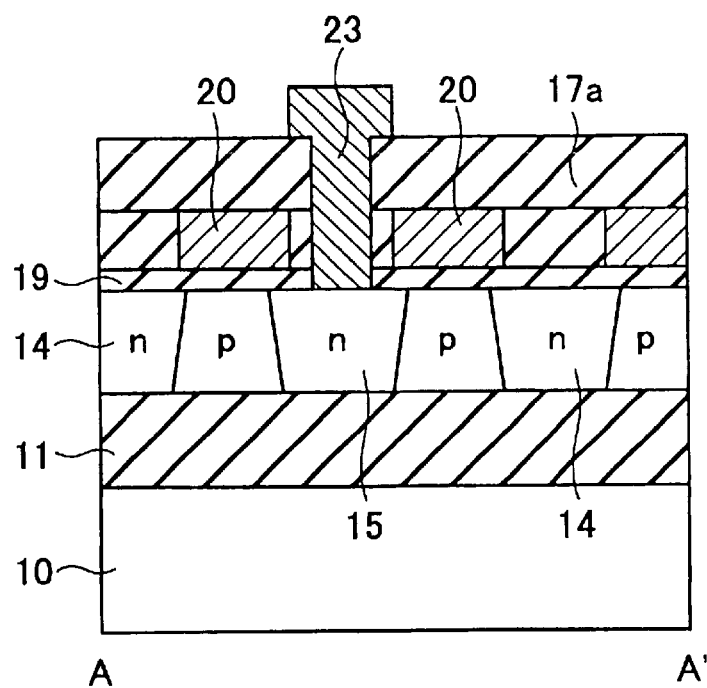
FIG. 38A is a diagram showing a fixed potential line forming step in the manufacturing process (a sectional view taken along the line A–A' in FIG. 10A)
Figure 38B:
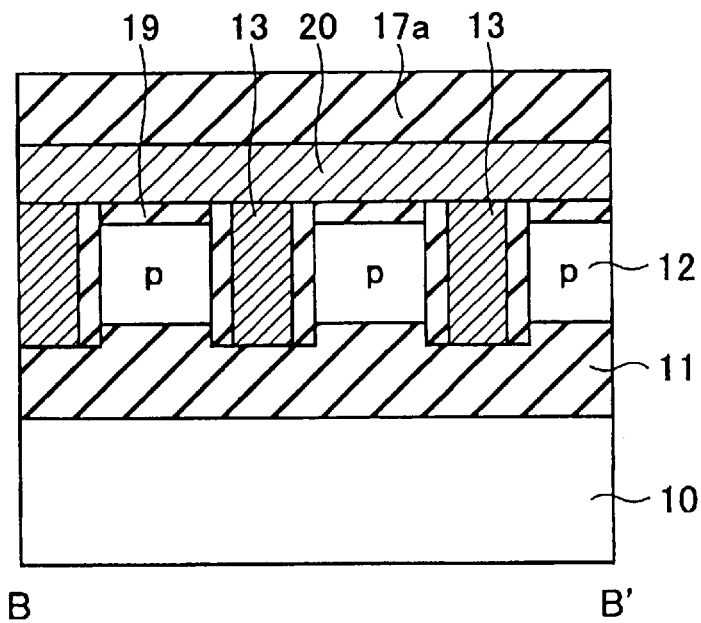
FIG. 38B is a diagram showing the fixed potential line forming step in the manufacturing process (a sectional view taken along the line B–B' in FIG. 10A)

Subsequently, as shown in FIG. 38A and FIG. 38B, the interlayer dielectric film 17a is deposited, and a contact hole is bored therein to form the fixed potential line 23 which connects the sources 15 in the word line direction. Thereafter, as shown in FIG. 10B and FIG. 10C, the interlayer dielectric film 17b is deposited, and contact holes are bored therein to form the bit lines 18 which connect the drains 18.

Cell Array and Manufacturing Process Corresponding to Fifth Embodiment

Figure 39A:
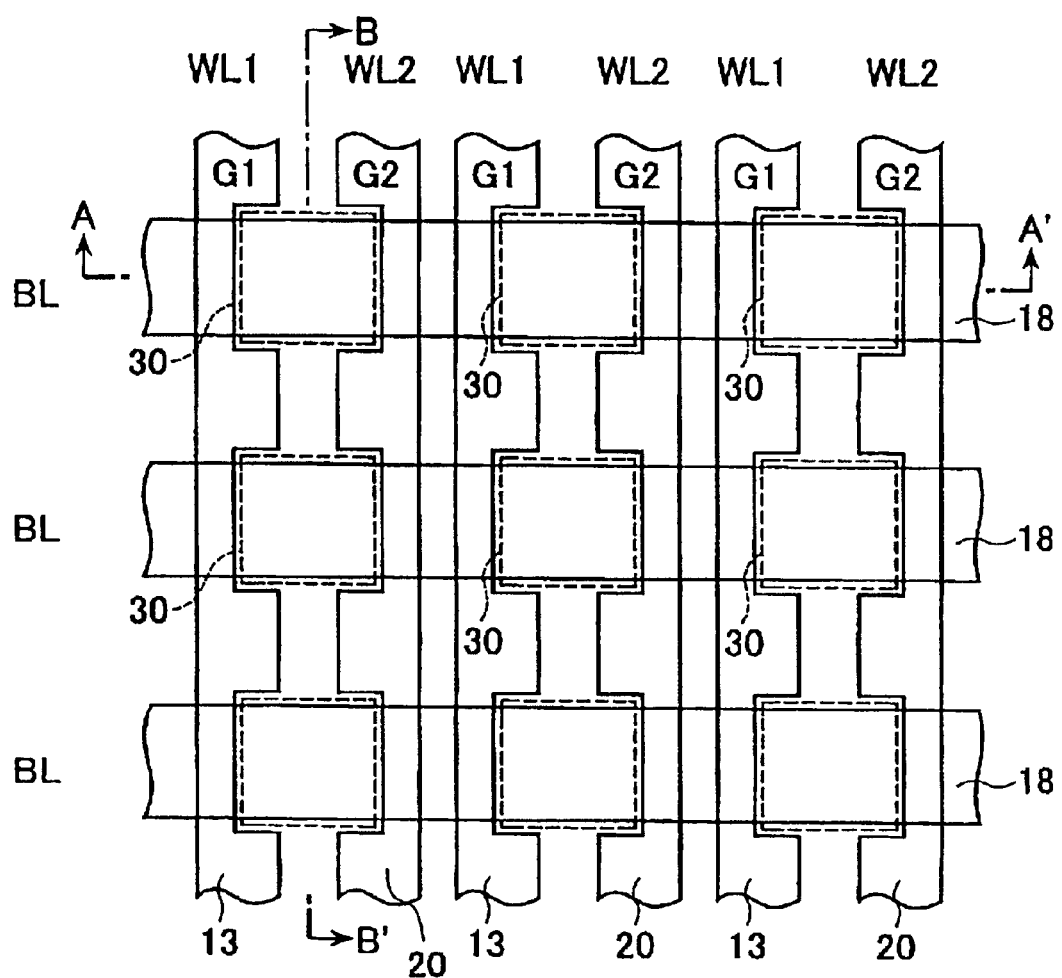
FIG. 39A is a diagram showing the layout of a cell array corresponding to the embodiment in FIG. 11.
Figure 39B:
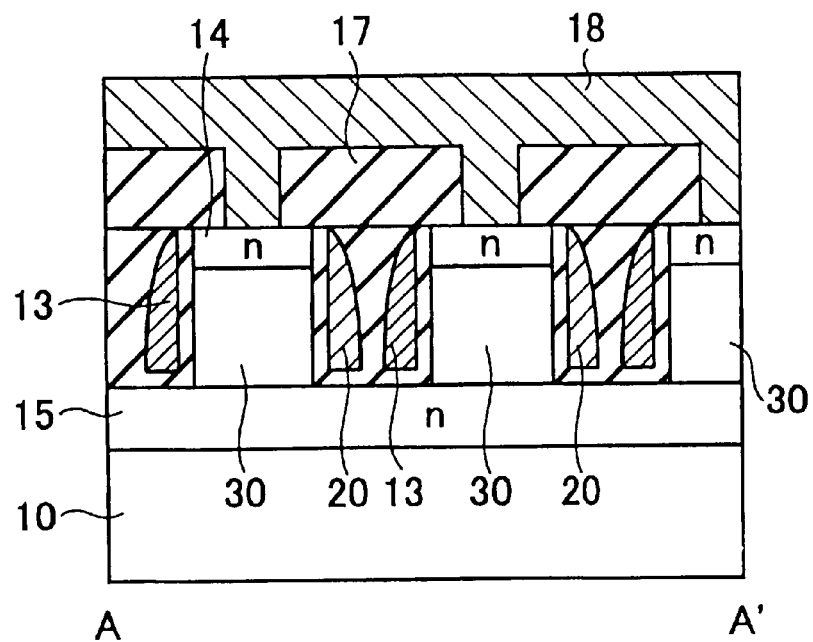
FIG. 39B is a sectional view taken along the line A–A' in FIG. 39A.
Figure 39C:
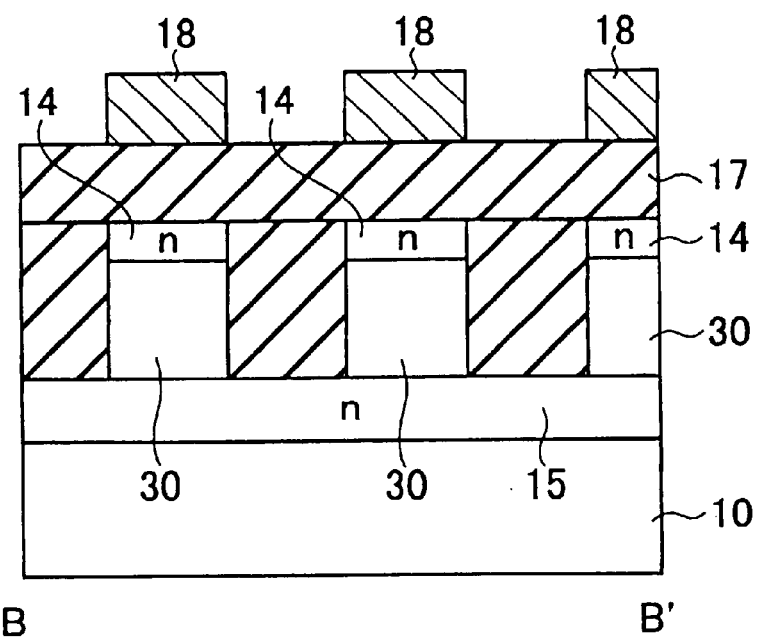
FIG. 39C is a sectional view taken along the line B–B' in FIG. 39A.

FIG. 39A shows the layout of a concrete cell array with the DRAM cells shown in FIG. 11, FIG. 39B shows its section taken along the line A–A', and FIG. 39C shows its section taken along the line B–B'. The first gate 13 and the second gate 20 are respectively formed using the same material on both sides of the pillar silicon portion 30. These gates 13 and 20 are patterned continuously in one direction to constitute the first word lines WL1 and the second word lines WL2.

Figure 40A:
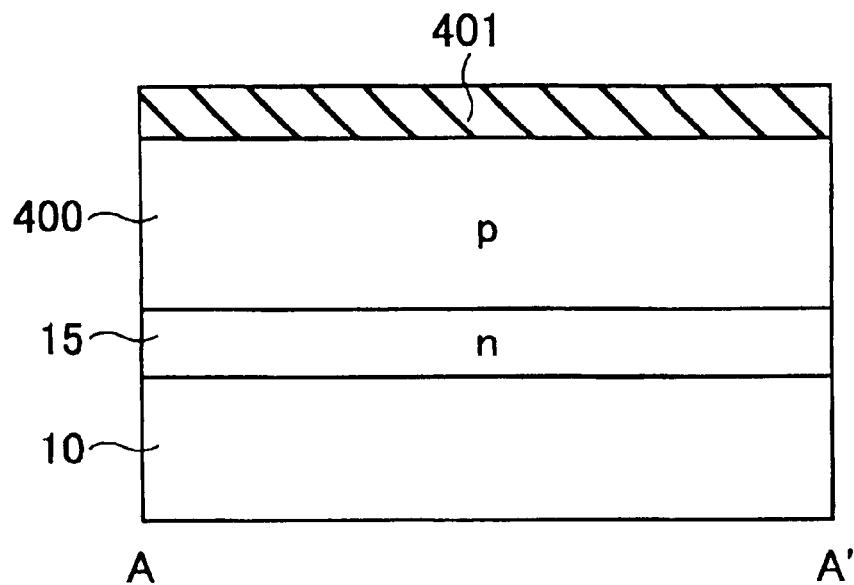
FIG. 40A is a diagram showing a pillar silicon forming step in a process of manufacturing the cell array in FIG. 39 (a sectional view taken along the line A–A' in FIG. 39A)
Figure 40B:
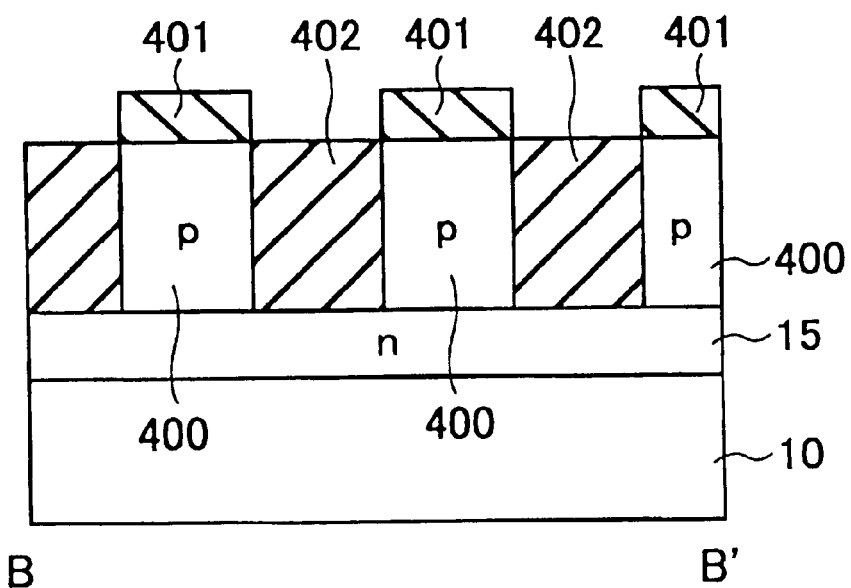
FIG. 40B is a diagram showing the pillar silicon forming step in the manufacturing process in FIG. 39 (a sectional view taken along the line B–B' in FIG. 39A)

FIG. 40A, FIG. 40B to FIG. 44A, and FIG. 44B are diagrams explaining a manufacturing process by the use of sections corresponding to FIG. 39B and FIG. 39C. As shown in FIG. 40A and FIG. 40B, an n-type layer which becomes the source region 15 is previously formed on the silicon substrate 10. A p-type silicon layer 400 is epitaxially grown on this n-type layer. A mask of a silicon nitride film 401 is pattern-formed on such an epitaxial substrate, stripe-shaped trenches continuing in the bit line direction are worked by etching the silicon layer 400, and a device isolation oxide film 402 is buried in each of the trenches.

Further, in another example, the epitaxial growth method is not used, but the n-type layer which becomes the source region 15 may be formed by implanting ions in a normal p-type silicon substrate.

Figure 41A:
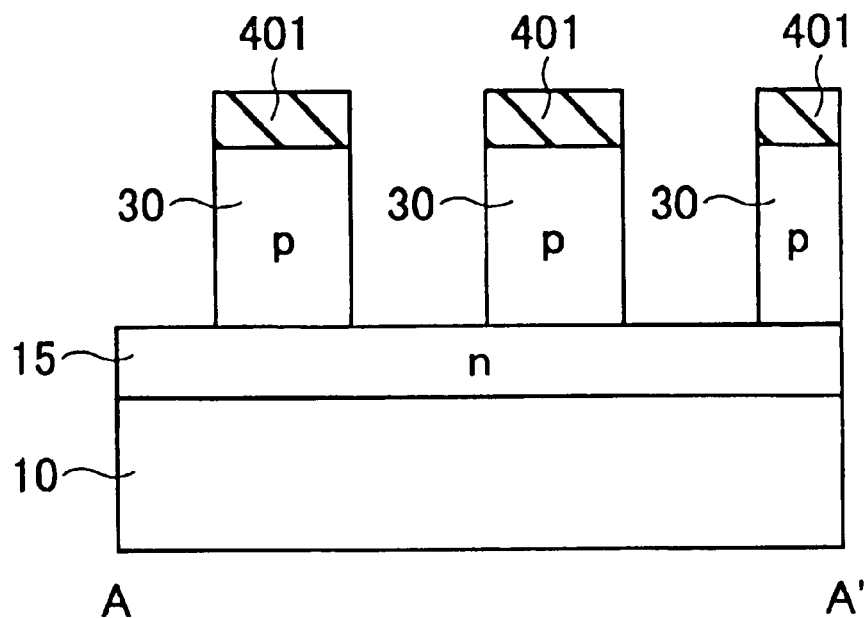
FIG. 41A is a diagram showing the pillar silicon forming step in the manufacturing process (a sectional view taken along the line A–A' in FIG. 39A)
Figure 41B:
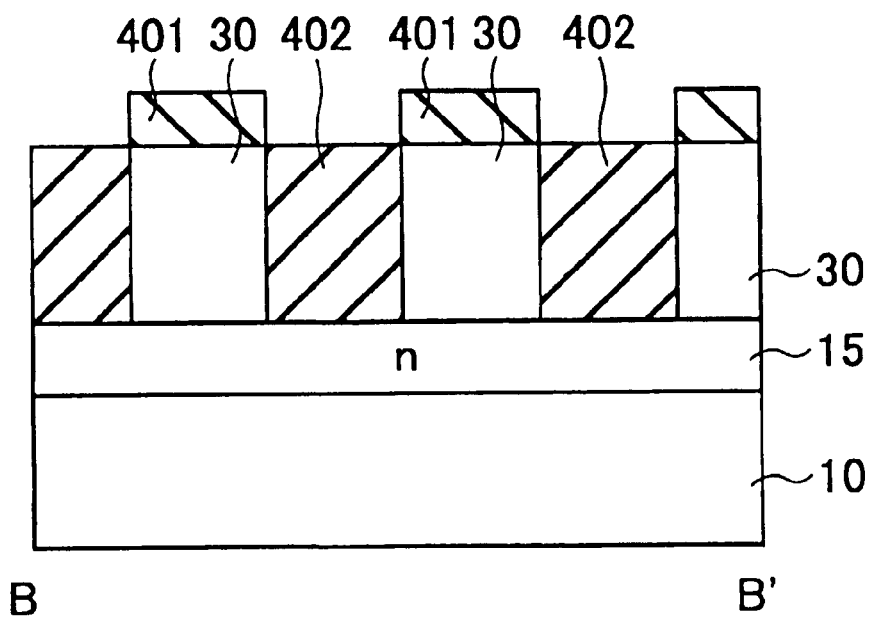
FIG. 41B is a diagram showing the pillar silicon forming step in the manufacturing process (a sectional view taken along the line B–B' in FIG. 39A)

As shown in FIG. 41A and FIG. 41B, the silicon nitride film 401 is changed into a pattern in which it is separated also in the bit line direction. With this silicon nitride film 401 as a mask, the silicon layer 400 in a stripe form is etched again. Thus, the silicon layer 400 is separated both in the bit line direction and the word line direction, and the pillar silicon portions 30 separated from each other are obtained in respective memory cell MC regions.

Figure 42A:
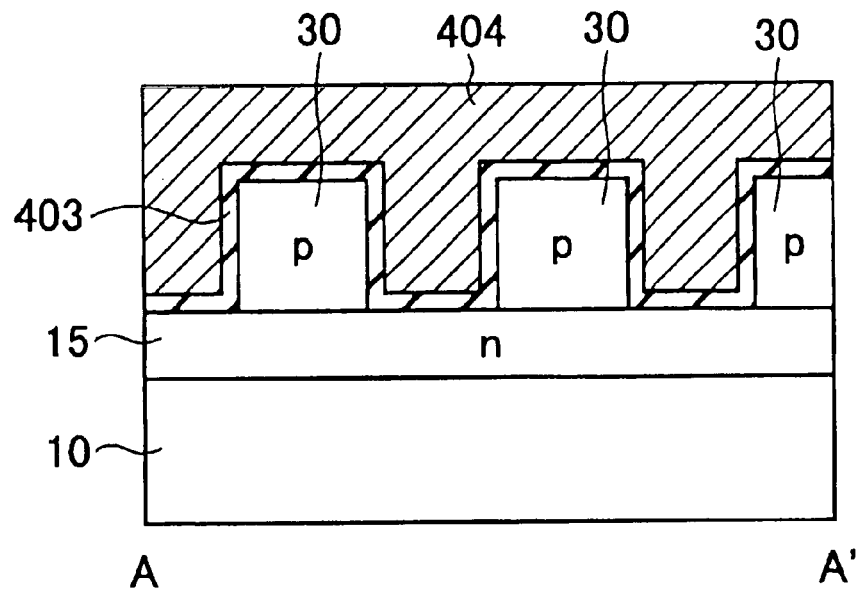
FIG. 42A is a diagram showing a gate electrode material depositing step in the manufacturing process (a sectional view taken along the line A–A' in FIG. 39A)
Figure 42B:
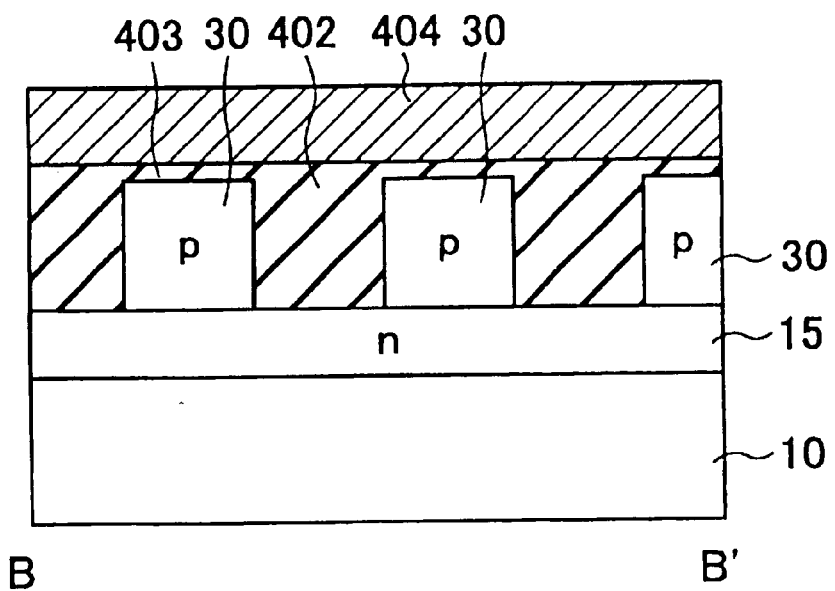
FIG. 42B is a diagram showing the gate electrode material depositing step in the manufacturing process (a sectional view taken along the line B–B' in FIG. 39A)

Subsequently, after portions of the device isolation oxide film 402 corresponding to regions where the word lines are buried are selectively etched, the silicon nitride film 401 is removed, and as shown in FIG. 42A and FIG. 42B, a gate insulating film 403 (corresponding to the gate insulating films 16 and 19 in FIG. 11) is formed around the pillar silicon portions 30, and a polycrystalline silicon film 404 is deposited.

Figure 43A:
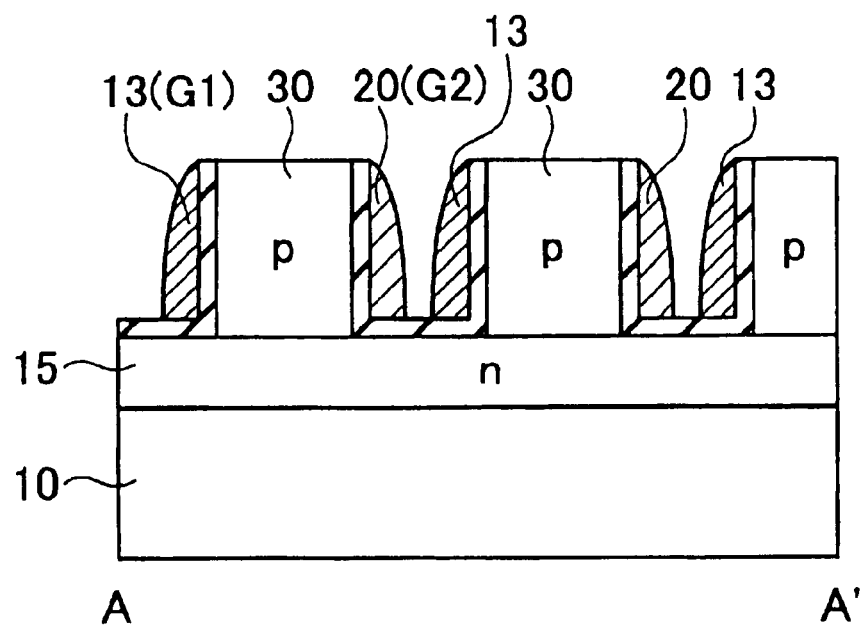
FIG. 43A is a diagram showing a gate forming step in the manufacturing process (a sectional view taken along the line A–A' in FIG. 39A)
Figure 43B:
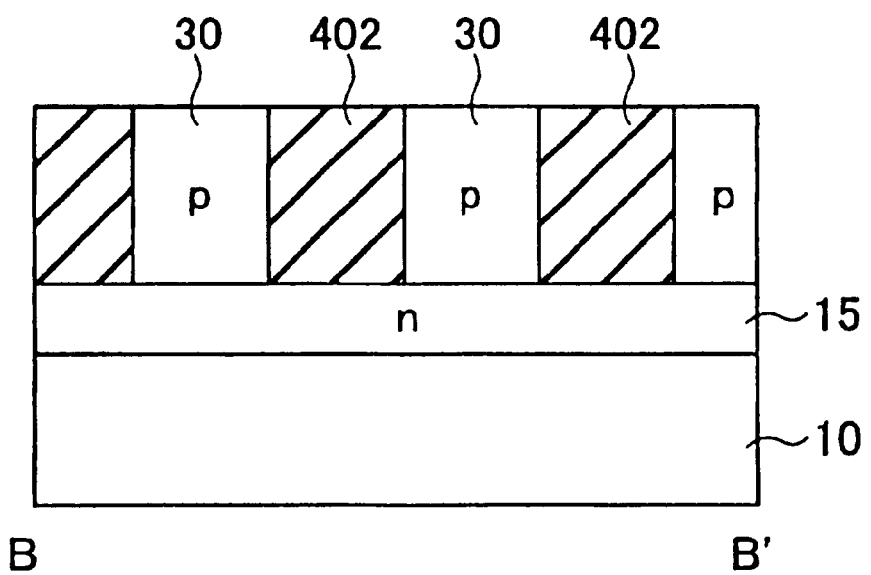
FIG. 43B is a diagram showing the gate forming step in the manufacturing process (a sectional view taken along the line B–B' in FIG. 39A)

Then, as shown in FIG. 43A and FIG. 43B, the polycrystalline silicon film 404 is etched by RIE to form the first gates 13 and the second gates 2 continuing as the word lines WL1 and WL2. Namely, the gates 13 and 20 are formed by etching the polycrystalline silicon film 404 by sidewall leaving technology.

Figure 44A:
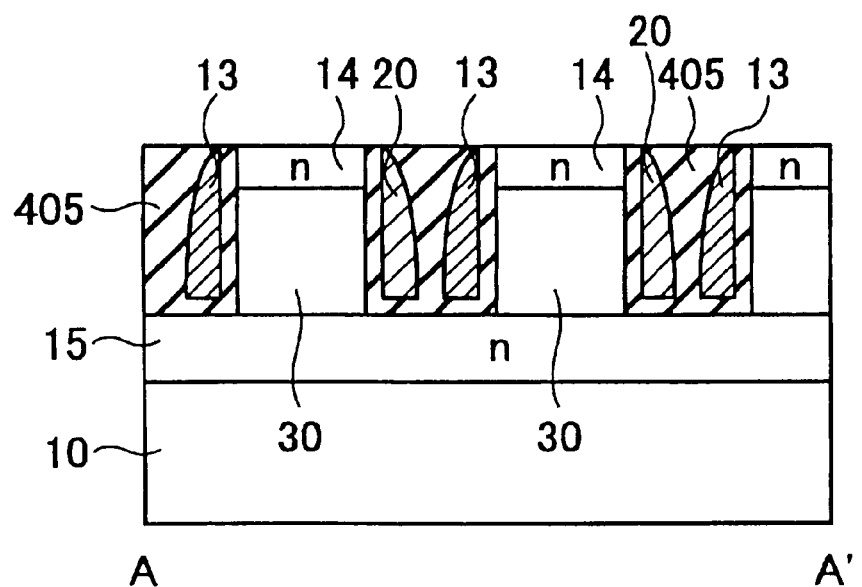
FIG. 44A is a diagram showing a planarizing step in the manufacturing process (a sectional view taken along the line A–A' in FIG. 39A)
Figure 44B:
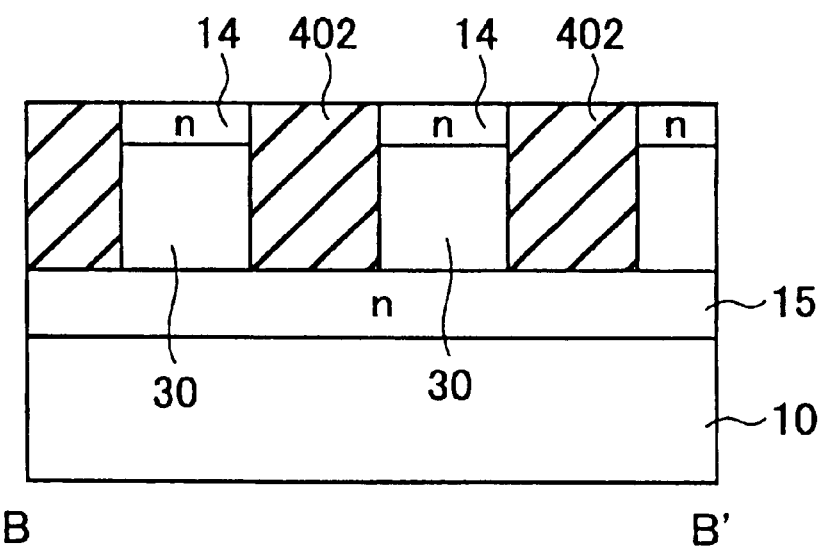
FIG. 44B is a diagram showing the planarizing step in the manufacturing process (a sectional view taken along the line B–B' in FIG. 39A)

Thereafter, as shown in FIG. 44A and FIG. 44B, the n-type drain region 14 is formed on the top of the pillar silicon portion 30 by ion implantation. Subsequently, a silicon oxide film 405 is deposited and then planarized. Thereafter, as shown in FIG. 39B and FIG. 39C, the interlayer dielectric film 17 is deposited, and contact holes are bored therein to form the bit lines 18.

Figure 45A:
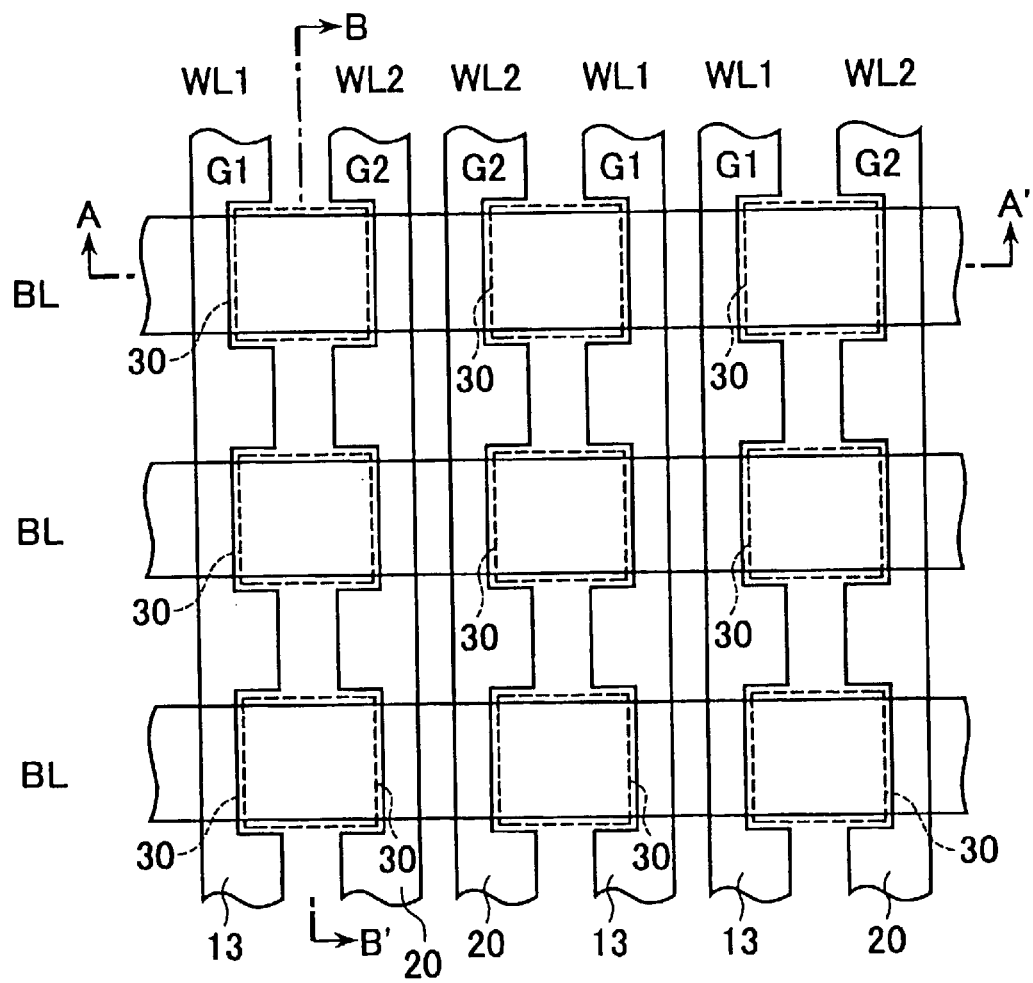
FIG. 45A is a diagram showing the layout of another cell array by memory cells according to the fifth embodiment shown in FIG. 11.
Figure 45B:
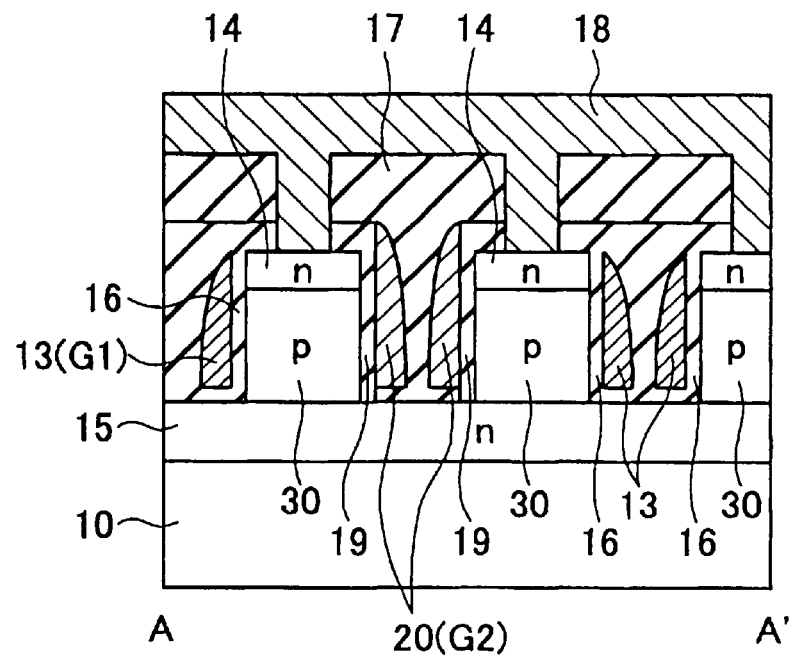
FIG. 45B is a sectional view taken along the line A–A' in FIG. 45A.
Figure 45C:
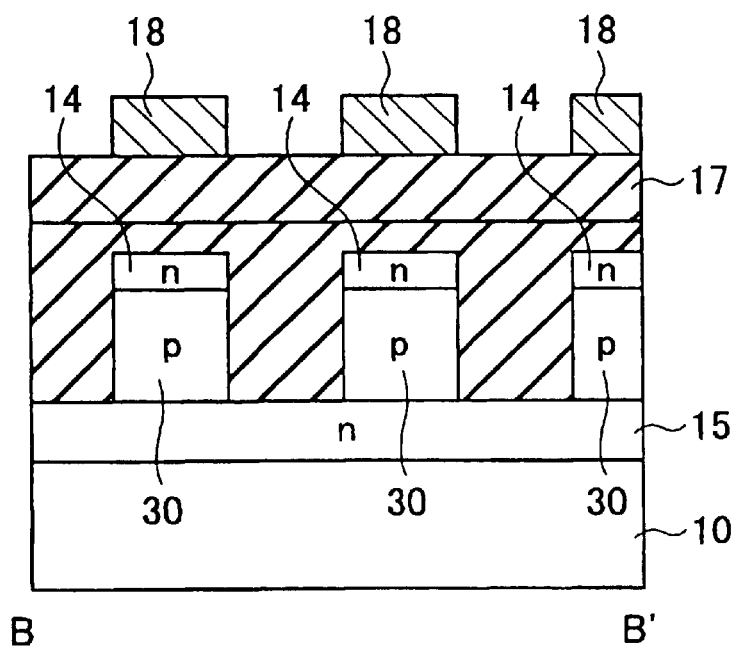
FIG. 45C is a sectional view taken along the line B–B' in FIG. 45A.

Another Cell Array and its Manufacturing Process Corresponding to Fifth Embodiment In FIG. 39A and FIG. 39B, the same electrode material is used for the first gate 13 and the second gate 20, but FIG. 45A to FIG. 45C show a structure when different electrode materials are used for the first gate 13 and the second gate 20 in the same cell array structure, corresponding to FIG. 39A to FIG. 39C.

As in the case of FIG. 39A to FIG. 39C, the first gate (G1) 13 and the second gate (G2) are respectively formed on both sides of the pillar silicon portion 30 with the gate insulating films 16 and 19 therebetween. However, they are different in that the first gate 13 and the second gate 20 are put in the reverse disposition alternately in the memory cells MC adjoining in the direction of the bit line BL due to the use of different materials for these gates 13 and 20. Namely, the first word line WL1 and the second word line WL2 are formed in different processes and two lines each are alternately arranged between the pillar silicon portions 30.

Figure 46A:
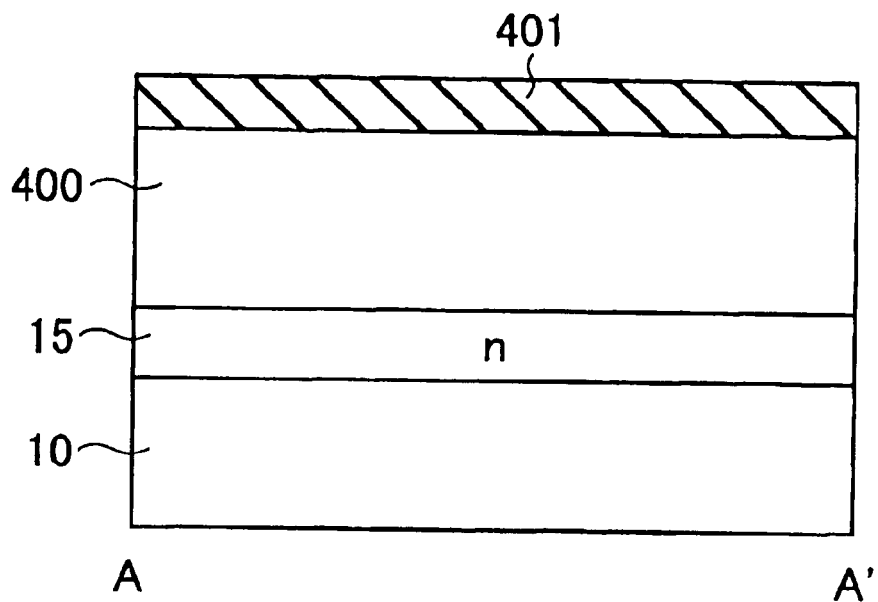
FIG. 46A is a diagram showing a pillar silicon forming step in a process of manufacturing the cell array in FIG. 45 (a sectional view taken along the line A–A' in FIG. 45A)
Figure 46B:
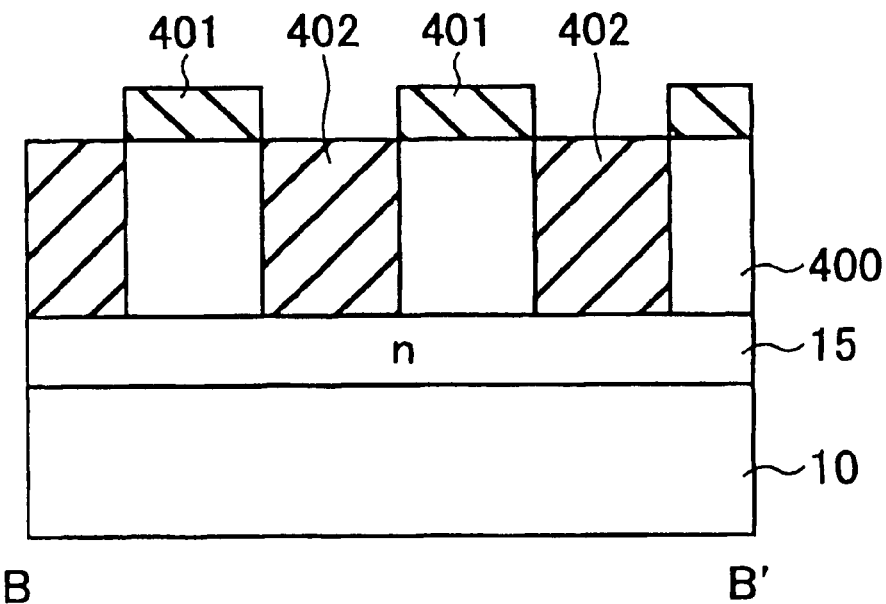
FIG. 46B is a diagram showing the pillar silicon forming step in the manufacturing process in FIG. 45 (a sectional view taken along the line B–B' in FIG. 45A)

FIG. 46A, FIG. 46B to FIG. 53A, and FIG. 53B are diagrams explaining its manufacturing process corresponding to sections in FIG. 45B and FIG. 45C. As shown in FIG. 46A and FIG. 46B, an n-type layer which becomes the source region 15 is previously formed on the entire surface of the silicon substrate 10. The p-type silicon layer 400 is epitaxially grown on this n-type layer. A mask of the silicon nitride film 401 is pattern-formed on such an epitaxial substrate, stripe-shaped trenches continuing in the bit line direction are worked by etching the silicon layer 400, and the device isolation oxide film 402 is buried in each of the trenches.

Further, in another example, the epitaxial growth method is not used, but the n-type layer which becomes the source region 15 may be formed by implanting ions in a normal p-type silicon substrate.

Figure 47A:
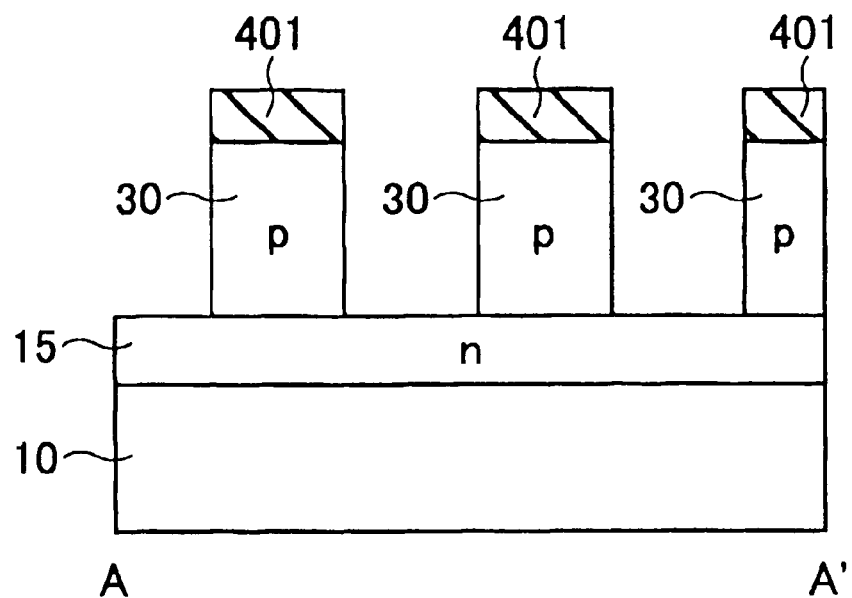
FIG. 47A is a diagram showing the pillar silicon forming step in the manufacturing process (a sectional view taken along the line A–A' in FIG. 45A)
Figure 47B:
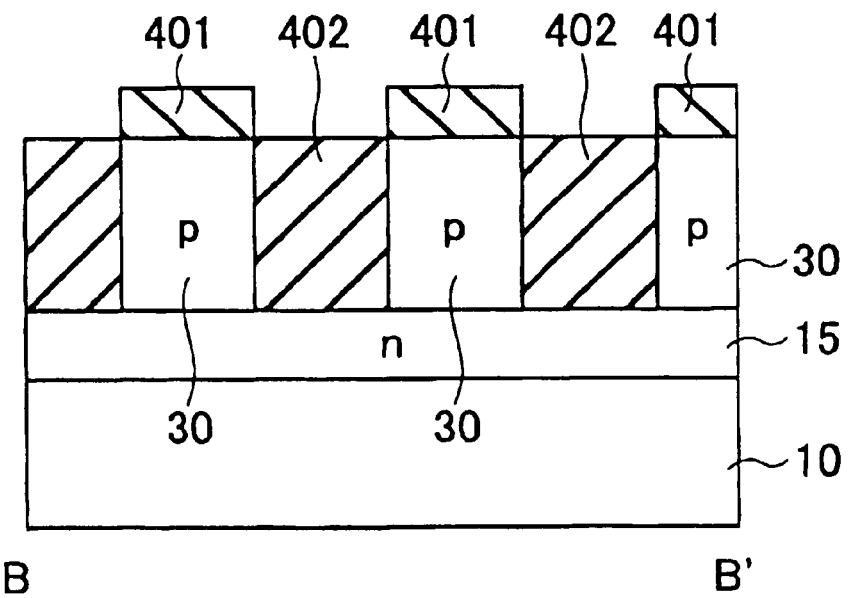
FIG. 47B is a diagram showing the pillar silicon forming step in the manufacturing process (a sectional view taken along the line B–B' in FIG. 45A)

As shown in FIG. 47A and FIG. 47B, the silicon nitride film 401 is modified into a pattern in which it is separated also in the bit line direction. With this silicon nitride film 401 as a mask, the silicon layer 400 in a stripe form is etched again. Thus, the silicon layer 400 is separated both in the bit line direction and the word line direction and left as the pillar silicon portions 30 separated from each other in respective memory cell MC regions.

Figure 48A:
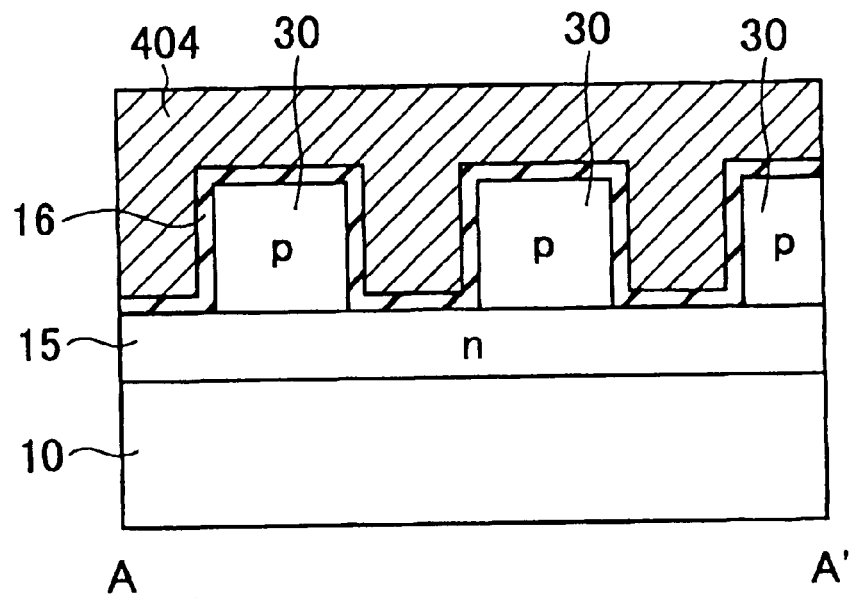
FIG. 48A is a diagram showing a gate electrode material depositing step in the manufacturing process (a sectional view taken along the line A–A' in FIG. 45A)
Figure 48B:
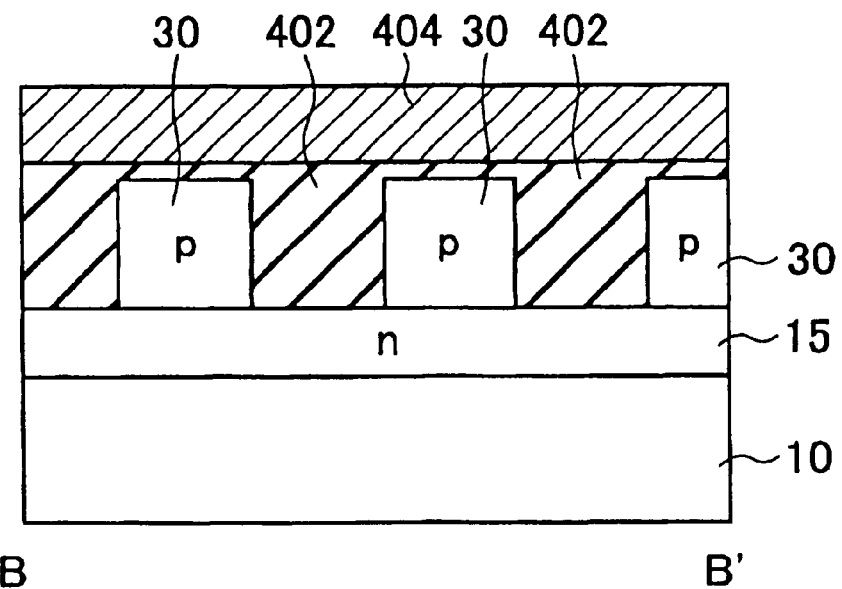
FIG. 48B is a diagram showing the gate electrode material depositing step in the manufacturing process (a sectional view taken along the line B–B' in FIG. 45A)
Figure 49A:
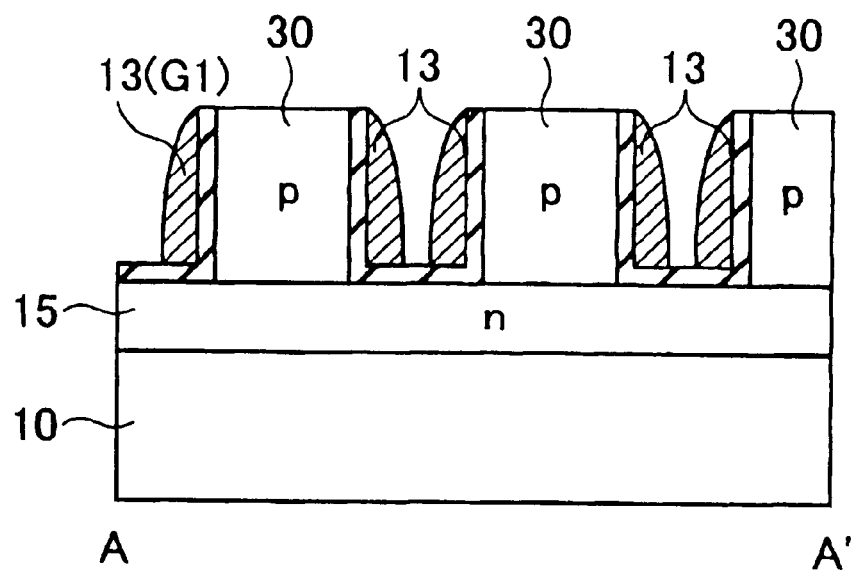
FIG. 49A is a diagram showing a gate (G1) forming step in the manufacturing process (a sectional view taken along the line A–A' in FIG. 45A)
Figure 49B:
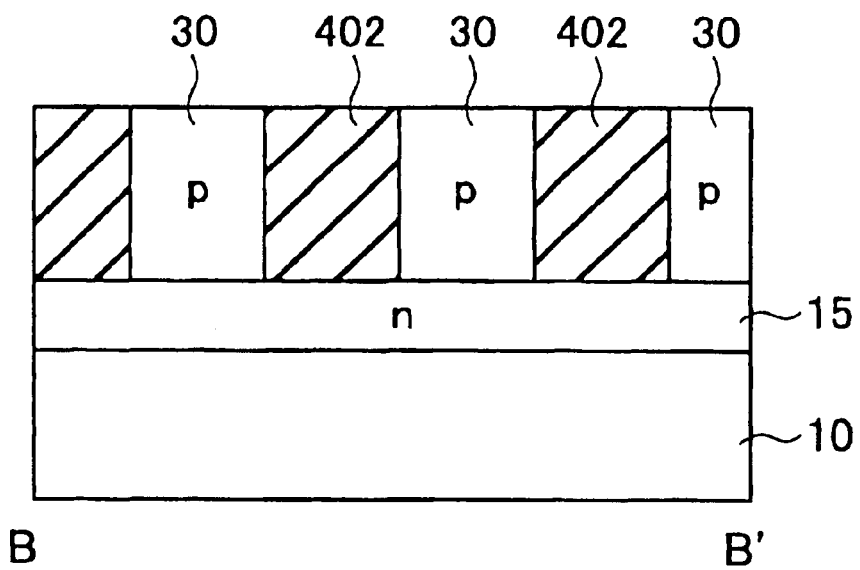
FIG. 49B is a diagram showing the gate (G1) forming step in the manufacturing process (a sectional view taken along the line B–B' in FIG. 45A)

Subsequently, after portions of the device isolation oxide film 402 corresponding to regions where the word lines are buried are selectively etched, the silicon nitride film 401 is removed, and as shown in FIG. 48A and FIG. 48B, the gate insulating film 16 is formed around the pillar silicon portions 30, and the polycrystalline silicon film 404 is deposited. This polycrystalline silicon film 404 is etched by RIE to form the first gates 13 continuing as the word lines WL1 as shown in FIG. 49A and FIG. 49B. Namely, the first gates 13 are formed by etching the polycrystalline silicon film 404 by sidewall leaving technology.

Figure 50A:
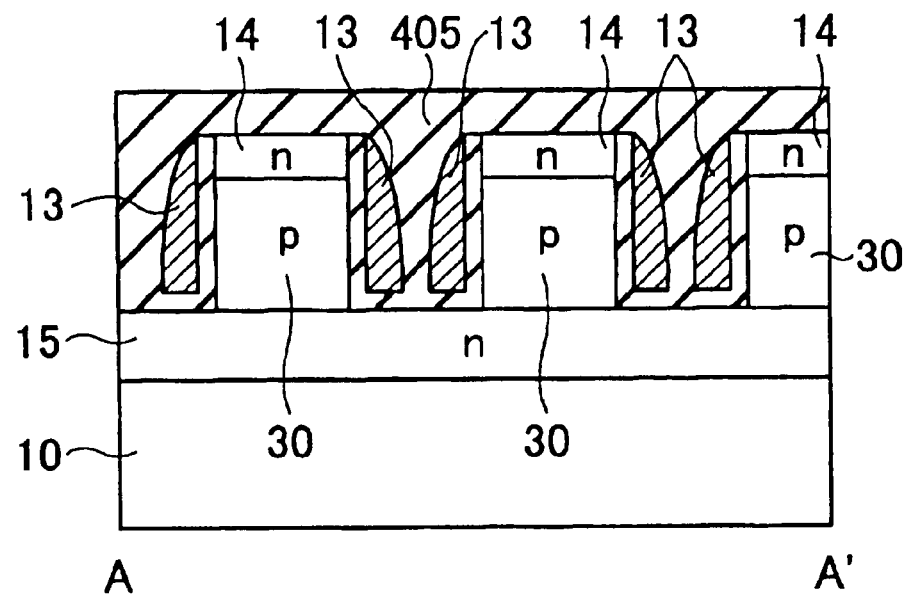
FIG. 50A is a diagram showing a planarizing step in the manufacturing process (a sectional view taken along the line A–A' in FIG. 45A)
Figure 50B:
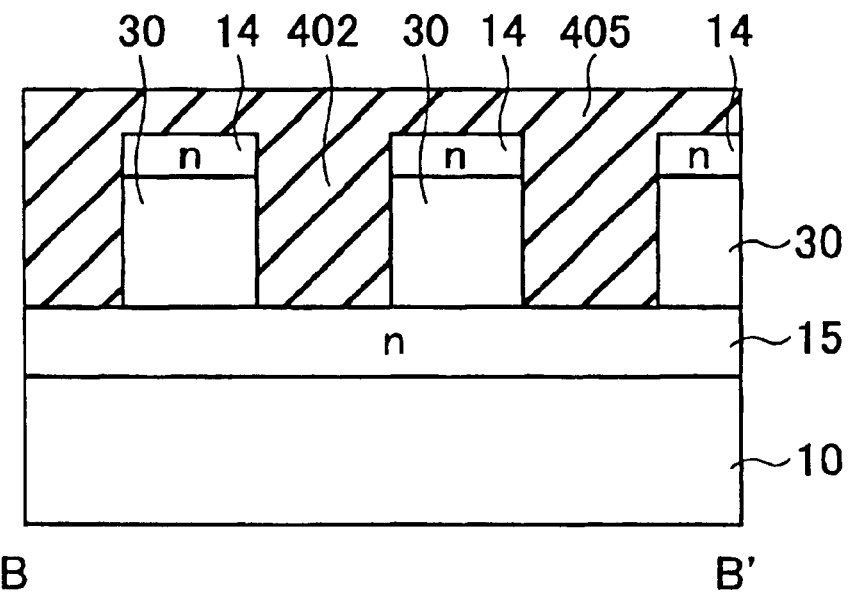
FIG. 50B is a diagram showing the planarizing step in the manufacturing process (a sectional view taken along the line B–B' in FIG. 45A)

At this stage, the word lines WL1 composed of the first gate 13 formed continuously are formed on both side faces of each of the pillar silicon portions 30. Thereafter, as shown in FIG. 50A and FIG. 50B, the n-type drain region 14 is formed on the top of the silicon layer 30 by ion implantation. After the silicon oxide film 405 is deposited, this silicon oxide film 405 is planarized so that the pillar silicon portions 30 are not exposed.

Figure 51A:
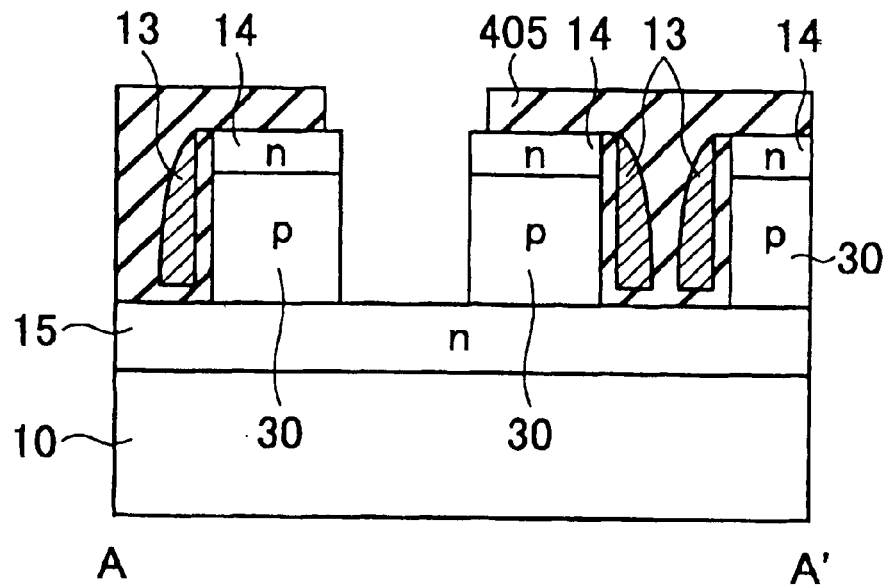
FIG. 51A is a diagram showing a gate (G2)-formed region boring step in the manufacturing process (a sectional view taken along the line A–A' in FIG. 45A)
Figure 51B:
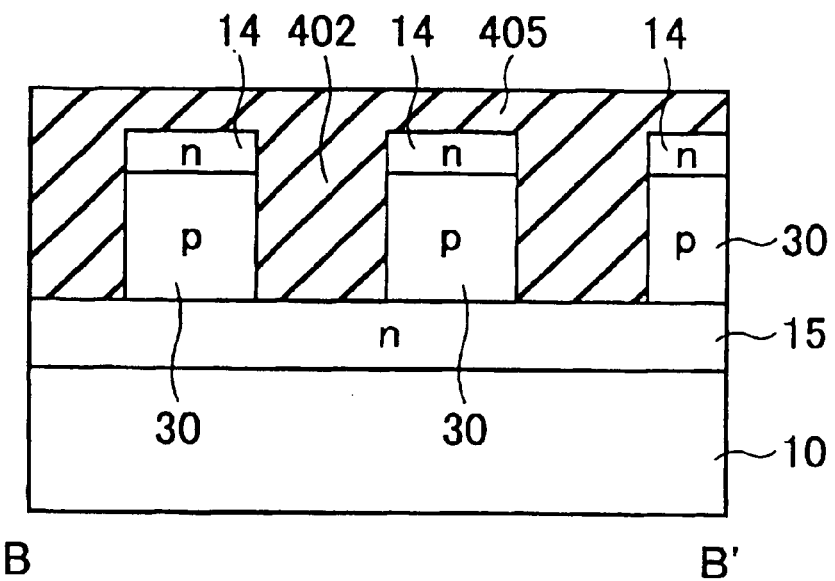
FIG. 51B is a diagram showing the gate (G2)-formed region boring step in the manufacturing process (a sectional view taken along the line B–B' in FIG. 45A)
Figure 52A:
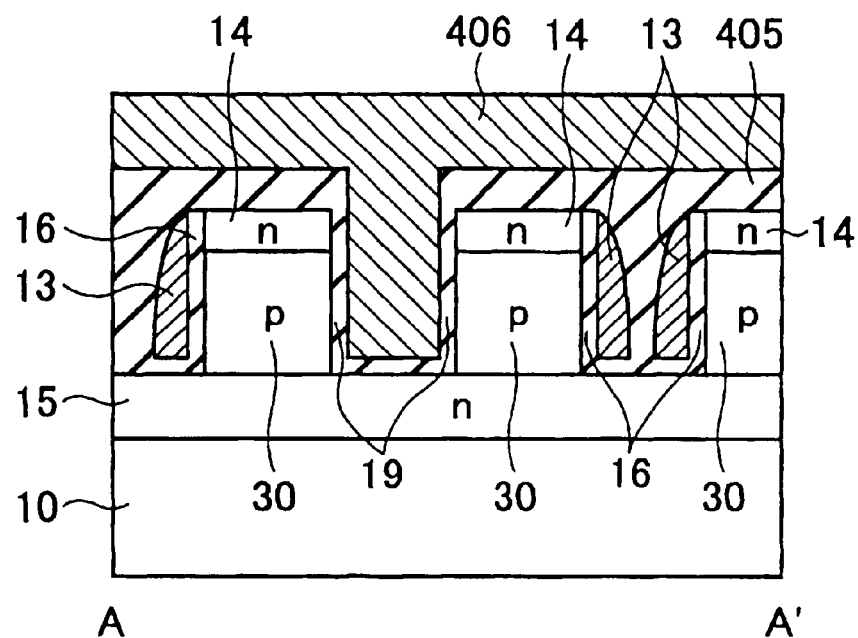
FIG. 52A is a diagram showing a gate electrode material depositing step in the manufacturing process (a sectional view taken along the line A–A' in FIG. 45A)
Figure 52B:
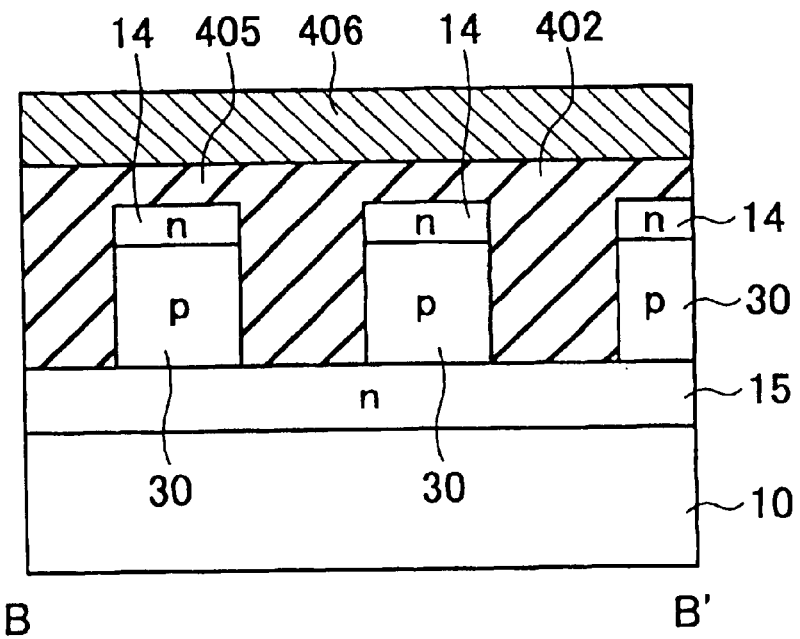
FIG. 52B is a diagram showing the gate electrode material depositing step in the manufacturing process (a sectional view taken along the line B–B' in FIG. 45A)

As shown in FIG. 51A and FIG. 51B, an opening is bored in the silicon oxide film 405 in a region where the second gates 20 are buried, and the exposed first gates 13 and the gate oxide film 16 are removed from this opening. Thereafter, as shown in FIG. 52A and FIG. 52B, the gate oxide film 19 is formed on side faces of the exposed pillar silicon portions 30, and a gate electrode material film 406 is deposited with a material different from the first gate 13.

Figure 53A:
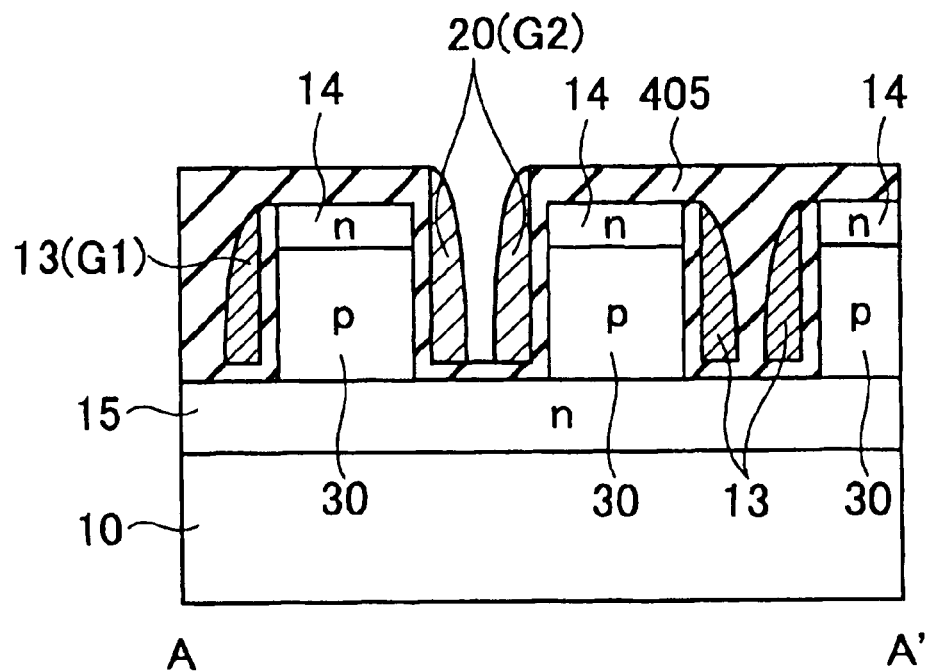
FIG. 53A is a diagram showing a gate (G2) forming step in the manufacturing process (a sectional view taken along the line A–A' in FIG. 45A)
Figure 53B:
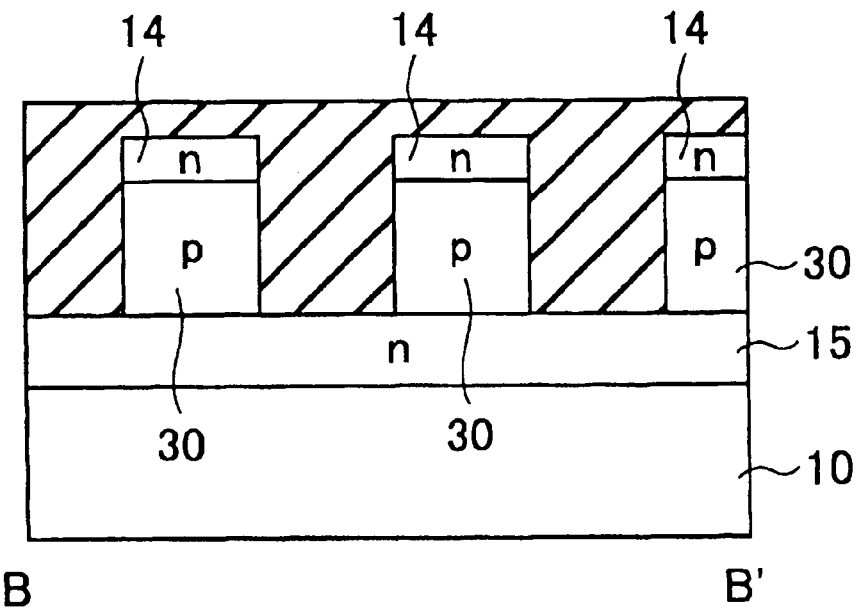
FIG. 53B is a diagram showing the gate (G2) forming step in the manufacturing process (a sectional view taken along the line B–B' in FIG. 45A)

Thereafter, as shown in FIG. 53A and FIG. 53B, the gate electrode material film 406 is etched to form the second word lines WL2 each composed of the second gate 20 formed continuously. Namely, the second gates 20 are formed by etching the gate electrode material film 406 by sidewall leaving technology. Thereafter as shown in FIG. 45B and FIG. 45C, the bit lines 18 are formed via the interlayer dielectric film 17.

Still Another Cell Array Corresponding to Fifth Embodiment

Figure 54A:
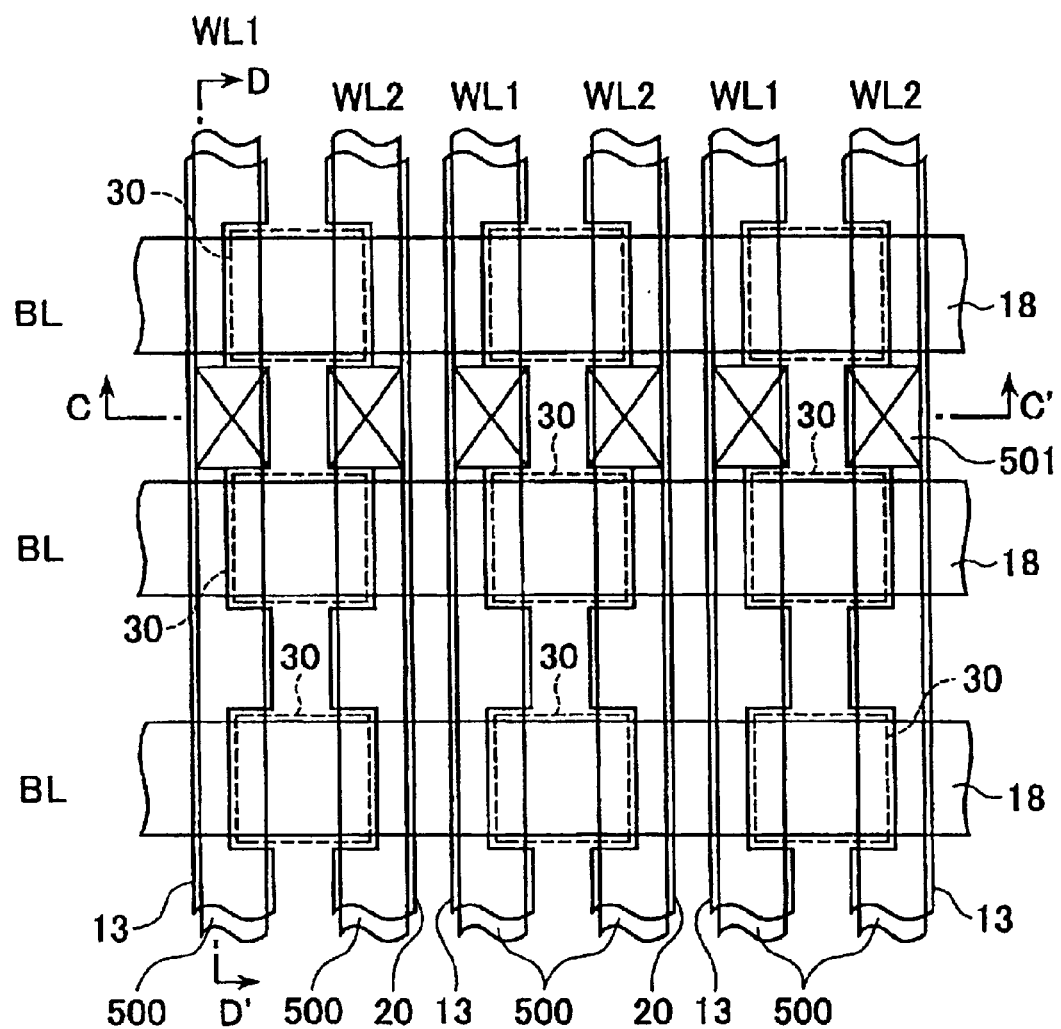
FIG. 54A is a diagram showing a layout of an embodiment in which shunt lines are added to the embodiment in FIG. 39A.
Figure 54B:
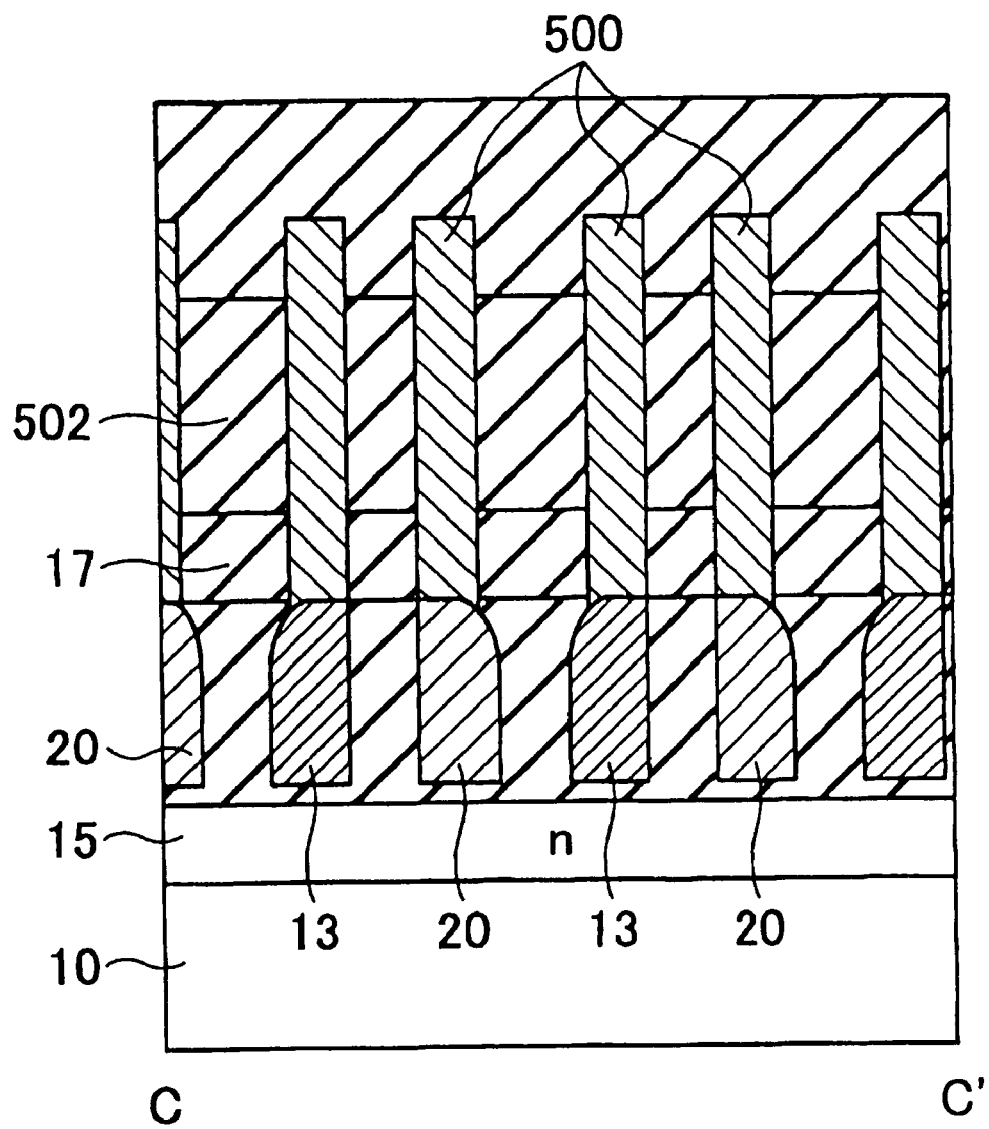
FIG. 54B is a sectional view taken along the line A–A' in FIG. 54A.
Figure 54C:
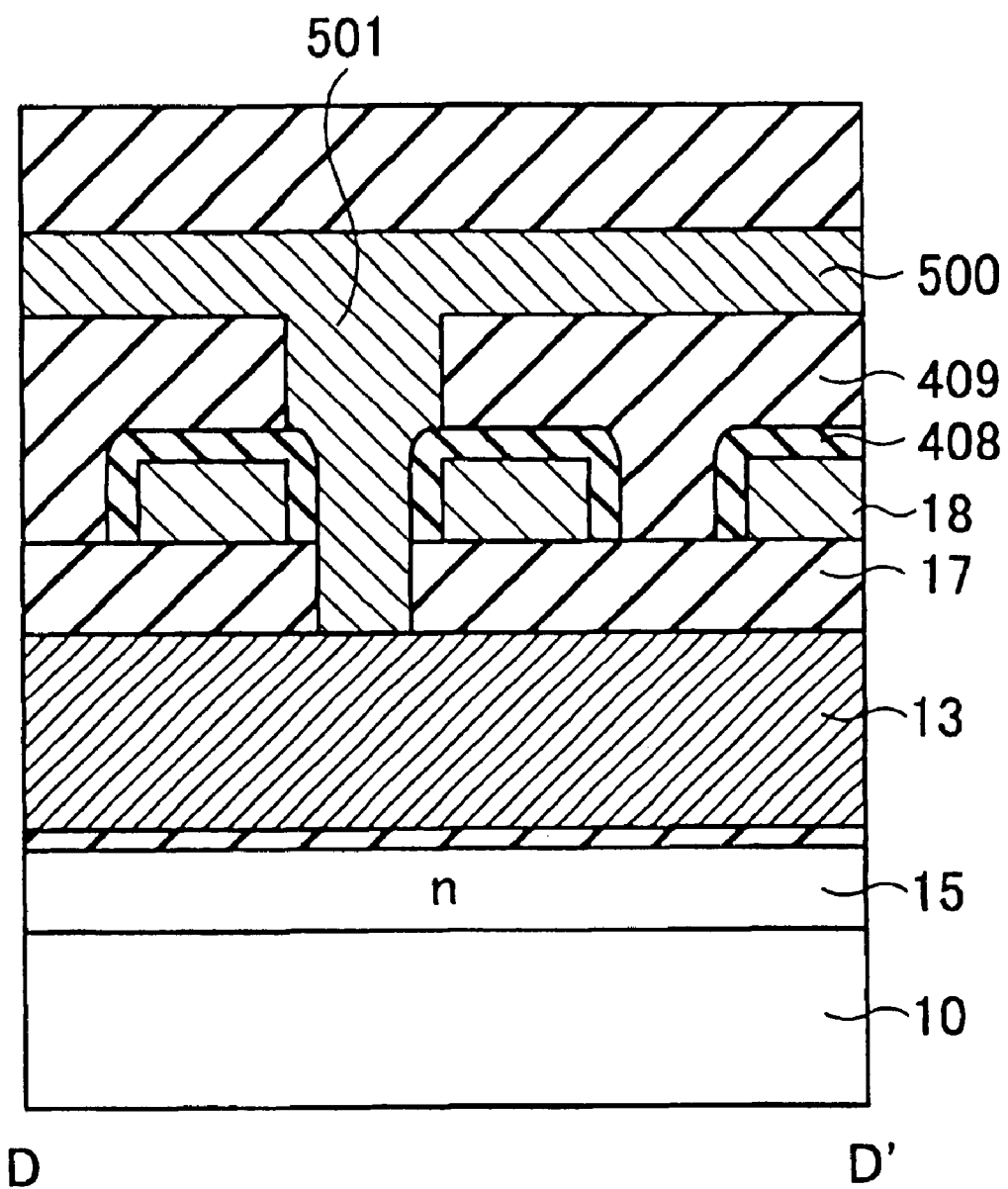
FIG. 54C is a sectional view taken along the line B–B' in FIG. 54A.

FIG. 54A is a diagram showing the layout of an embodiment in which shunt lines to lower the resistance of the word lines WL1 and WL2 are added to the cell array in the embodiment in FIG. 39A. FIG. 54B shows its section taken along the line C–C', and FIG. 54C shows its section taken along the line D–D'. Namely, after the same cell array that is explained is FIG. 39A to FIG. 39C is formed, an interlayer dielectric film 409 is formed on the bit lines 18, and shunt lines 500 are formed on the interlayer dielectric film 409.

Contact holes 501 which reach the first and second gates 13 and 20 through the interlayer dielectric films 409 and 17 are formed between the appropriate bit lines 18 to bring the shunt lines 501 into contact with the gates 13 and 20 through these contact holes 501. On this occasion, each of the bit lines 18 is covered with the silicon nitride film 408 in order that the contact holes are formed between the bit lines 18 by self-alignment.

By forming such shunt lines 500, signal transmission delay of the word lines WL1 and WL2 can be reduced.

Figure 55A:
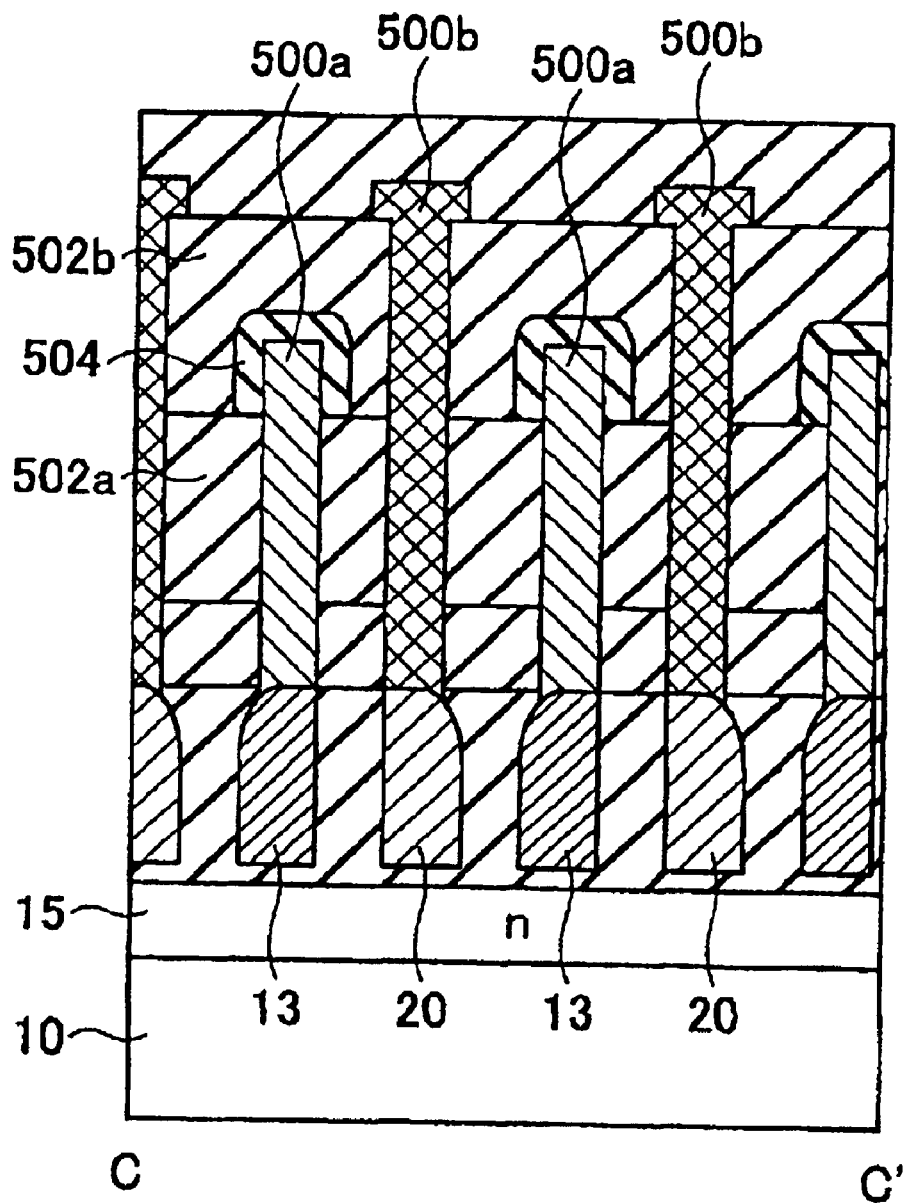
FIG. 55A is a sectional view taken along the line A–A' in FIG. 54A when a different structure of shunt lines is used.
Figure 55B:
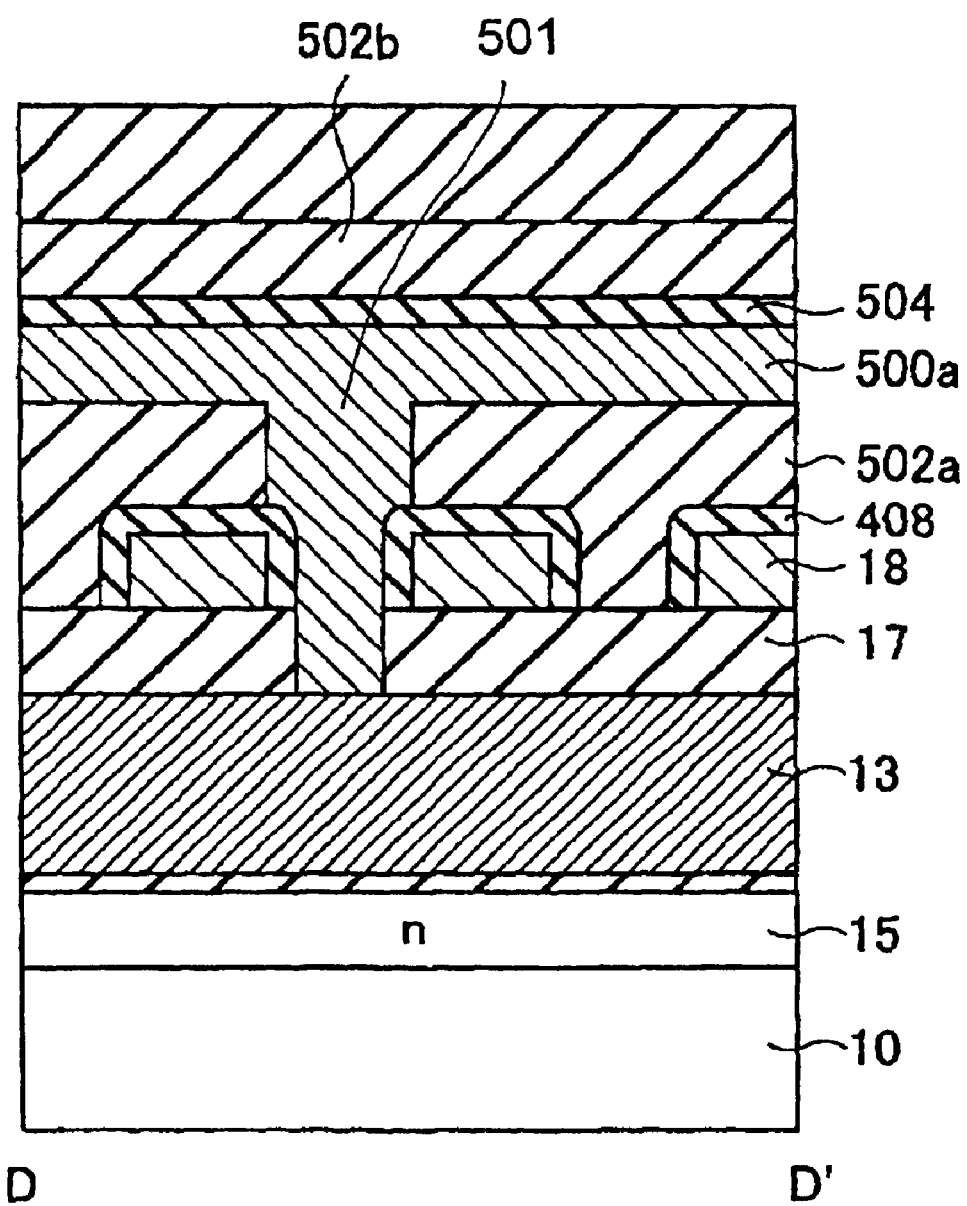
FIG. 55B is a sectional view taken along the line B–B' in FIG. 54A when the different structure of shunt lines is used.

FIG. 55A and FIG. 55B show a case where shunt line layers or their materials for the word line WL1 (the first gate 13) and the word line WL2 (the second gate 20) are different in FIG. 54B and FIG. 54C. In this case, the contact holes 501 for the first gates 13 are first formed in an interlayer dielectric film 502a covering the bit lines 18, and first shunt lines 500a are formed.

Subsequently, an interlayer dielectric film 502b is deposited, contact holes for the second gates 20 are bored in this interlayer dielectric film 502b, and second shunt lines 500b are formed. In this case, each of the first shunt line 500a is covered with the silicon nitride film 504 so that each of the second shunt lines 500b is formed between the first shunt lines 500a without a short circuit.

Incidentally, the same shunt lines may be formed also in a cell array in which the word lines WL1 and WL2 are formed with different materials as shown in FIG. 45A to FIG. 45C. On this occasion, if materials for the shunt line for the first gate 13 and the shunt line for the second gate 20 are different likewise with the gate electrode materials, the shunt line structure in FIG. 55A and FIG. 55B can be applied. In this case, however, since two of the first word lines WL1 and two of the second word lines WL2 are alternately disposed, also in respect of the shunt lines, the shunt lines are formed with different materials alternately for two lines each.

Simulation of Cell Corresponding to First Embodiment

Figure 61:
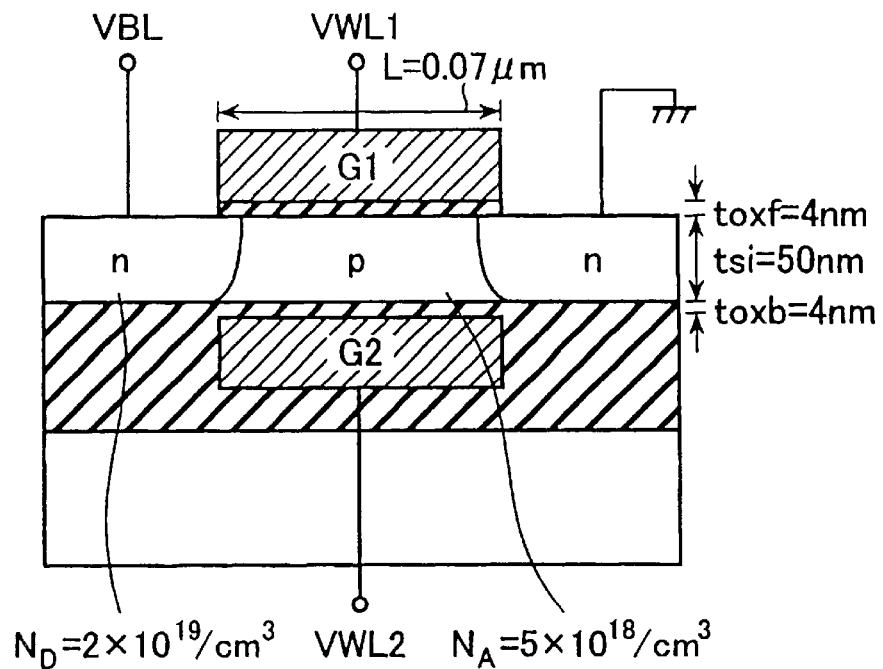
FIG. 61 is a diagram showing device parameters used for simulation of the cell in the embodiment in FIG. 3.

Next, the result of two-dimensional device simulation of the DRAM cell corresponding to the first embodiment explained in FIG. 3 will be explained. FIG. 61 shows device parameters, the p-type silicon layer (channel body) has a thickness of tSi=50 nm and an acceptor concentration of $N_A = 5 \times 10^{18}/cm^3$, the source and drain diffusion regions have a donor concentration of $N_D = 2 \times 10^{19}/cm^3$. The main gate G1 and the auxiliary gate G2 both are made of $p^+$-type polycrystalline silicon, the gate length is L=0.07 μm, and both a gate oxide film thickness toxf on the main gate G1 side and a gate oxide film thickness toxb on the auxiliary gate G2 side are toxf=toxb=4 nm.

Figure 62:
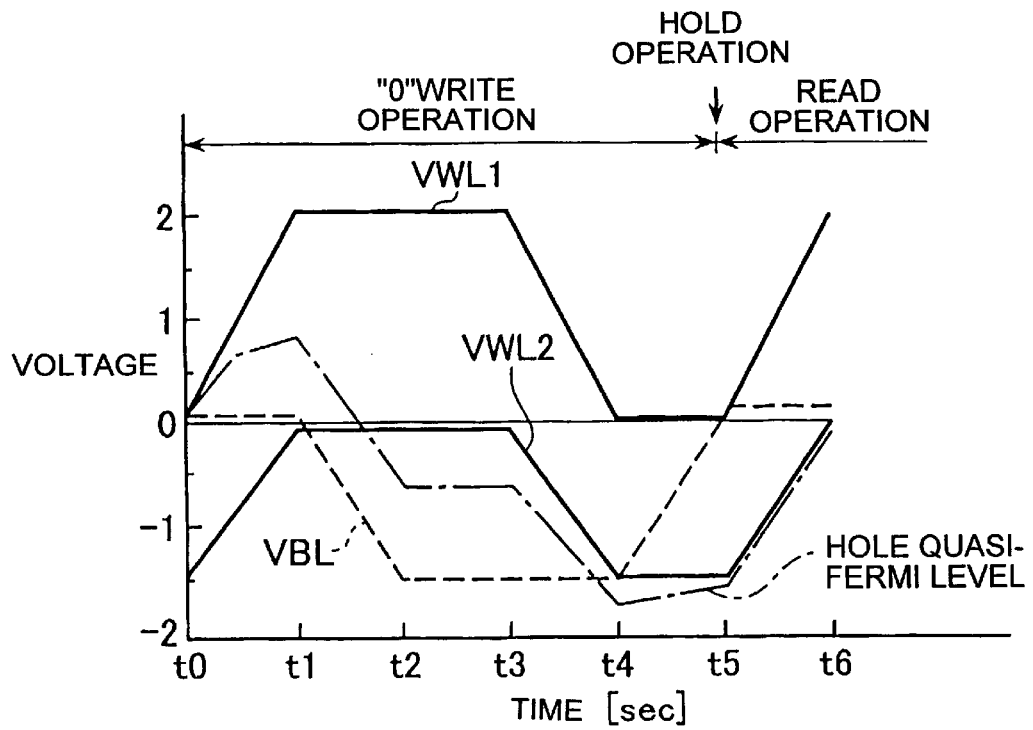
FIG. 62 is a diagram showing voltage waveforms of a "0" write operation and the succeeding read operation in the simulation.

FIG. 62 shows the result of simulation of the "0" write operation and the succeeding read operation. At the time of the write operation, an amplitude of VWL1=0 V to 2 V is given to the main gate G1, an amplitude of VWL2=−1.5 V to 0 V is given to the auxiliary gate G2, and VBL=−1.5 V is applied to the drain (bit line). The write operation is performed from a point in time t0 to a point in time t5, the data hold operation is performed at a point in time t5 (only at a point), and thereafter the read operation is performed. FIG. 62 shows the hole quasi-Fermi level of the channel body in these operations.

If the hole quasi-Fermi level is regarded as the potential of the channel body, it is −1.6 V at the time of the data hole operation (the point in time t5).

Figure 63:
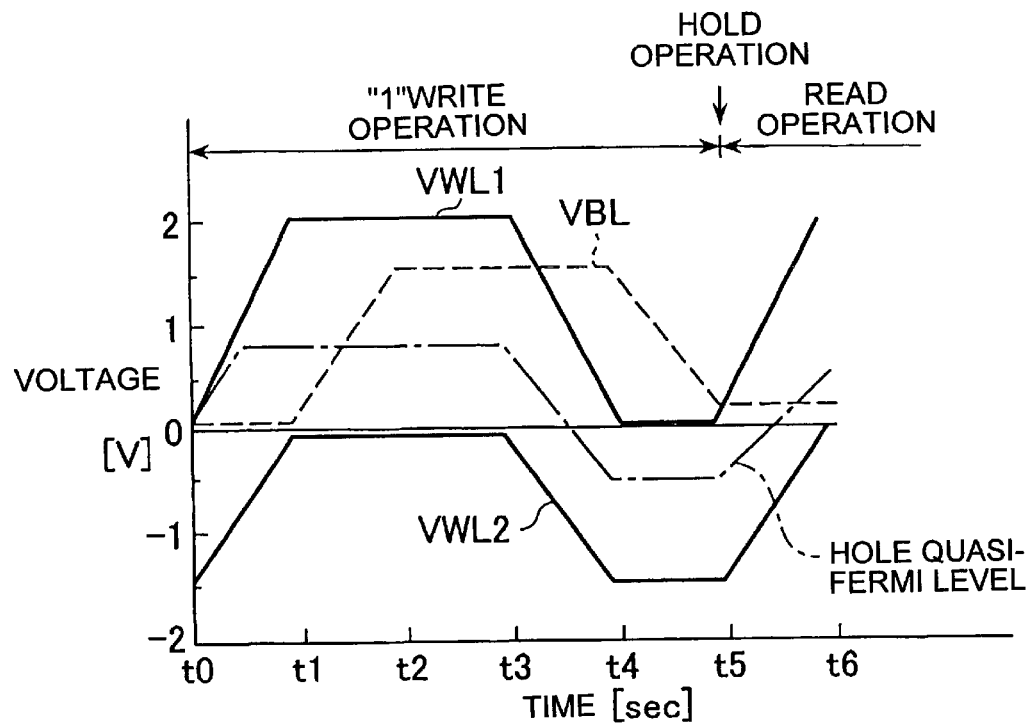
FIG. 63 is a diagram showing voltage waveforms of a "1" write operation and the succeeding read operation in the simulation.

FIG. 63 shows the result of simulation of the "1" write operation and the succeeding read operation. At the time of the write operation, an amplitude of VWL1=0 V to 2 V is given to the main gate G1, an amplitude of VWL2=−1.5 V to 0 V is given to the auxiliary gate G2, and VBL=1.5 V is applied to the drain (bit line). In this case, the channel body potential, at the time of the data hold operation (the point in time t5)$_2$ is −0.6 V.

Figure 64:
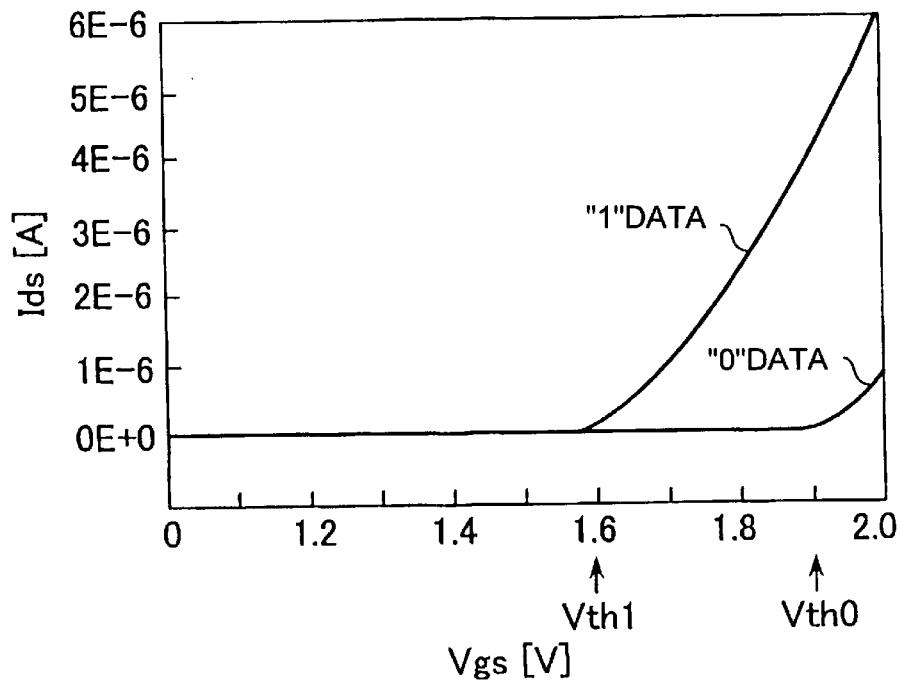
FIG. 64 is a diagram showing a drain current-gate voltage characteristic of the cell at the time of "0" and "1" data write operations in the simulation.

The aforementioned results reveal that the potential difference of channel body between data "0" and "1" is 1 V, and that the data read operation is possible by using threshold difference due to this substrate bias effect. FIG. 64 shows the relation between a drain current Ids and a gate voltage Vgs at the time of the "0" and "1" data read operations. The threshold of the "1" data is Vth1=1.6 V, and the threshold of the "0" data is Vth0=1.9 V, whereby a threshold difference ΔVth=300 mV is obtained.

An important point of the aforementioned cell operations is whether the data of the selected cell can be inverted from "1" to "0" without the "1" data of the non-selected cells (which maintain the main gate at 0 V and the auxiliary gate at −1.5 V) connected to the selected bit line (VBL=−1.5 V) being destroyed at the time of the "0" write operation. The necessary condition therefor is that the channel body potential of the "1" data cell in the hold state is equal to or lower than the channel body potential of the "0" write operation data cell. In the aforementioned example, the body potential of the "1" data cell is −0.6 V in the hold state, while the body potential at the time of the "0" data write operation (a point in time t3) is −0.75 V, and hence it is reversed slightly (0.15 V), but it does not cause data destruction.

The reason why the auxiliary gate G2 is varied in synchronization with the main gate G1 with an offset of 2 V is that capacitive coupling of each gate to the channel body is made larger than that in the case of the main gate G1 only or in the case where the auxiliary gate G2 has a fixed potential, thereby improving the following characteristic of the channel body to the gate and lowering the channel bodies of non-selected "1" data cells along the selected bit line to a level at which they are not destroyed. Thereby, the hold level of the main gate G1 can be at 0 V, and the word line amplitude can be kept below 2 V.

Figure 65:
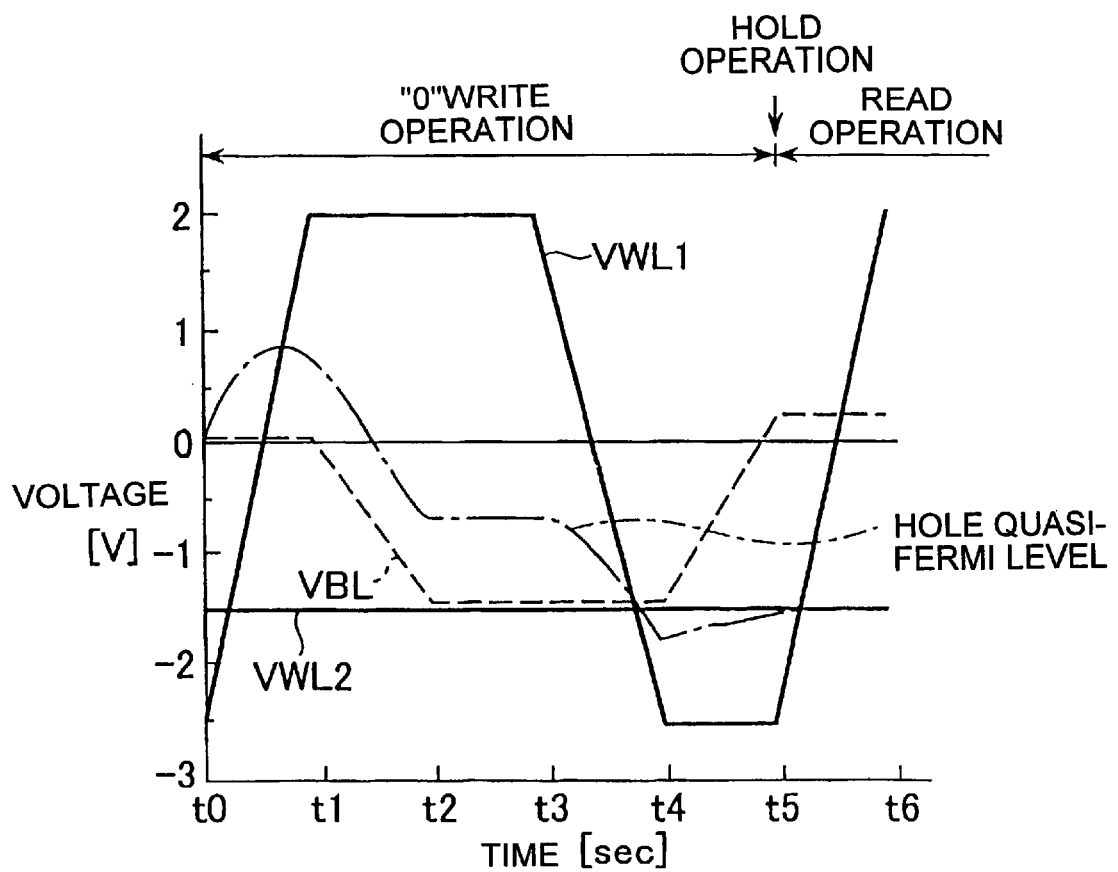
FIG. 65 is a diagram showing voltage waveforms of a "0" write operation and the succeeding read operation in simulation in which an auxiliary gate is set at a fixed potential.
Figure 66:
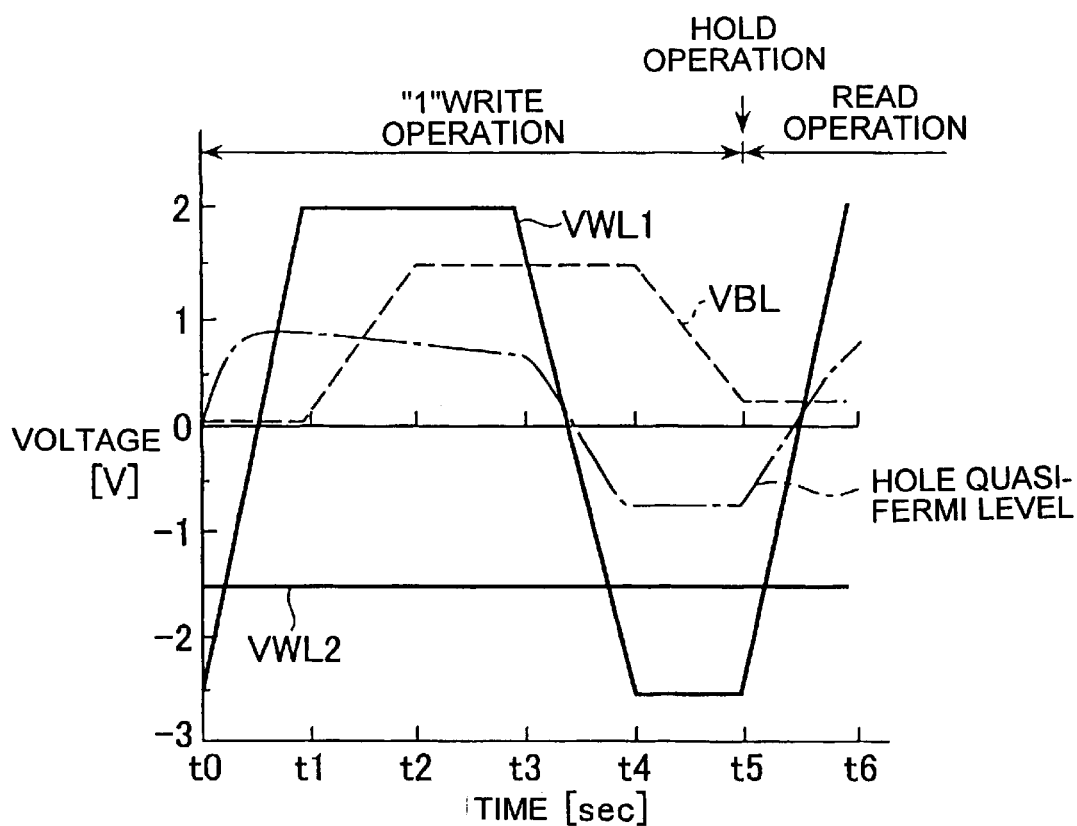
FIG. 66 is a diagram showing voltage waveforms of a "1" write operation and the succeeding read operation in the simulation.
Figure 67:
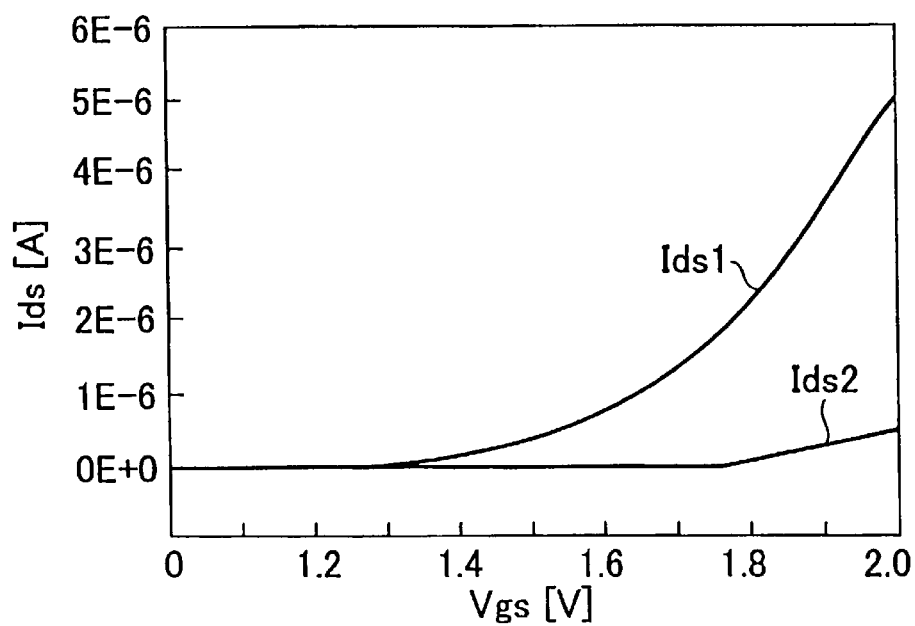
FIG. 67 is a diagram showing a drain current-gate voltage characteristic of the cell at the time of "0" and "1" data write operations in the simulation.

For reference, the result of simulation of the "0" write operation and the "1" write operation when the auxiliary gate G2 is set at a fixed potential (VWL2=−1.5 V) is shown in FIG. 65, FIG. 66, and FIG. 67 corresponding to FIG. 62, FIG. 63, and FIG. 64. The main gate G1 has an amplitude of VWL1=−2.5 V to 2 V.

From this result, when the auxiliary gate G2 is fixed, the channel body potential of the "1" data can not be lowered to −0.7 V unless the main gate G1 is lowered to −2.5 V at the time of the data hold operation. Accordingly, varying the potential of the auxiliary gate in synchronization with that of the main gate is effective in reducing the voltage.

The case where both the main gate G1 and the auxiliary gate G2 are made of $p^+$-type polycrystalline silicon is explained above, but $n^+$-type polycrystalline silicon also can be used. Especially, the use of the $n^+$-type polycrystalline silicon only on the main gate G1 side is desirable in further reducing the voltage. Namely, if the main gate G1 is made of the $n^+$-type polycrystalline silicon, the potential of the main gate G1 is shifted to the negative side by 1 V. At the time of the "0" write operation, the bit line is −1.5 V, and hence the gate-drain maximum voltage is 2.5 V. If the bit line potential at the time of the "0" write operation can be increased to −1 V, the maximum voltage applied to the gate insulating film becomes 2.0 V, resulting in a reduction in voltage.

Cell Array and Manufacturing Process in Sixth Embodiment

Figure 68C:
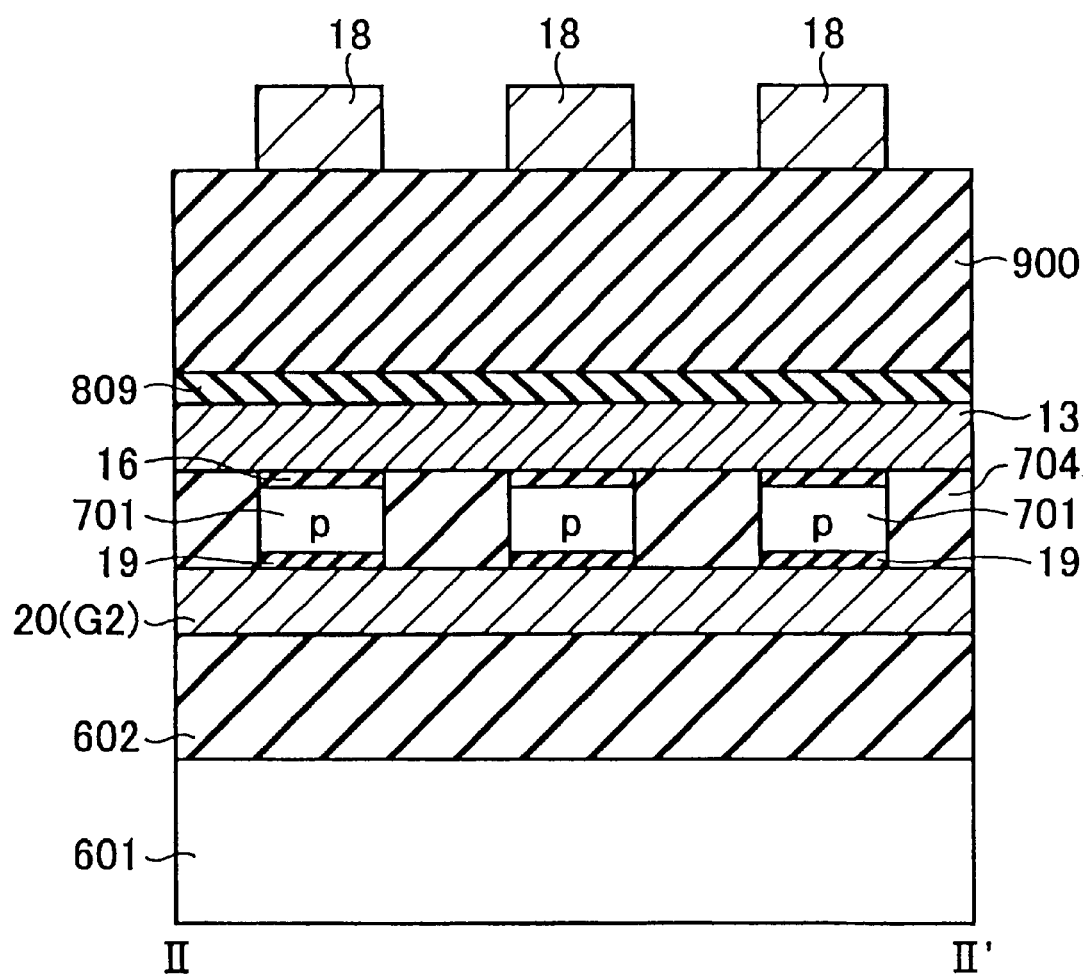
FIG. 68C is a sectional view taken along the line II–II" in FIG. 68A.

Although the cell array with a cell area of 4 $F^2$ is briefly explained in the first embodiment in FIG. 3 to FIG. 6, the sixth embodiment which further embodies the first embodiment will be explained next. FIG. 68A is a layout of a cell array according to the sixth embodiment, FIG. 68B shows its sectional view taken along the line I–I', and FIG. 68C is its sectional view taken along the line II–II'.

In this embodiment, a memory cell array composed of MIS transistors each with a double gate structure is made using stuck substrates of two silicon substrates 601 and 701. The auxiliary gates (G2) 20 are formed as the word lines WL2 each continuing in one direction on a surface of a first silicon substrate 601 with an insulating film 602 of a silicon oxide film layer therebetween. However, the auxiliary gates 20 are pattern-formed after the silicon substrate 601 has been stuck in a state in which a gate electrode material film was formed over the entire surface. These auxiliary gates 20 are isolated by insulating films 803 and 804.

The second silicon substrate 701 is stuck in a state in which the gate insulating film 19 is formed on surfaces of the auxiliary gates 20. The thickness of the silicon substrate 701 is adjusted after it is stuck, and stripe-shaped device-formed regions each continuing in the bit line direction are demarcated. In each of the device-formed regions, the main gate (G1) 13 is pattern-formed as the word line WL1 continuing in parallel with the auxiliary gate 20 with the gate insulating film 16 therebetween. Although its concrete process will be explained later in detail, trenches to isolate the auxiliary gates 20 are formed after the substrate is stuck, an insulating film and a semiconductor layer are buried in each of the isolation trenches, and then the auxiliary gates 20 and the self-aligned main gates 13 are buried.

The upper face and side faces of the main gate 13 are covered with silicon nitride films 809 and 807 each being a protective film with a selective etching ratio larger than the interlayer dielectric film and the like. The drain and source diffusion regions 14 and 15 are formed in space portions between the main gates 13. The source diffusion region 15 is baked with a source line 902 which is parallel to the word lines WL1 and WL2. An interlayer dielectric film 900 such as a silicon oxide film or the like is formed on a face on which the source lines 902 are formed, and the bit lines (BL) 18 coming into contact with the drain diffusion regions 14 are formed thereon.

Figure 69:
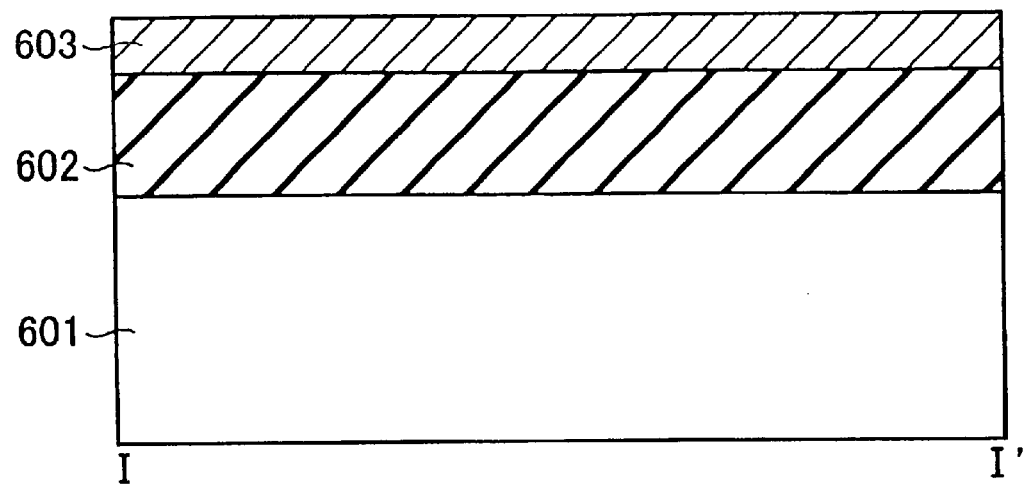
FIG. 69 is a sectional view showing a step of forming a gate electrode material film on a first silicon substrate in a manufacturing process in the embodiment.

A concrete manufacturing process will be explained referring to FIG. 69 to FIG. 91. In the following explanation, sectional views mainly corresponding to the section in FIG. 68B are used. First, as shown in FIG. 69, the insulating film 602 such as a silicon oxide film is formed on the first silicon substrate 601, and a gate electrode material film 603 such as a polycrystalline silicon film is deposited thereon. The gate electrode material film 603 becomes the auxiliary gates 20 after being patterned later.

Figure 71:
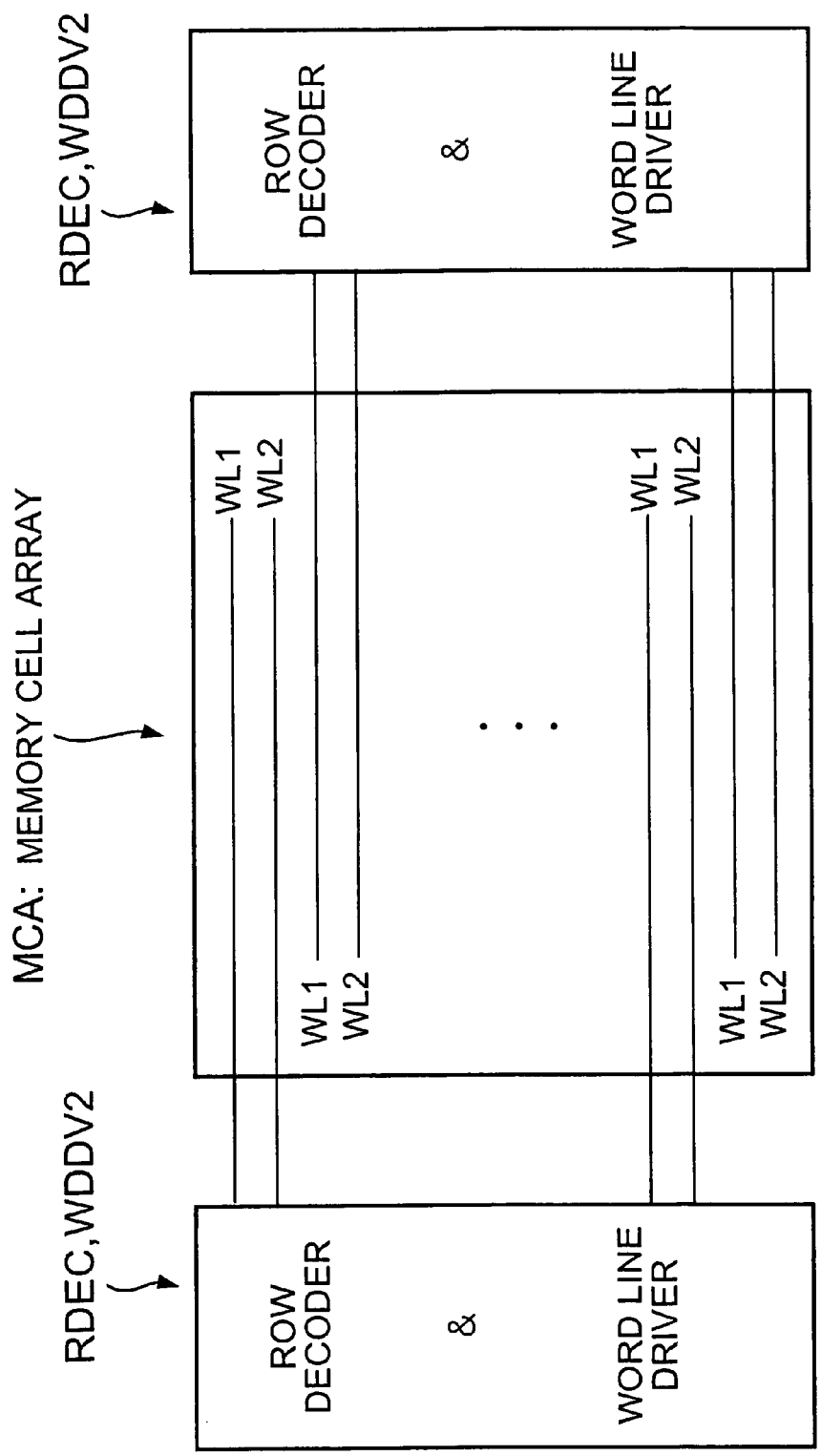
FIG. 71 is a sectional view showing a substrate sticking step in the manufacturing process.
Figure 70:
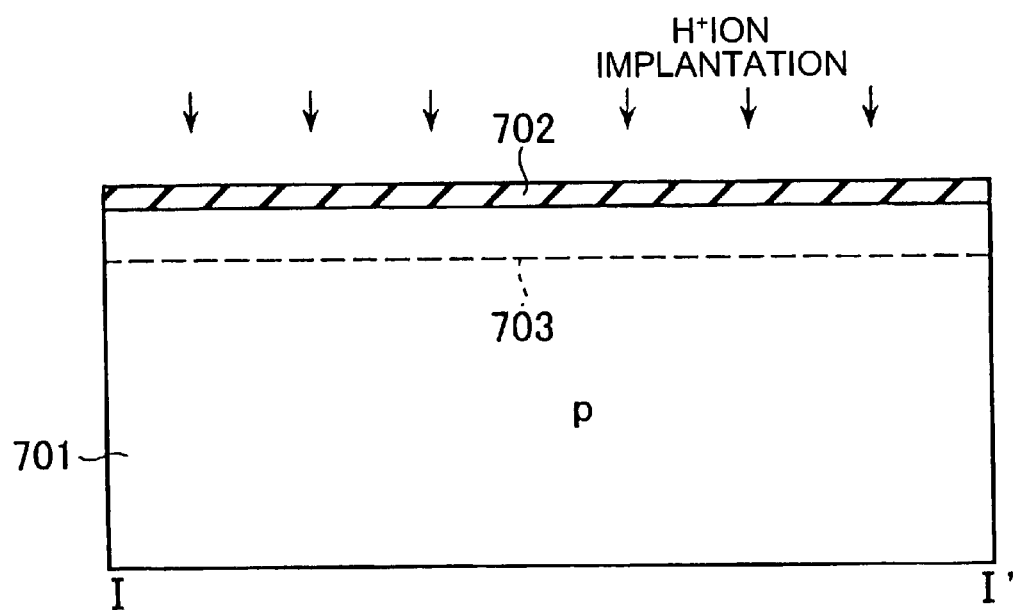
FIG. 70 is a sectional view showing a step of implanting hydrogen ions into a second silicon substrate in the manufacturing process.
Figure 71:
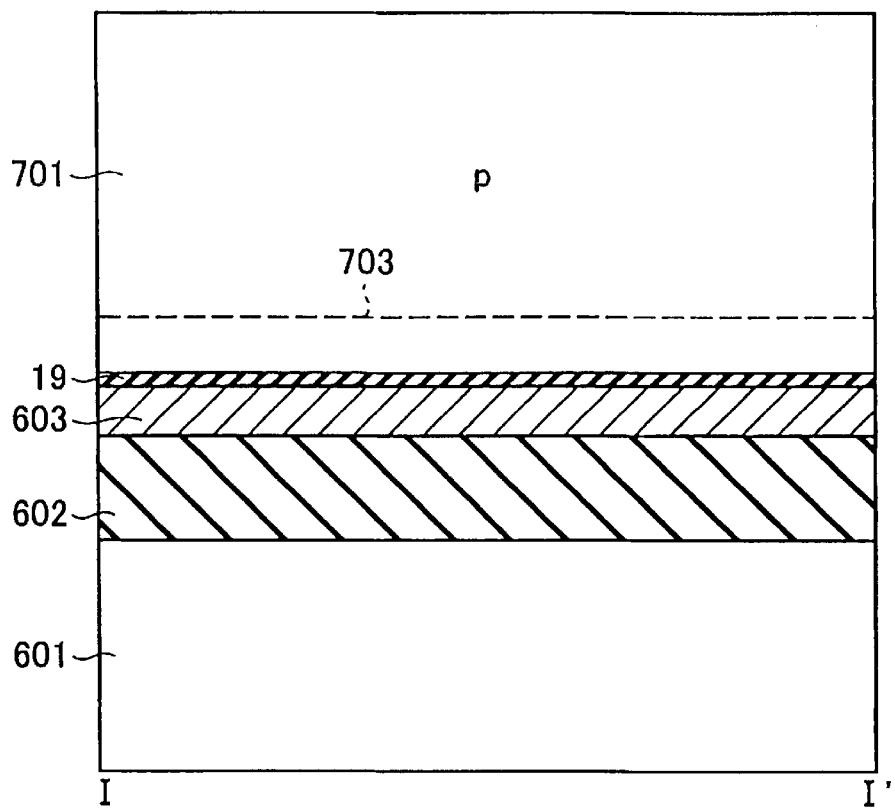
Figure 72:
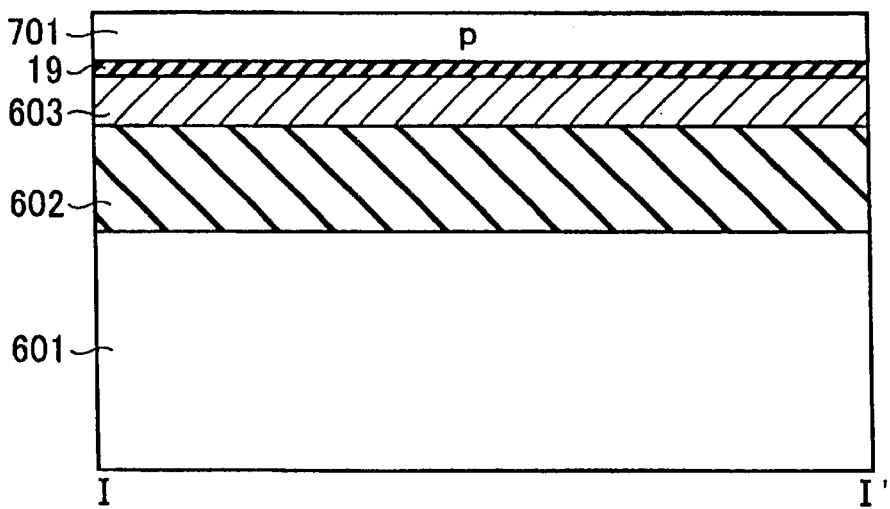
FIG. 72 is a sectional view showing a step of adjusting the thickness of the stuck substrate in the manufacturing process.

Meanwhile, as shown in FIG. 70, a sacrificial oxide film 702 is formed on the second silicon substrate 701, and an ion implantation layer 703 is formed at a predetermined depth by implanting $H^+$ ions into the second silicon substrate 701. The sacrificial oxide film 702 of the second silicon substrate 701 is removed, and the gate insulating film 19 such as a silicon oxide film is formed as shown in FIG. 71. Thereafter, a face of the gate insulating film 19 of the second silicon substrate 19 is bonded to a face of the gate electrode material film 603 of the first silicon substrate 601. After the bonding of the substrates, the second silicon substrate 701 is peeled off from the position of the ion implantation layer 703, and as shown in FIG. 72, the silicon substrate 701 the thickness of which is adjusted is left as an active device region (See M. Bruel: Electronics Letters, Vol. 31, p. 1201, 1995).

Figure 73A:
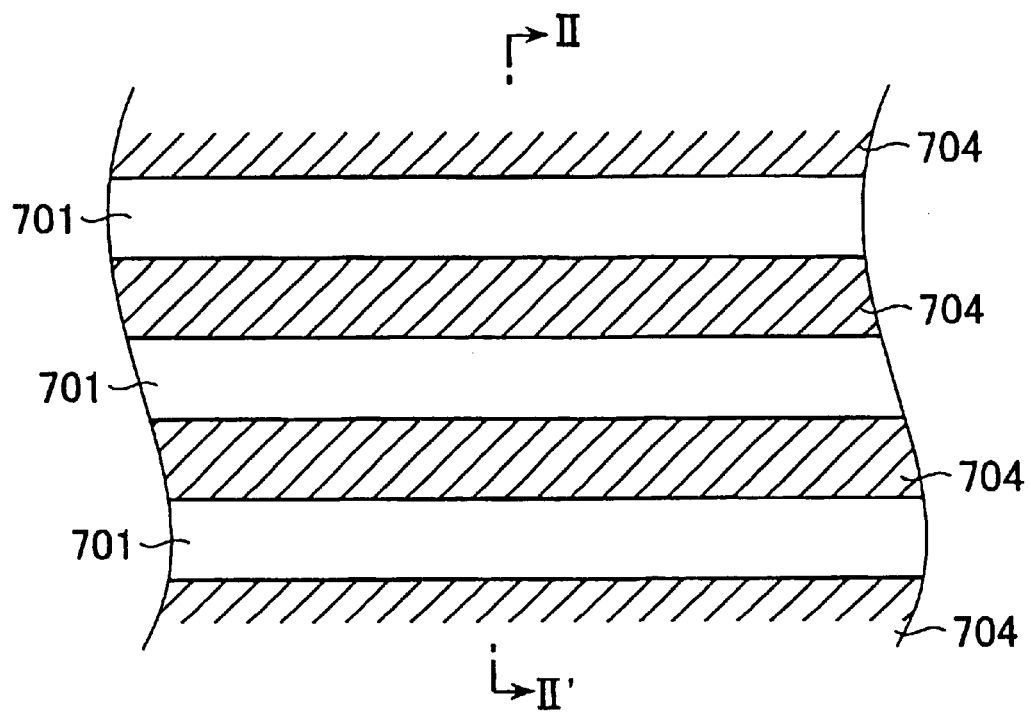
FIG. 73A is a plan view showing a device isolating step in the manufacturing process.
Figure 73B:
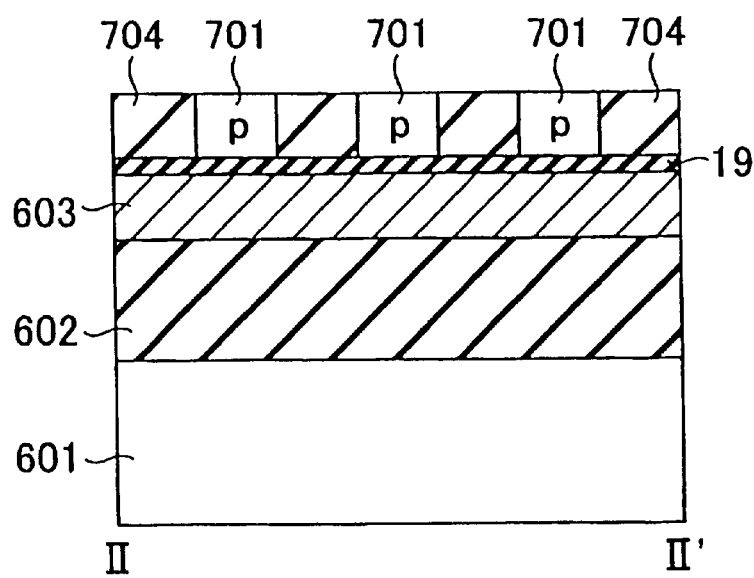

Thereafter, a device isolation insulating film is formed in the silicon substrate 701. Its situation is shown in FIG. 73A and FIG. 73B. FIG. 73A is a plan view, and FIG. 73B is its sectional view taken along the line II–II' (corresponding to the section in FIG. 68C). Namely, by a STI (Shallow Trench Isolation) method, stripe-shaped plural device-formed regions each continuing in the bit line direction are demarcated while being arranged with a predetermined pitch therebetween in the word line direction by burying a device isolation insulating film 704 deep to reach the gate insulating film 19.

Figure 74:
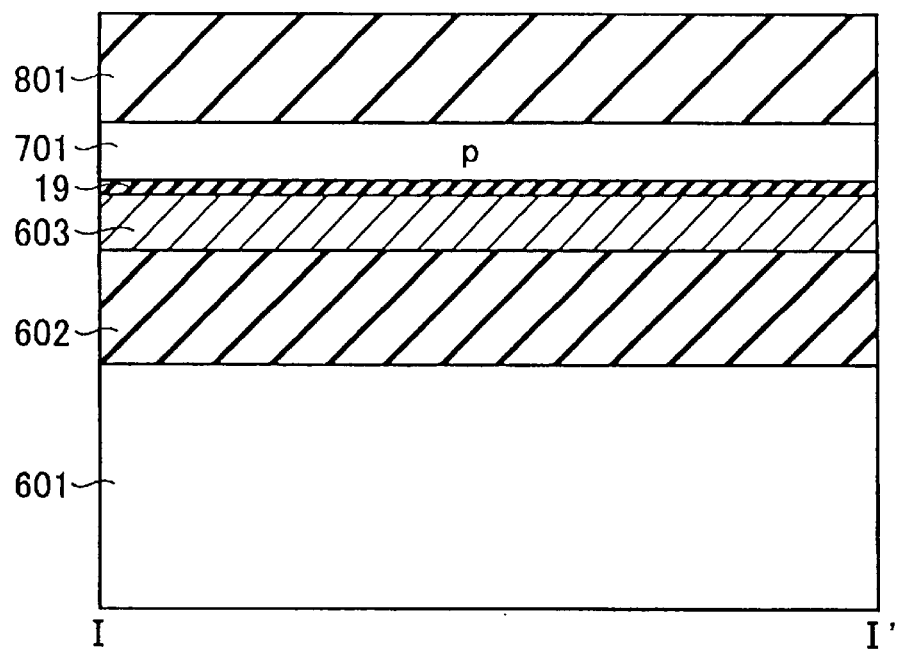
Figure 75:
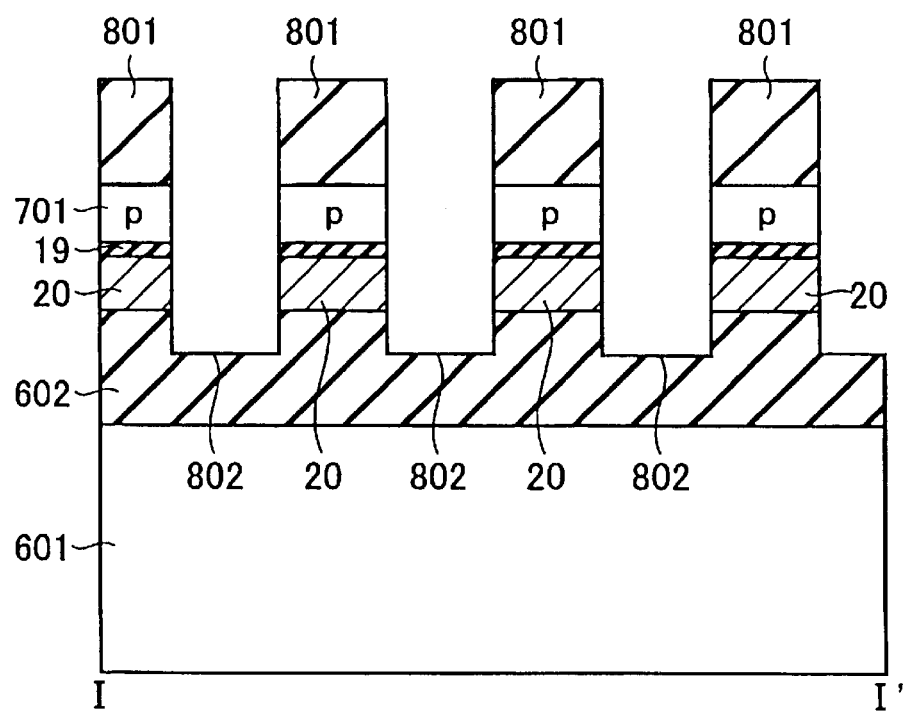

As shown in FIG. 74, an insulating film 801 such as a silicon oxide film is deposited on the silicon substrate 701 thus device-isolated. As shown in FIG. 75, the insulating film 801 is pattern-formed as dummy gates (dummy word lines), and with this as a mask, the silicon substrate 701, the gate insulating film 19, and the gate electrode material film 603 are sequentially etched to form isolation trenches 802. This isolation trench etching is stopped halfway in the insulating film 602. Thereby the gate electrode material film 603 is patterned as the auxiliary gates 20 continuing as the word lines WL2.

Figure 76:
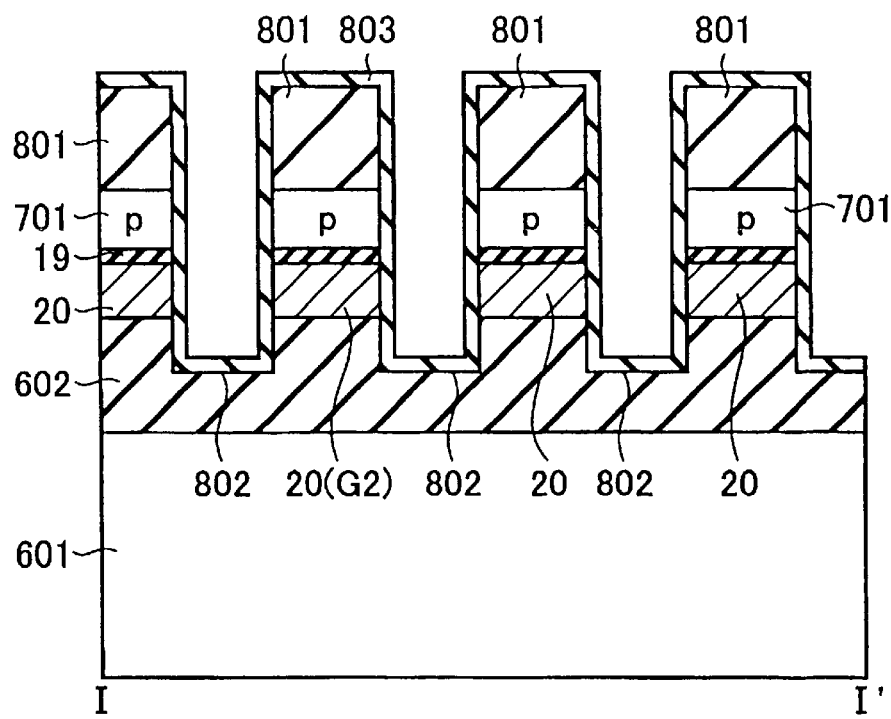
Figure 77:
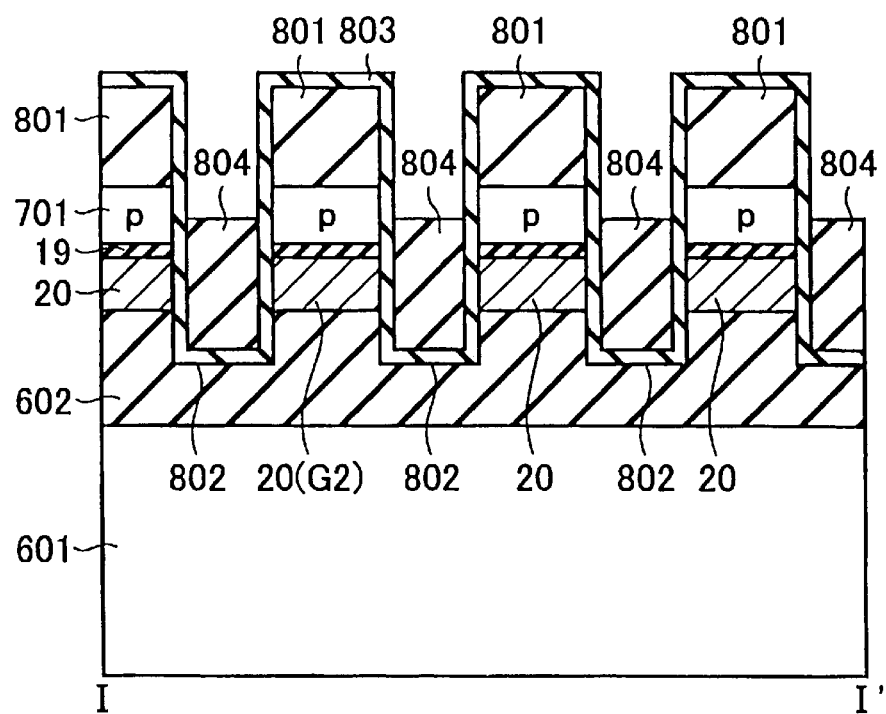

Thereafter, after a thin silicon nitride film 803 is deposited over the entire face as shown in FIG. 76, a silicon oxide film 804 is buried in each of the isolation trenches 802 as shown in FIG. 77. This is achieved by depositing the silicon oxide film and etching the entire face. The top face of the buried silicon oxide film 804 is positioned in the middle of the thickness of the silicon substrate 701.

Figure 78:
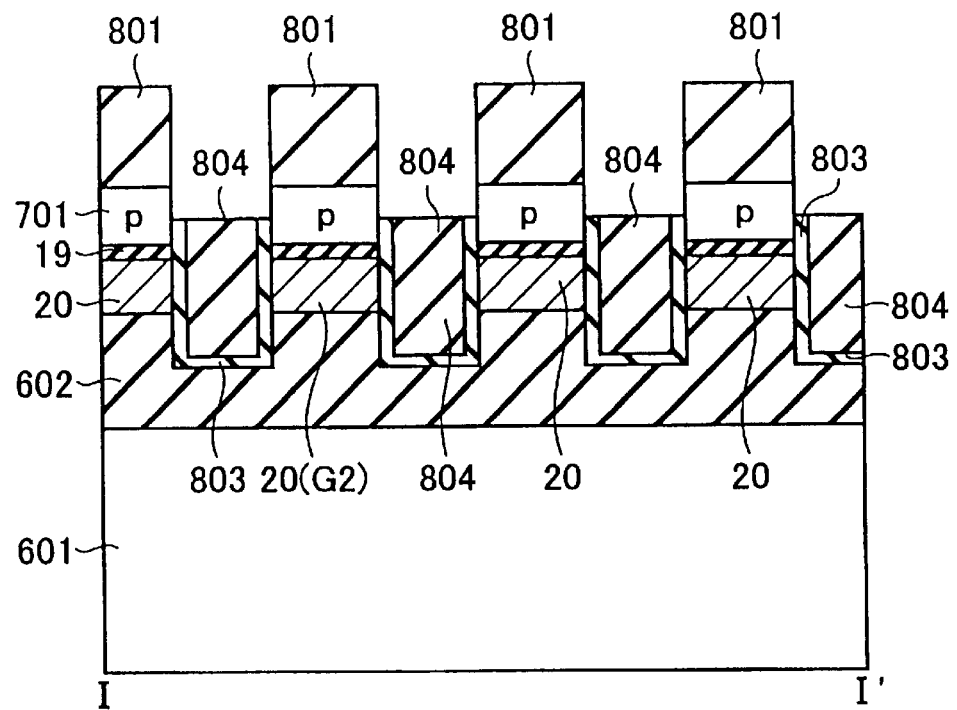
Figure 79:
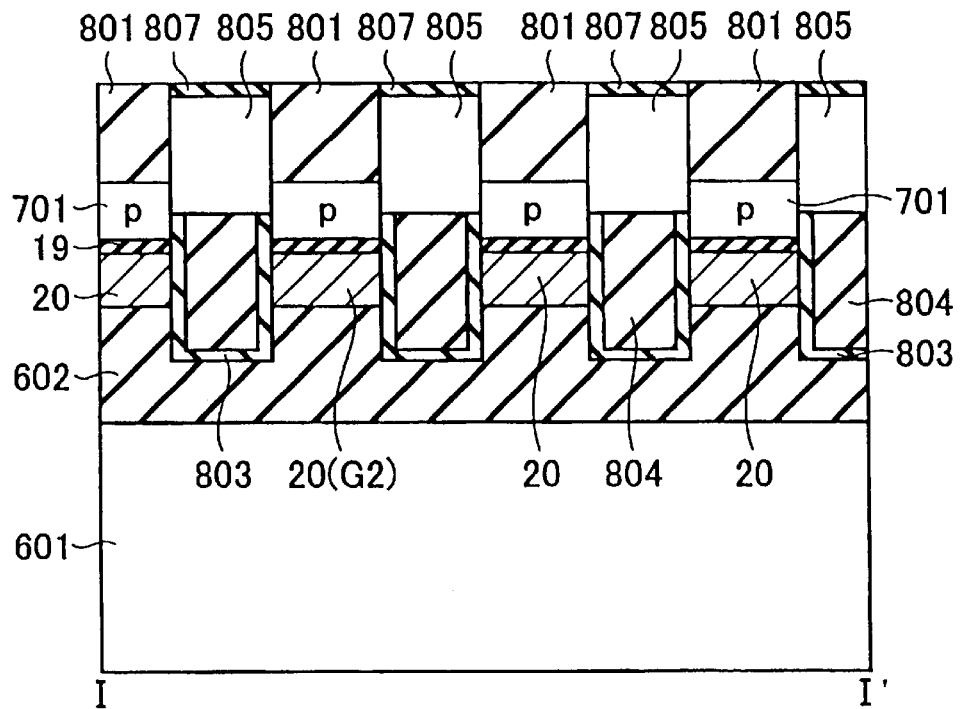

Subsequently, as shown in FIG. 78, the silicon nitride film 803 higher than the buried silicon oxide film 804 is removed by etching, and side faces of the silicon substrate 701 are exposed to the isolation trenches 802. In this state, as shown in FIG. 79, a silicon layer 805 is grown epitaxially in each of the isolation trenches 802. The silicon layer 805 has high crystallizability by crystal growth from the side faces of the silicon substrate 701. The silicon layer 805 is formed continuously in a direction parallel to the word line, that is, in a direction orthogonal to the longitudinal direction of the stripe-shaped device-formed regions, and covered with a silicon nitride film 807.

Incidentally, the silicon layer 805 is used for the source and drain regions and does not always need to be a high-quality crystal; for example, a polycrystalline silicon layer; may be buried, instead.

Figure 80:
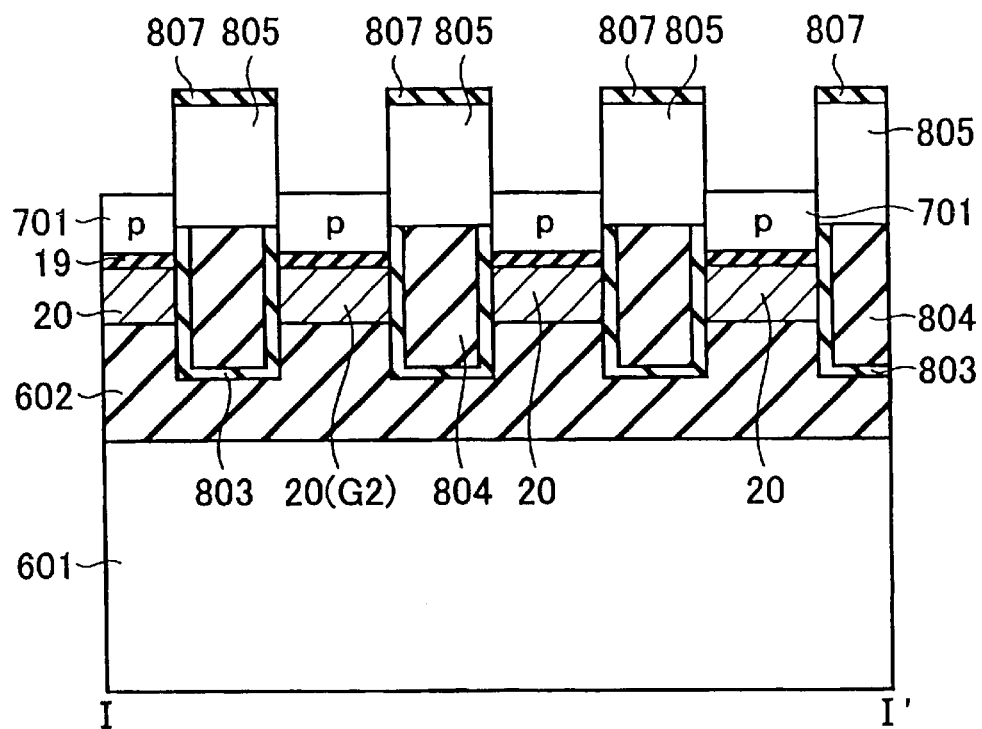
Figure 81:
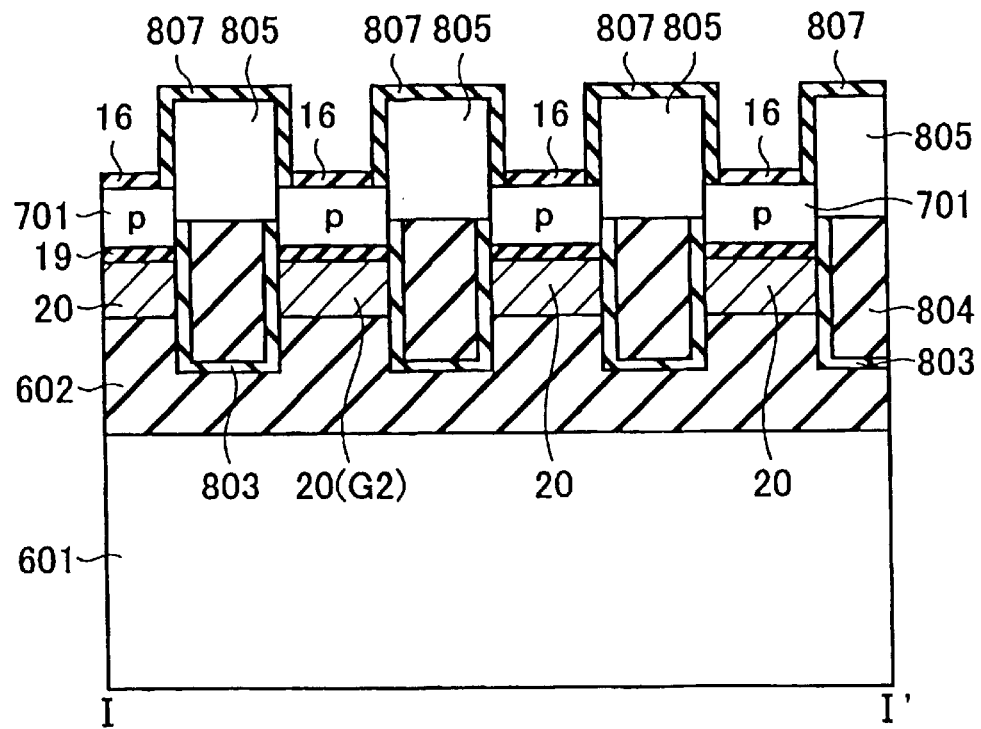
Figure 82:
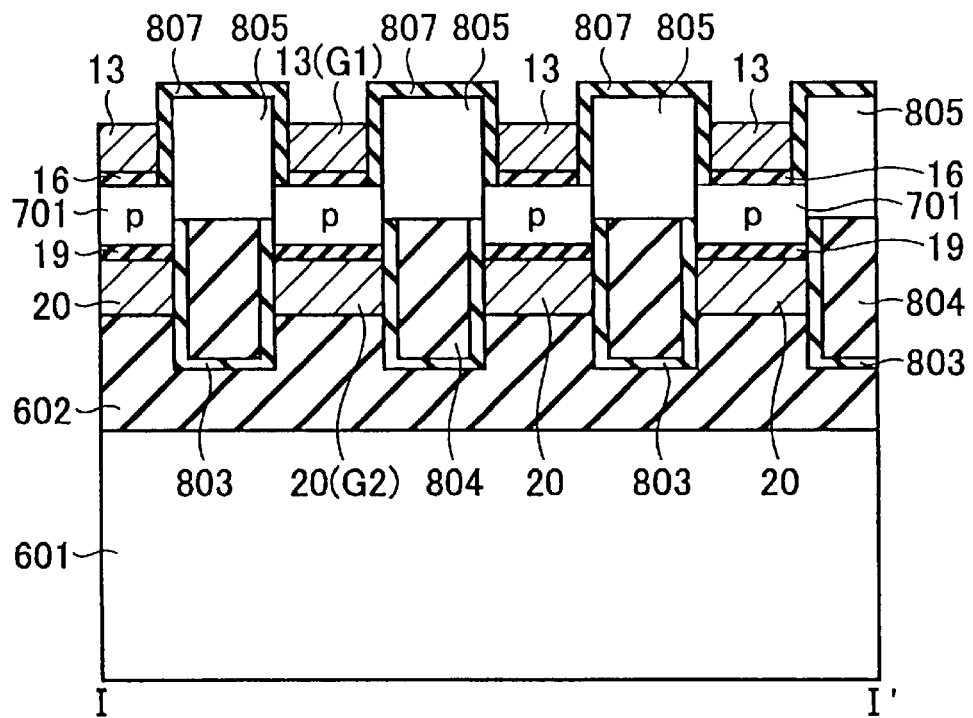

Then, as shown in FIG. 80, the silicon oxide film 81 used for the dummy word lines is removed by etching. After a silicon nitride film is formed on each side wall of the silicon layer 805 as shown in FIG. 81, the gate insulating film 16 such as a silicon oxide film is formed on the surface of the silicon substrate 701 exposed at the bottom by the removal of the silicon oxide film 801. As shown in FIG. 82, the main gates (G1) 13 continuing as the word lines WL1 are formed in spaces in the silicon layer 805 by being buried. Thus, the main gates 13 on the upper face of the silicon substrate 701 and the auxiliary gates 20 on the lower face thereof are self-aligned and pattern-formed respectively as the word lines WL1 and WL2 in the direction orthogonal to the longitudinal direction of the device-formed regions.

Figure 83:
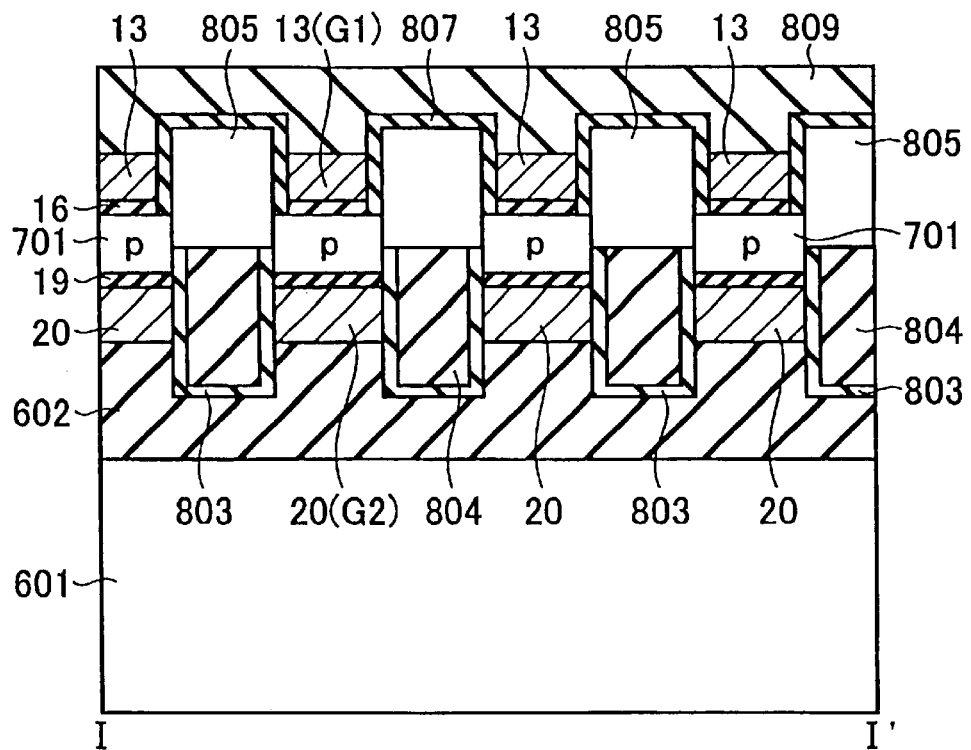

Thereafter, a silicon nitride film 809 is deposited over the entire surface and planarized as shown in FIG. 83. The silicon nitride films 809 and 807 are etched overall until the silicon layer 805 is exposed. FIG. 84A is a plan view showing this state, and FIG. 84B is its sectional view taken along the line I–I'. Hence, a state in which the silicon layer 805 is exposed while the upper face and side faces of each main gate 13 are covered with the silicon nitride films 809 and 807 can be obtained.

At this stage, the silicon layer 805 continues in a stripe form in a space between the word lines (the main gates 13 and the auxiliary gates 20). The silicon layer 805 is the drain and source diffusion regions as stated above, and at least the drain diffusion regions need to be isolated in the word line direction. Accordingly, by the STI method, a device isolation insulating film 905 is buried in each of regions where the drain diffusion regions are formed in the silicon layer 805 as shown in FIG. 85. The device isolation insulating film 905 is buried at the same pitch as the device isolation insulating film 704 explained before in 73A.

Thereafter, n-type impurities are ion-implanted to form the drain and source diffusion regions 14 and 15 deep to reach the silicon oxide film 804 at the bottom of the silicon layer 805 as shown in FIG. 86. The drain diffusion regions 14 are formed at intervals in the word line direction, and the source diffusion regions 15 continue in the word line direction to become a common source line. However, it is suitable to form the aforementioned device isolation insulating film 905 also in each of the source diffusion regions 15, whereby the source diffusion regions 15 are formed at intervals in the word line direction similarly to the drain diffusion regions 14.

Subsequently, as shown in FIG. 87, an interlayer dielectric film 900a such as a silicon oxide film is deposited. As shown in FIG. 88, stripe-shaped wiring trenches 901 each continuing in the word line direction are formed at positions corresponding to the source diffusion regions 15 of the interlayer dielectric film 900a by lithography and etching. Then, the source lines 902 are buried in the respective wiring trenches 901 by deposition of a polycrystalline silicon film and etching as shown in FIG. 89. Thanks to these source lines 902, the resistance of the source diffusion regions 15 is lowered when being formed continuously, and when the source diffusion regions are formed at intervals, they are connected jointly.

Thereafter, as shown in FIG. 90, an interlayer dielectric film 900b such as silicon oxide film is deposited. After trenches to bury the bit lines and contact holes 903 are formed by the dual damascene method as shown in FIG. 91, the bit lines 18 are buried as shown in FIG. 68B.

As described above, according to this embodiment, by the use of the bonded SOI substrate, the main gates 13 and the auxiliary gates 20 above and below the MIS transistors can be pattern-formed as the word lines WL1 and WL2 while being self-aligned. If the word lines WL1 and WL2 and the bit lines BL are formed with the width and pitch of a minimum feature size F, a cell array having a unit cell area of $4F^2$ is obtained as shown by the alternate long and short dash line in FIG. 68A. Moreover, the upper face and side faces of each of the main gates 13 are covered with the silicon nitride films 809 and 807, and hence the source lines 902 buried in the interlayer dielectric film 902a are self-aligned with the main gates 13 covered with the silicon nitride films and can be brought into contact with the source diffusion regions 15. The contact of the bit lines is also self-aligned with the main gates 13. Accordingly, the DRAM cell array with high reliability with a micro-transistor structure can be obtained.

As shown in FIG. 68B, the source line 902 is not covered with a protective film in this embodiment. The main gate 13 is covered with the silicon nitride films 809 and 807, and therefore when the bit line contact hole is formed in the interlayer dielectric film, the bit line contact hole can be self-aligned with the main gate 13 by the selective etching ratio of the interlayer dielectric film made of the silicon oxide film to the silicon nitride film. When the contact hole is made large, however, there is a possibility that a short circuit occurs between the bit line and the source line 902 by misalignment. To prevent this, it is preferable to cover the source line 902 also with a protective film such as a silicon nitride film.

Such a preferable structure is shown in FIG. 92 corresponding to FIG. 68B. The upper face and side faces of the source line 902 are covered with a silicon nitride film 905. In order to obtain this concrete structure, the following method is recommended instead of the burying method of the source lines 902 explained in FIG. 87 to FIG. 89. Specifically, in the state of FIG. 86, a laminated film of a polycrystalline silicon film and a silicon nitride film is deposited, and the source lines 902 are formed by pattern-forming the laminated film. Subsequently, a silicon nitride film is formed on each side face of the source line 902. Thus, the source line 902 covered with the silicon nitride film can be obtained.

FIG. 92 shows an example in which a bit line forming step is also different from that in the above embodiment. Specifically, the interlayer dielectric film 900 is deposited, the bit line contact holes are formed therein, and contact plugs 906 made of polycrystalline silicon or the like are buried. Thereafter the bit lines 18 are formed.

By covering the source line 902 with the silicon nitride film 905 as above, a short circuit between the bit line and the source line 902 is prevented even if the position of the bit line contact hole slightly deviates in the burying step of the contact plug 906. Accordingly, it is possible to make the bit line contact hole large and certainly bring the bit line 18 into contact with the drain diffusion region 14 at low resistance.

Modified Example of the Aforementioned Embodiments

Figure 56:
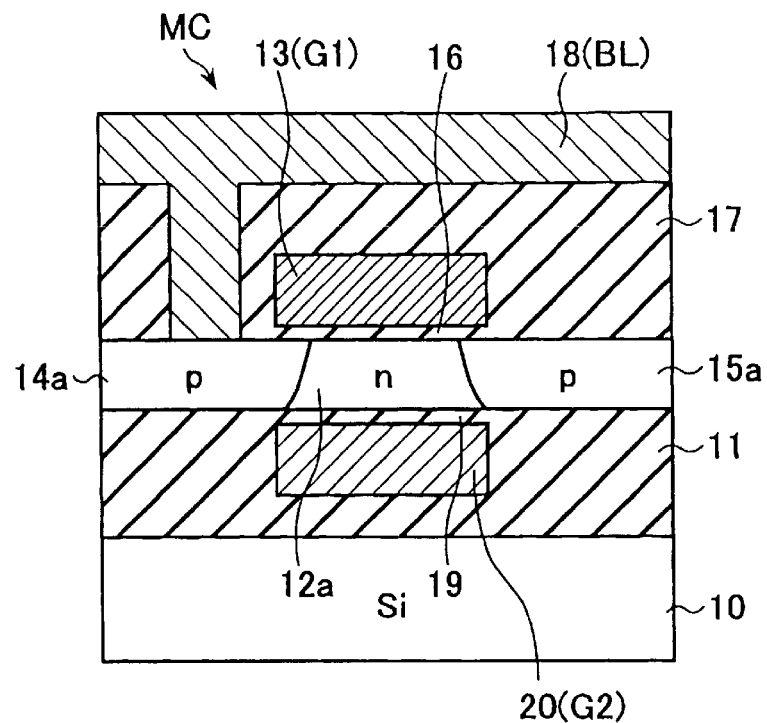
FIG. 56 is a diagram showing a memory cell structure when an n-channel type MIS transistor according to the first embodiment is modified into a p-channel type one corresponding to FIG. 3.
Figure 57:
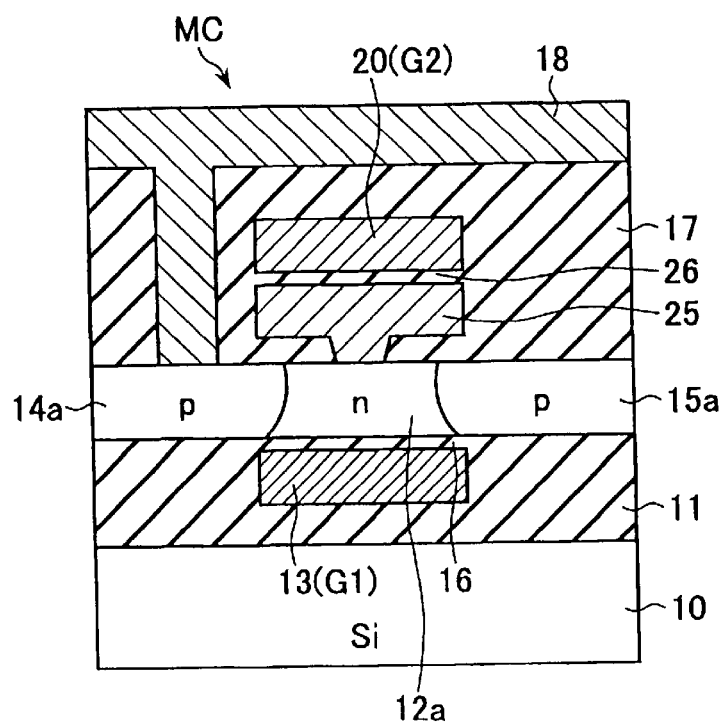
FIG. 57 is a diagram showing a memory cell structure when an n-channel type MIS transistor according to the second embodiment is modified into a p-channel type one corresponding to FIG. 8.
Figure 58:
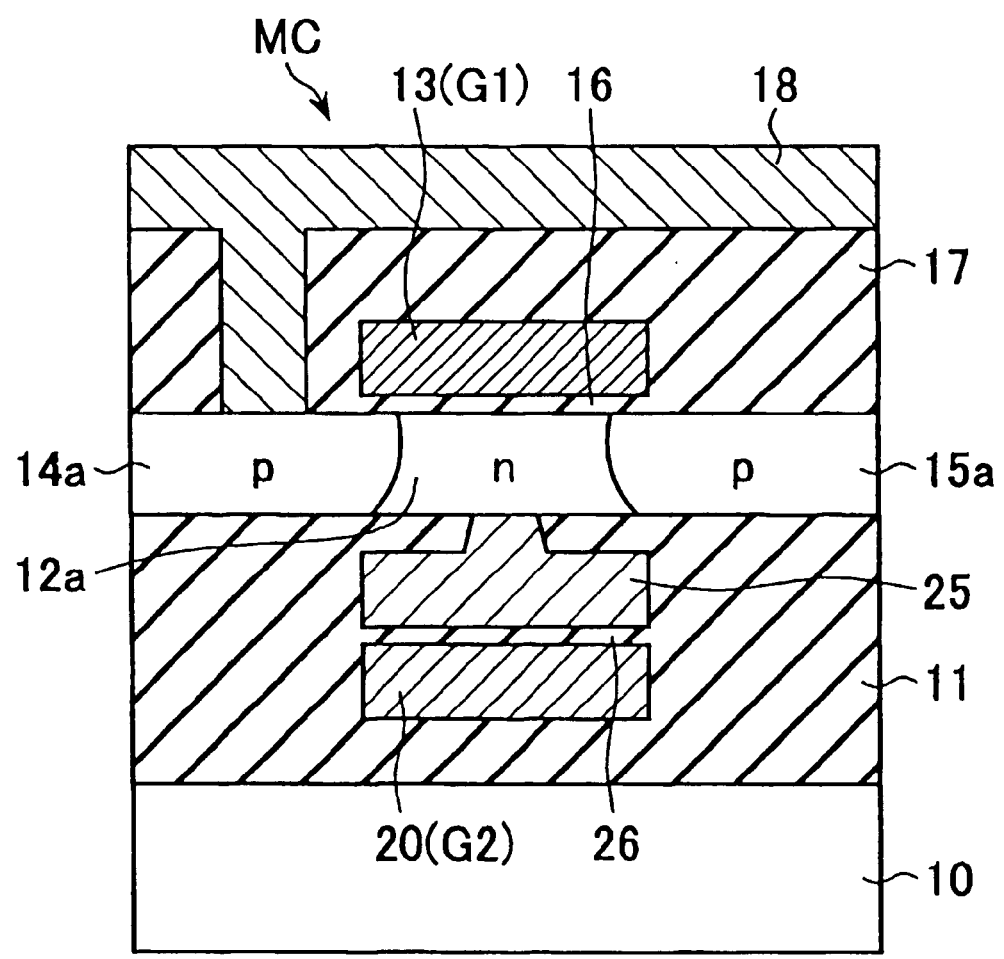
FIG. 58 is a diagram showing a memory cell structure when an n-channel type MIS transistor according to the third embodiment is modified into a p-channel type one corresponding to FIG. 9.
Figure 59A:
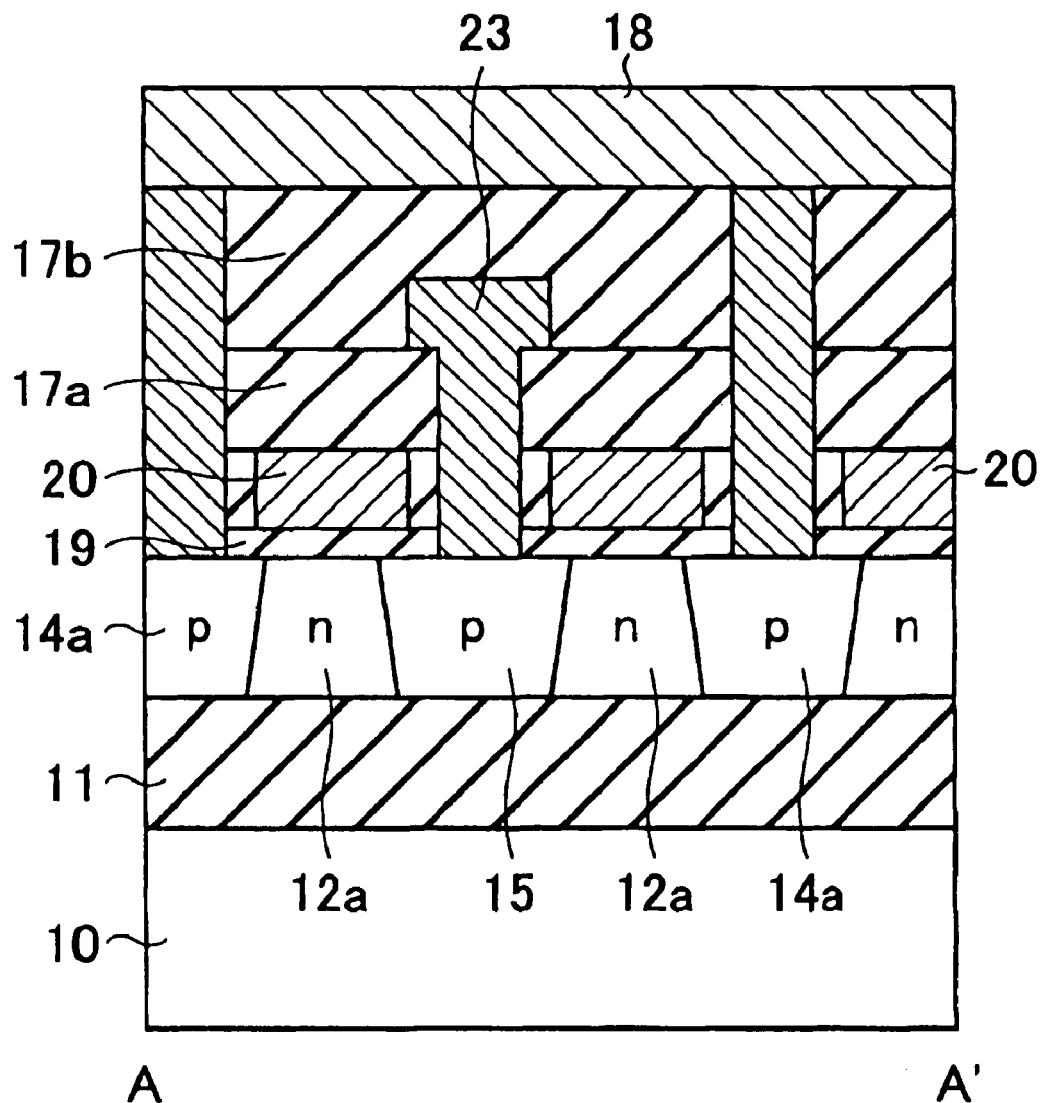
FIG. 59A is a diagram showing a memory cell structure when an n-channel type MIS transistor according to the fourth embodiment is modified into a p-channel type one corresponding to FIG. 10B.
Figure 59B:
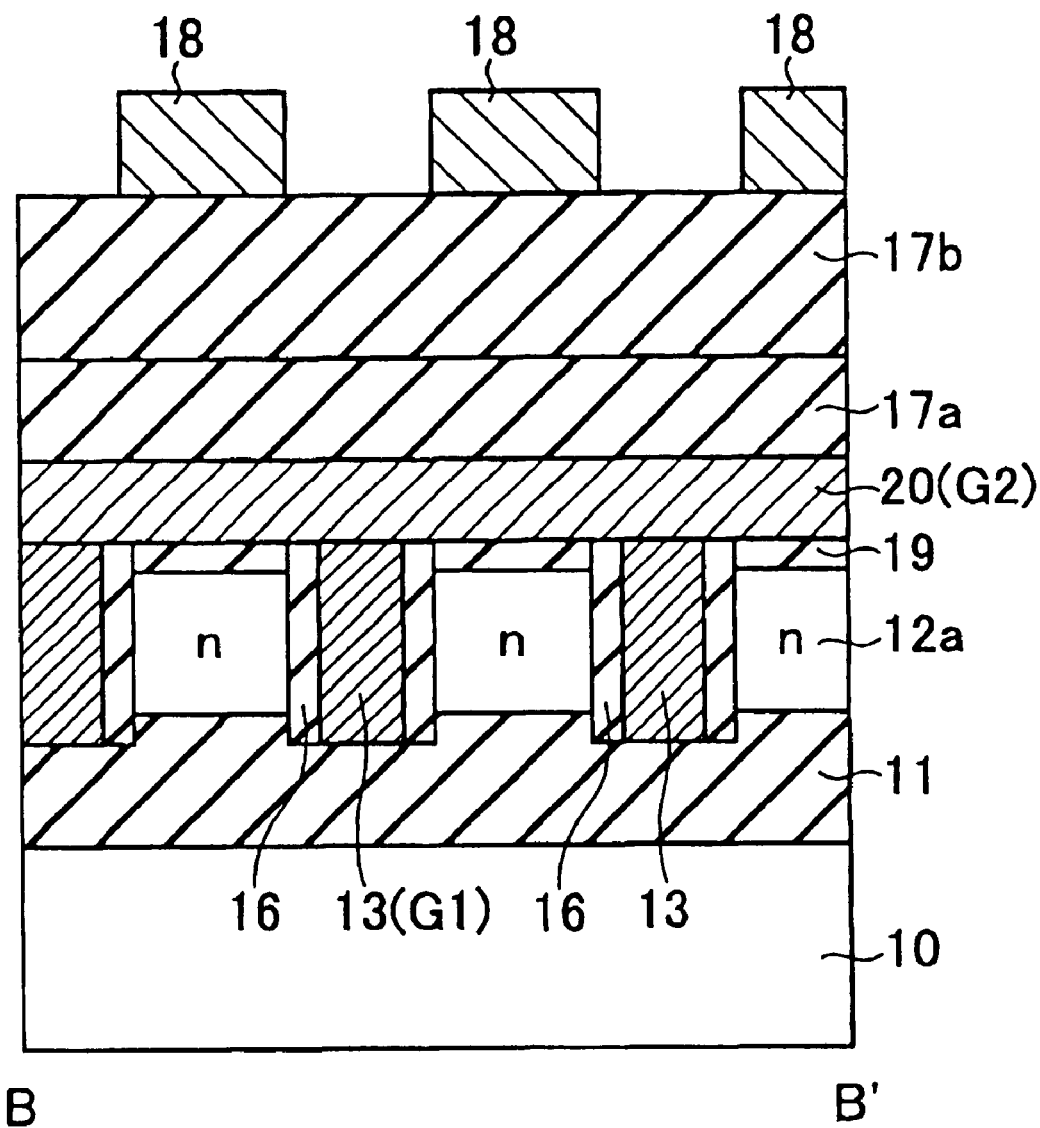
FIG. 59B is a diagram showing the memory cell structure when the n-channel type MIS transistor according to the fourth embodiment is modified into the p-channel type one corresponding to FIG. 10C.

Although the DRAM cell is composed of the n-channel type MIS transistor in the embodiments heretofore, a p-channel type MIS transistor can be used instead. For example, a cell structure when the p-channel type transistor is used is shown in FIG. 56 corresponding to FIG. 3. A portion of the p-type silicon layer 12 becomes an n-type silicon layer 12a, and p-type drain diffusion region 14a and source diffusion region 15a are formed therein. similarly, p-channel DRAM cell structures corresponding to FIG. 8, FIG. 9, FIG. 10B and FIG. 10C, and FIG. 11 are shown in FIG. 57, FIG. 58, FIG. 59A and FIG. 59B, and FIG. 60A respectively.

It is recommended that the potential relation in write and read operations and the like when the p-channel type DRAM cell is used be reversed relative to the case of the n-channel type one with the fixed potential line to which the source is connected as a reference potential. An example of concrete voltage waveforms is shown in FIG. 60B and FIG. 60C corresponding to the above FIG. 7A and FIG. 7B.

Figure 60A:
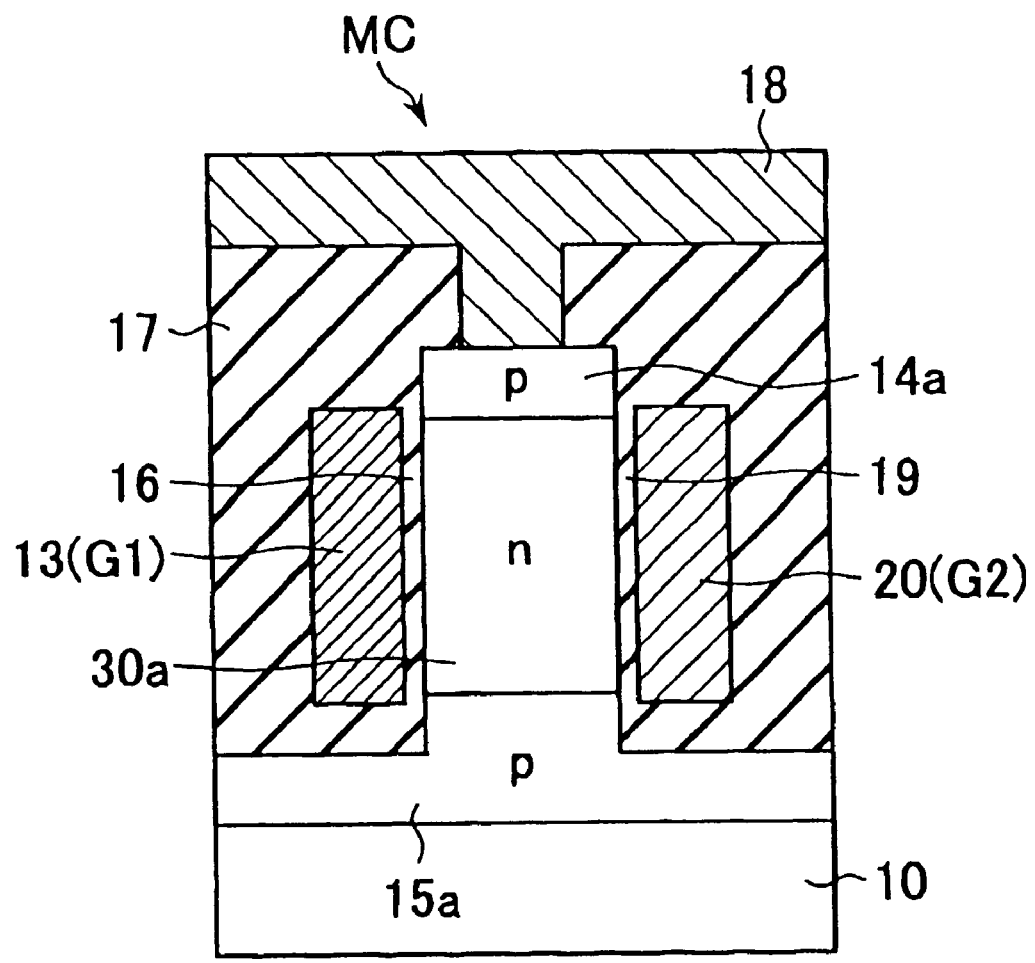
FIG. 60A is a diagram showing a memory cell structure when an n-channel type MIS transistor according to the fifth embodiment is modified into a p-channel type one corresponding to FIG. 11.
Figure 60B:
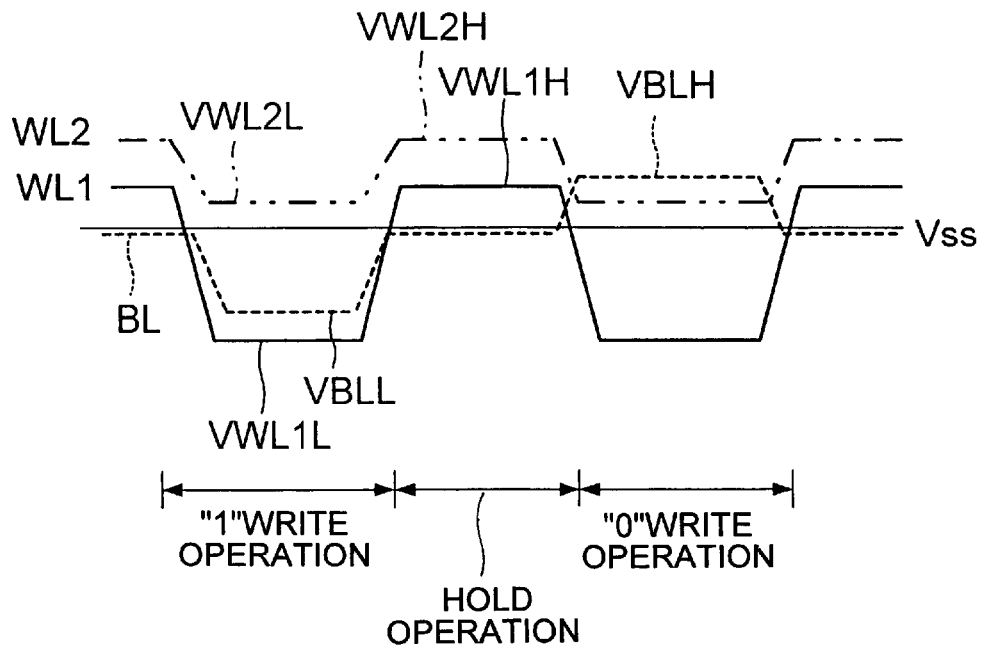
FIG. 60B is a diagram showing drive voltage waveforms when the p-type channel MIS transistor is used corresponding to FIG. 7A.
Figure 60C:
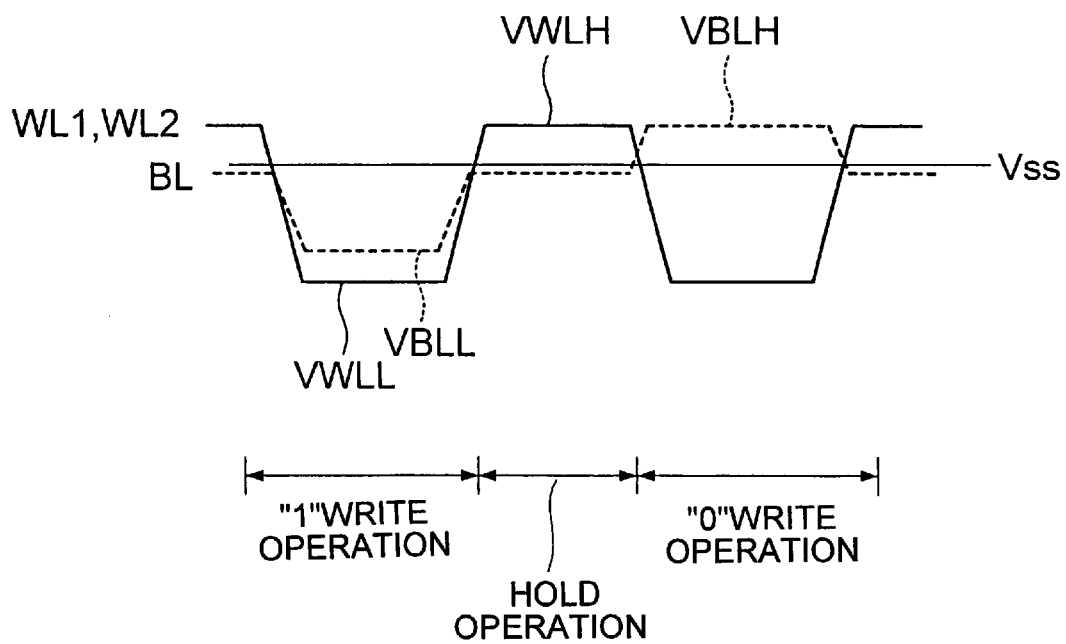
FIG. 60C is a diagram showing drive voltage waveforms when the p-type channel MIS transistor is used corresponding to FIG. 7B.

Specifically, as shown in FIG. 60B, when the first word line WL1 and the second word line WL2 are formed out of the same material, at the time of a "1" data write operation, a potential VWL1L lower than a reference potential VSS is applied to the selected first word line WL1, and a potential VWL2L (a positive potential higher than the reference potential VSS in the illustrated example) higher than the potential VWL1L is applied to the selected word line WL2. A potential VBLL lower than the reference potential VSS is applied to the selected bit line BL. Thus, impact ionization due to pentode operation occurs in the selected memory cell MC, and electrons being majority carriers are accumulated in a channel body.

At the time of a data hold operation, a potential VWL1H higher than the reference potential VSS is applied to the first word line WL1, and a potential VWL2H higher than the VWL1H is applied to the second word line WL2. Thus, "1" data which indicates a state in which excessive electrons are accumulated in the channel body is held.

At the time of a "0" data write operation, the same potentials VWL1L and VWL2L as at the time of the "1" data write operation are respectively applied to the selected first and second word lines WL1 and WL2. A positive potential VBLH higher than the reference potential VSS is applied to the selected bit line BL. Thus, a drain junction is forward biased in the selected memory cell MC, and electrons in the channel body are emitted to the drain, whereby "0" data which indicates a state in which the body potential is high is written.

Meanwhile, FIG. 60C shows a case where materials with different work functions are used for the first gate 13 and the second gate 20 and the same potential is applied to drive these first gate 13 and the second gate 20. As shown in FIG. 60C, at the time of the "1" data write operation, a negative potential VWLL lower than the reference potential VSS is applied to the selected first and second word lines WL1 and WL2, and the negative potential VBLL lower than the reference potential VSS is applied to the selected bitline BL. Thus, impactionization due to pentode operation occurs in the selected memory cell MC, and electrons are accumulated in the channel body.

At the time of the data hold operation, a positive potential VWLH higher than the reference potential VSS is applied to the first and second word lines WL1 and WL2. Thus, "1" data which indicates a state in which excessive electrons are accumulated in the channel body is held.

At the time of the "0" data write operation, the same potentials VWLL as at the time of the "1" data write operation is applied to the selected first and second word lines WL1 and WL2, and the positive potential VBLH higher than the reference potential VSS is applied to the selected bit line BL. Thus, the drain junction is forward biased in the selected memory cell MC, and electrons in the channel body are emitted to the drain, whereby "0" data which indicates a state in which the body potential is high is written.

What is claimed is:

1. A semiconductor memory device having MIS transistors to constitute memory cells, each of the MIS transistors comprising:
    a semiconductor layer;
    a source region formed in the semiconductor layer;
    a drain region formed apart from the source region in the semiconductor layer, the semiconductor layer between the source region and the drain region serving as a channel body in a floating state;
    a main gate provided between the source region and the drain region to form a channel in the channel body; and
    an auxiliary gate provided separately from the main gate to control a potential of the channel body by capacitive coupling, the auxiliary gate being driven in synchronization with the main gate,
    wherein the MIS transistor has a first data state in which the channel body is set at a first potential and a second data state in which the channel body is set at a second potential.

2. The semiconductor memory device according to claim 1,
    wherein the first data state is set by generating impact ionization near a drain junction by a pentode operation of the MIS transistor, and
    the second data state is set by passing a forward bias current between the channel body to which a predetermined potential is applied by capacitive coupling from the main gate and the drain.

3. The semiconductor memory device according to claim 1, wherein the semiconductor layer is formed on a semiconductor substrate with an insulating film therebetween, and the main gate and the auxiliary gate are disposed to face each other on an upper face and a lower face of the semiconductor layer.

4. The semiconductor memory device according to claim 3,
    wherein each of the MIS transistors further comprises a relay electrode connected to the channel body,
    the auxiliary gate is formed to face the relay electrode and constitute a capacitor with the relay electrode.

5. The semiconductor memory device according to claim 4,
    wherein the main gate is provided between the semiconductor substrate and the semiconductor layer, and
    the auxiliary gate and the relay electrode are provided opposite to the main gate with the semiconductor layer therebetween.

6. The semiconductor memory device according to claim 4,
    wherein the auxiliary gate and the relay electrode are provided between the semiconductor substrate and the semiconductor layer, and
    the main gate is provided opposite to the auxiliary gate and the relay electrode with the semiconductor layer therebetween.

7. The semiconductor memory device according to claim 1,
    wherein the semiconductor layer is formed on a semiconductor substrate with an insulating film therebetween,
    the main gates making a pair are provided to face each other on both side faces of the channel body in the semiconductor layer, and
    the auxiliary gate is formed on an upper face of the semiconductor layer and electrically connects the main gates making the pair.

8. The semiconductor memory device according to claim 1,
wherein the semiconductor layer is a pillar semiconductor portion formed on a semiconductor substrate,
the drain region is formed on the pillar semiconductor portion,
the source region is formed under the pillar semiconductor portion, and
the main gate and the auxiliary gate are provided to face each other on both side faces of the pillar semiconductor portion.

9. The semiconductor memory device according to claim 8, wherein the main gate and the auxiliary gate are formed out of the same material.

10. The semiconductor memory device according to claim 8, wherein the main gate and the auxiliary gate are formed out of different materials.

11. The semiconductor memory device according to claim 8,
wherein the MIS transistors are arranged in a matrix form to constitute a memory cell array,
the main gates of the MIS transistors arranged in a first direction are continuously formed to constitute first word lines,
the auxiliary gates of the MIS transistors arranged in the first direction are continuously formed to constitute second word lines,
an interlayer dielectric film to cover the first word lines and the second word lines is formed,
first shunt lines are formed along the first direction on the interlayer dielectric film and contacts the first word lines, and
second shunt lines are formed along the first direction on the interlayer dielectric film and contacts the second word lines.

12. The semiconductor memory device according to claim 11, wherein the first shunt lines and the second shunt lines are formed out of the same material.

13. The semiconductor memory device according to claim 11, wherein the first shunt lines and the second shunt lines are formed out of different materials.

14. The semiconductor memory device according to claim 1, wherein the main gate and the auxiliary gate are formed out of the same material and driven synchronously at different potentials.

15. The semiconductor memory device according to claim 14, comprising:
a row decoder which decodes an inputted row address signal and outputs a decode result signal indicating whether a row address of the row address signal coincides or not, the decode result signal having a first control potential or a second control potential higher than the first control potential based on its decode result;
a first output circuit to which the decode result signal is inputted and which outputs a third control potential lower than the first control potential or a fourth control potential higher than the second control potential to the main gate based on the decode result indicated by the decode result signal; and
a second output circuit to which the decode result signal is inputted and which outputs a fifth control potential lower than the third control potential or a sixth control potential lower than the fourth control potential to the auxiliary gate based on the decode result indicated by the decode result signal.

16. The semiconductor memory device according to claim 15,
wherein the MIS transistors are arranged in a matrix form to constitute a memory cell array,
the memory cell array has first word lines formed along a first direction and second word lines formed along the first direction to make pairs with the first word lines,
the main gates of the MIS transistors arranged in the first direction are respectively connected to one of the first word lines,
the auxiliary gates of the MIS transistors arranged in the first direction are respectively connected to one of the second word lines,
the row decoders, the first output circuits, and the second output circuits for the first and second word lines which make pairs at odd number positions are provided on one side of the memory cell array, and
the row decoders, the first output circuits, and the second output circuits for the first and second word lines which makes pairs at even number positions are provided on the other side of the memory cell array.

17. The semiconductor memory device according to claim 15, wherein the row decoders are provided individually for the first output circuit and the second output circuit.

18. The semiconductor memory device according to claim 17,
wherein the MIS transistors are arranged in a matrix form to constitute a memory cell array,
the memory cell array has first word lines formed along a first direction and second word lines formed along the first direction to make pairs with the first word lines,
the main gates of the MIS transistors arranged in the first direction are respectively connected to one of the first word lines,
the auxiliary gates of the MIS transistors arranged in the first direction are respectively connected to one of the second word lines,
the row decoders, the first output circuits, and the second output circuits for the first word lines are provided on one side of the memory cell array, and
the row decoders, the first output circuits, and the second output circuits for the second word lines are provided on the other side of the memory cell array.

19. The semiconductor memory device according to claim 1, wherein the main gate and the auxiliary gate are formed out of materials with different work functions and driven at the same potential.

20. The semiconductor memory device according to claim 19, comprising:
a row decoder which decodes an inputted row address signal and outputs a decode result signal indicating whether a row address of the row address signal coincides or not, the decode result signal having a first control potential or a second control potential higher than the first control potential based on its decode result; and
an output circuit to which the decode result signal is inputted and which outputs a third control potential lower than the first control potential or a fourth control potential higher than the second control potential to the main gate and the auxiliary gate based on the decode result indicated by the decode result signal.

21. The semiconductor memory device according to claim 20,
wherein the MIS transistors are arranged in a matrix form to constitute a memory cell array, the memory cell array has first word lines formed along a first direction and second word lines formed along the first direction to make pairs with the first word lines, the main gates of the MIS transistors arranged in the first direction are respectively connected to one of the first word lines, the auxiliary gates of the MIS transistors arranged in the first direction are respectively connected to one of the second word lines, and the row decoders and the output circuits for the first and second word lines are provided on one side of the memory cell array.

22. The semiconductor memory device according to claim 20, wherein the MIS transistors are arranged in a matrix form to constitute a memory cell array, the memory cell array has first word lines formed along a first direction and second word lines formed along the first direction to make pairs with the first word lines, the main gates of the MIS transistors arranged in the first direction are respectively connected to one of the first word lines, the auxiliary gates of the MIS transistors arranged in the first direction are respectively connected to one of the second word lines, the row decoders and the output circuits for the first and second word lines which make pairs at odd number positions are provided on one side of the memory cell array, and the row decoders and the output circuits for the first and second word lines which make pairs at even number positions are provided on the other side of the memory cell array.

23. The semiconductor memory device according to claim 1, wherein the MIS transistors are n-channel type and arranged in a matrix form, the drain regions of the MIS transistors arranged in a first direction are respectively connected to one of bit lines, the main gates of the MIS transistors arranged in a second direction are respectively connected to one of first word lines, the auxiliary gates of the MIS transistors arranged in the second direction are respectively connected to one of second word lines, and the source regions of the MIS transistors are connected to a fixed potential line to thereby constitute a memory cell array, wherein at the time of a data write operation, with the fixed potential line as a reference potential, a first control potential higher than the reference potential is applied to a selected first word line, a second control potential lower than the reference potential is applied to non-selected first word lines, a third control potential higher than the reference potential and a fourth control potential lower than the reference potential are applied to the bit line according to the first and second data states, a fifth control potential lower than the first control potential is applied to a second word line selected simultaneously with the first word line, and a six control potential lower than the second control potential is applied to non-selected second word lines.

24. The semiconductor memory device according to claim 1, wherein the MIS transistors are p-channel type and arranged in a matrix form, the drain regions of the MIS transistors arranged in a first direction are respectively connected to one of bit lines, the main gates of the MIS transistors arranged in a second direction are respectively connected to one of first word lines, the auxiliary gates of the MIS transistors arranged in the second direction are respectively connected to one of second word lines, and the source regions of the MIS transistors are connected to a fixed potential line to thereby constitute a memory cell array, wherein at the time of a data write operation, with the fixed potential line as a reference potential, a first control potential lower than the reference potential is applied to a selected first word line, a second control potential higher than the reference potential is applied to non-selected first word lines, a third control potential lower than the reference potential and a fourth control potential higher than the reference potential are applied to the bit line according to the first and second data states, a fifth control potential higher than the first control potential is applied to a second word line selected simultaneously with the first word line, and a six control potential higher than the second control potential is applied to non-selected second word lines.

25. A semiconductor memory device having MIS transistors to constitute memory cells, each of the MIS transistors having a first data state and a second data state, the semiconductor memory device, comprising:

a first semiconductor substrate;

auxiliary gates of the MIS transistors formed on the first semiconductor substrate to continue in one direction while their bottom faces and side faces are covered with an insulating film;

a second semiconductor substrate provided on the auxiliary gates with a first gate insulating film therebetween;

main gates of the MIS transistors formed on the second semiconductor substrate with a second gate insulating film to continue in parallel with the auxiliary gates;

source regions formed in space portions between the main gates and the auxiliary gates in the second semiconductor substrate;

drain regions formed apart from the source regions in space portions between the main gates and the auxiliary gates in the second semiconductor substrate;

source lines provided to be in contact with the source regions and continue in parallel with the main gates and the auxiliary gates;

an interlayer dielectric film covering the source lines; and bit lines formed on the interlayer dielectric film in a direction intersecting the main gates and the auxiliary gates and being in contact with the drain regions.

26. The semiconductor memory device according to claim 25, wherein the second semiconductor substrate is bonded to the first gate insulating film.

* * * * *

UNITED STATES PATENT AND TRADEMARK OFFICE
CERTIFICATE OF CORRECTION

PATENT NO. : 6,778,424 B2
DATED : August 17, 2004
INVENTOR(S) : Yoshihisa Iwata et al.

It is certified that error appears in the above-identified patent and that said Letters Patent is hereby corrected as shown below:

Title page,
Item [56], References Cited, U.S. PATENT DOCUMENTS: please insert
-- 2003/0209739  11/2003  Hisamoto et al. --

Signed and Sealed this

Twenty-eighth Day of June, 2005

JON W. DUDAS
*Director of the United States Patent and Trademark Office*